US012315452B2

(12) United States Patent
Du et al.

(10) Patent No.: US 12,315,452 B2
(45) Date of Patent: May 27, 2025

(54) ARRAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN); Beijing BOE Technology Development Co., Ltd., Beijing (CN)

(72) Inventors: Mengmeng Du, Beijing (CN); Yao Huang, Beijing (CN); Tingliang Liu, Beijing (CN); Lang Liu, Beijing (CN); Yuxin Zhang, Beijing (CN); Xilei Cao, Beijing (CN); Cong Fan, Beijing (CN); Zhiwei Xiang, Beijing (CN); Xiangdan Dong, Beijing (CN); Hanchao Li, Beijing (CN)

(73) Assignees: Chengdu BOE Optoelectronics Technology Co., Ltd., Sichuan (CN); BOE Technology Group Co., Ltd., Beijing (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/702,054

(22) PCT Filed: Aug. 1, 2023

(86) PCT No.: PCT/CN2023/110469
§ 371 (c)(1),
(2) Date: Apr. 17, 2024

(87) PCT Pub. No.: WO2025/025129
PCT Pub. Date: Feb. 6, 2025

(65) Prior Publication Data
US 2025/0046248 A1 Feb. 6, 2025

(51) Int. Cl.
*G09G 3/3233* (2016.01)
*H10K 59/121* (2023.01)
*H10K 59/131* (2023.01)

(52) U.S. Cl.
CPC ....... *G09G 3/3233* (2013.01); *H10K 59/1213* (2023.02); *H10K 59/1216* (2023.02);
(Continued)

(58) Field of Classification Search
CPC ... G09G 2300/0861; G09G 2320/0238; G09G 3/3233; G09G 2320/066; G09G 2300/0809; H10K 2102/311; Y02E 10/549
See application file for complete search history.

(56) References Cited

U.S. PATENT DOCUMENTS

2015/0243722 A1* 8/2015 Kwon .................. H10K 59/131
257/40
2015/0379956 A1 12/2015 Nonaka et al.
(Continued)

FOREIGN PATENT DOCUMENTS

CN 104867441 A 8/2015
CN 112397565 A 2/2021
(Continued)

OTHER PUBLICATIONS

International Search Report & Written Opinion mailed Apr. 12, 2024, regarding PCT/CN2023/110469.

*Primary Examiner* — Shaheda A Abdin
(74) *Attorney, Agent, or Firm* — Intellectual Valley Law, P.C.

(57) ABSTRACT

An array substrate is provided. The array substrate includes a first semiconductor material layer and a second semiconductor material layer on a side of the first semiconductor material layer away from a base substrate. The first semi-
(Continued)

conductor material layer includes at least active layers of the driving transistor and the data write transistor. The second semiconductor material layer includes at least an active layer of the compensating transistor. A first capacitance is at least partially formed between a gate connecting pad and at least one of the second semiconductor material layer or a first node connecting line. A second capacitance is formed between the first node connecting line and a respective second gate line. The first capacitance is greater than the second capacitance.

20 Claims, 35 Drawing Sheets

(52) U.S. Cl.
CPC ..... *H10K 59/1315* (2023.02); *G09G 2310/08* (2013.01); *G09G 2320/0233* (2013.01)

(56) References Cited

U.S. PATENT DOCUMENTS

| 2019/0304373 | A1 | 10/2019 | Wang et al. | |
|---|---|---|---|---|
| 2020/0258966 | A1* | 8/2020 | Cha | H10K 59/1216 |
| 2021/0150984 | A1* | 5/2021 | Hwang | H10K 59/1213 |

FOREIGN PATENT DOCUMENTS

| CN | 113299688 | A | 8/2021 |
|---|---|---|---|
| CN | 115497964 | A | 12/2022 |
| CN | 115668348 | A | 1/2023 |
| CN | 115835701 | A | 3/2023 |

* cited by examiner

ARRAY SUBSTRATE AND DISPLAY APPARATUS

CROSS-REFERENCE TO RELATED APPLICATION

This application is a national stage application under 35 U.S.C. § 371 of International Application No. PCT/CN2023/110469, filed Aug. 1, 2023, the contents of which are incorporated by reference in the entirety.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. OLED is driven by a driving current required to be kept constant to control illumination. The OLED display panel includes a plurality of pixel units configured with pixel-driving circuits arranged in multiple rows and columns.

SUMMARY

In one aspect, the present disclosure provides an array substrate, comprising a plurality of first gate lines, a plurality of second gate lines, and a plurality of pixel driving circuits; wherein a respective pixel driving circuit of the plurality of pixel driving circuits comprises a driving transistor, a data write transistor, a compensating transistor, a storage capacitor, a first node connecting line connecting a gate electrode of the driving transistor with a first electrode of the compensating transistor, and a gate connecting pad; a respective first gate line of the plurality of first gate lines is configured to provide a gate scanning signal to the data write transistor; the gate connecting pad comprises at least a portion of a gate electrode of the data write transistor, is connected to the respective first gate line, and is in a layer different from the respective first gate line; a respective second gate line of the plurality of second gate lines is configured to provide a gate scanning signal to the compensating transistor; wherein the array substrate comprises a first semiconductor material layer and a second semiconductor material layer on a side of the first semiconductor material layer away from a base substrate; the first semiconductor material layer comprises at least active layers of the driving transistor and the data write transistor; the second semiconductor material layer comprises at least an active layer of the compensating transistor; a first capacitance is at least partially formed between the gate connecting pad and at least one of the second semiconductor material layer or the first node connecting line; and a second capacitance is formed between the first node connecting line and the respective second gate line; wherein the first capacitance is greater than the second capacitance.

Optionally, the ratio of the first capacitance to the second capacitance is between 1.5 to 4.0.

Optionally, an orthographic projection of the gate connecting pad on the base substrate at least partially overlaps with an orthographic projection of at least one of the second semiconductor material layer or the first node connecting line on the base substrate.

Optionally, an orthographic projection of the second semiconductor material layer on the base substrate is substantially non-overlapping with an orthographic projection of the respective first gate line on the base substrate; and an orthographic projection of the first node connecting line on the base substrate is substantially non-overlapping with the orthographic projection of the respective first gate line on the base substrate.

Optionally, the gate connecting pad comprises a first portion and a second portion connected to each other; an orthographic projection of the first portion on the base substrate at least partially overlaps with an orthographic projection of the respective first gate line on the base substrate, is substantially non-overlapping with an orthographic projection of the second semiconductor material layer on the base substrate, and is substantially non-overlapping with an orthographic projection of the first node connecting line on the base substrate; an orthographic projection of the second portion on the base substrate at least partially overlaps with the orthographic projection of the second semiconductor material layer on the base substrate, at least partially overlaps with the orthographic projection of the first node connecting line on the base substrate, and is substantially non-overlapping with the orthographic projection of the respective first gate line on the base substrate; and the first capacitance is at least partially formed between the second portion and at least one of the second semiconductor material layer or the first node connecting line.

Optionally, the first node connecting line and the respective first gate line are in a first signal line layer on a side of the second semiconductor material layer away from the base substrate.

Optionally, the respective second gate line comprises a respective second gate line first branch in a second gate metal layer and a respective second gate line second branch in a third gate metal layer; wherein the second semiconductor material layer is on a side of the second gate metal layer away from the base substrate; the third gate metal layer is on a side of the second semiconductor material layer away from the base substrate; and the first signal line layer is on a side of the third gate metal layer away from the base substrate.

Optionally, the respective second gate line is in a same layer as the first node connecting line and the respective first gate line; wherein the respective pixel driving circuit further comprises at least one of a first gate pad comprising at least a portion of a gate electrode of the compensating transistor or a second gate pad comprising at least a portion of the gate electrode of the compensating transistor; and the respective second gate line is connected to the first gate pad through a via, and is connected to the second gate pad through a via.

Optionally, the first gate pad is in a second gate metal layer; the second gate pad is in a third gate metal layer; the second semiconductor material layer is on a side of the second gate metal layer away from the base substrate; the third gate metal layer is on a side of the second semiconductor material layer away from the base substrate; and the first signal line layer is on a side of the third gate metal layer away from the base substrate.

Optionally, the array substrate further comprises a plurality of light emitting control signal lines; wherein the respective pixel driving circuit further comprises a light emitting control transistor and a relay electrode; wherein a third capacitance is at least partially formed between the relay electrode and a respective light emitting control signal line of the plurality of light emitting control signal lines; an orthographic projection of the relay electrode on the base substrate substantially covers an orthographic projection of an active layer of the light emitting control transistor on the base substrate; and the orthographic projection of the relay electrode on the base substrate at least partially overlaps with an orthographic projection of a first electrode of the light emitting control transistor on the base substrate; and/or the orthographic projection of the relay electrode on the base substrate at least partially overlaps with an orthographic projection of the second electrode of the light emitting control transistor on the base substrate.

Optionally, the relay electrode crosses over the respective light emitting control signal line; and the orthographic projection of the relay electrode on the base substrate substantially covers an orthographic projection of a gate electrode of the light emitting control transistor on the base substrate.

Optionally, the respective pixel driving circuit further comprises an anode contact pad; the relay electrode connects the anode contact pad with a second electrode of the light emitting control transistor; the anode contact pad is connected to an anode of a light emitting element; an orthographic projection of the anode contact pad on the base substrate substantially covers the orthographic projection of the active layer of the light emitting control transistor on the base substrate; the orthographic projection of the anode contact pad on the base substrate at least partially overlaps with the orthographic projection of the first electrode of the light emitting control transistor on the base substrate; and the orthographic projection of the anode contact pad on the base substrate at least partially overlaps with an orthographic projection of the second electrode of the light emitting control transistor on the base substrate.

Optionally, the anode contact pad crosses over the respective light emitting control signal line; and the orthographic projection of the anode contact pad on the base substrate substantially covers an orthographic projection of a gate electrode of the light emitting control transistor on the base substrate.

Optionally, an orthographic projection of an anode on the base substrate substantially covers the orthographic projection of the active layer of the light emitting control transistor on the base substrate; the orthographic projection of the anode on the base substrate at least partially overlaps with the orthographic projection of the first electrode of the light emitting control transistor on the base substrate; and the orthographic projection of the anode on the base substrate at least partially overlaps with an orthographic projection of the second electrode of the light emitting control transistor on the base substrate.

Optionally, an orthographic projection of an active layer of a light emitting control transistor in each pixel driving circuit on the base substrate is substantially covered by an orthographic projection of an individual anode of a plurality of anodes on the base substrate.

Optionally, the anode crosses over the respective light emitting control signal line; and the orthographic projection of the anode on the base substrate substantially covers an orthographic projection of a gate electrode of the light emitting control transistor on the base substrate.

Optionally, an orthographic projection of a gate electrode of a light emitting control transistor in each pixel driving circuit on the base substrate is substantially covered by an orthographic projection of an individual anode of a plurality of anodes on the base substrate.

Optionally, the array substrate further comprises a plurality of light emitting control signal lines; wherein a respective light emitting control signal line comprises a respective light emitting control signal line first branch and a respective light emitting control signal line second branch in different layers.

Optionally, the array substrate further comprises a plurality of second voltage supply lines, a plurality of data lines, a plurality of fourth reset signal lines, and a plurality of low voltage supply lines; the plurality of pixel driving circuits are arranged in columns, including a (3k−2)-th column, a (3k−1)-th column, and a (3k)-th column of K columns, K and k being positive integers, 1≤k≤(K/3); the (3k−2)-th column includes a (3k−2)-th pixel driving circuit, the (3k−1)-th column includes a (3k−1)-th pixel driving circuit, and the (3k)-th column includes a (3k)-th pixel driving circuit; the (3k−2)-th pixel driving circuit, the (3k−1)-th pixel driving circuit, and the (3k)-th pixel driving circuit are in a same row; the (3k−2)-th column includes a fourth reset signal line of the plurality of fourth reset signal lines; the (3k−1)-th column includes a fourth reset signal line of the plurality of fourth reset signal lines; and the (3k)-th column includes a low voltage supply line of the plurality of low voltage supply lines; the plurality of fourth reset signal lines are absent in the (3k)-th column; the plurality of low voltage supply lines are absent in the (3k−2)-th column and are absent in the (3k−1)-th column; and the plurality of second voltage supply lines are present in the (3k−2)-th column, the (3k−1)-th column, and the (3k)-th column.

In another aspect, the present disclosure provides a display apparatus, comprising the array substrate described herein, and one or more integrated circuits connected to the array substrate.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
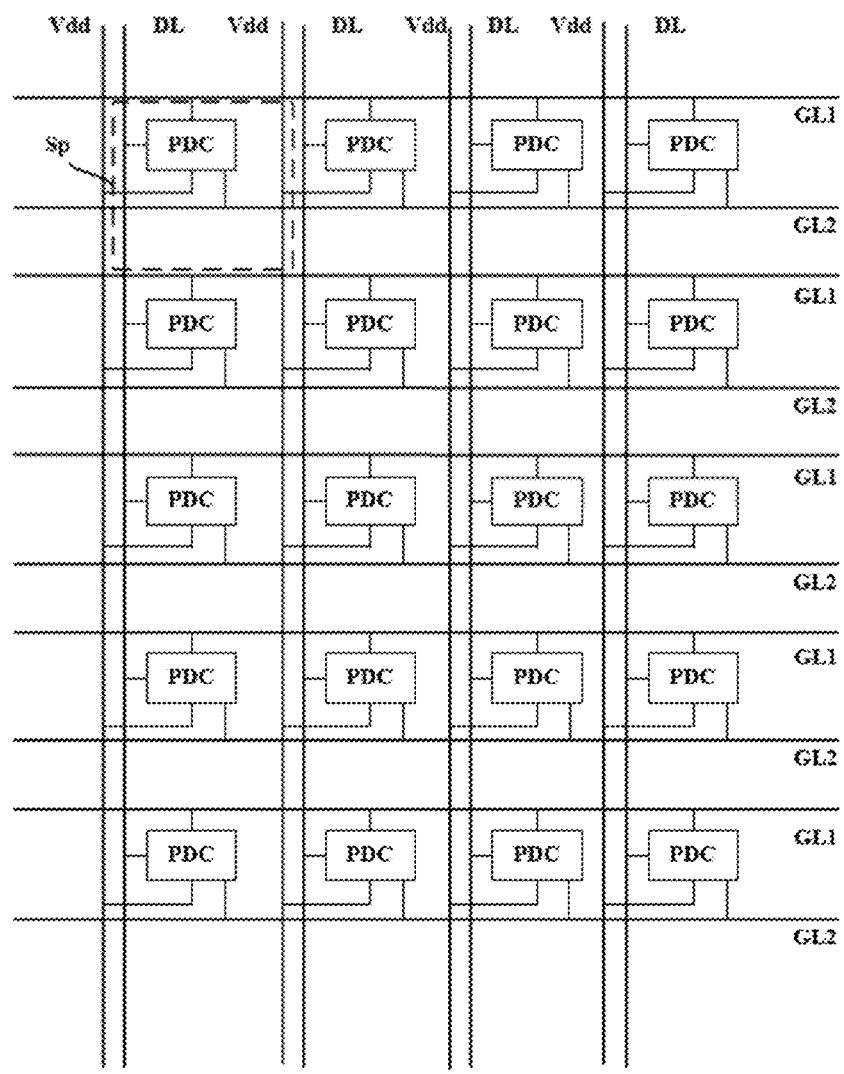
FIG. 1 is a plan view of an array substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a plurality of first gate lines, a plurality of second gate lines, and a plurality of pixel driving circuits. Optionally, a respective pixel driving circuit of the plurality of pixel driving circuits includes a driving transistor, a data write transistor, a compensating transistor, a storage capacitor, a first node connecting line connecting a gate electrode of the driving transistor with a first electrode of the compensating transistor, and a gate connecting pad. Optionally, a respective first gate line of the plurality of first gate lines configured to provide a gate scanning signal to the data write transistor. Optionally, the gate connecting pad comprises at least a portion of a gate electrode of the data write transistor, is connected to the respective first gate line, and is in a layer different from the respective first gate line. Optionally, a respective second gate line of the plurality of second gate lines configured to provide a gate scanning signal to the compensating transistor. Optionally, the array substrate comprises a first semiconductor material layer and a second semiconductor material layer on a side of the first semiconductor material layer away from a base substrate. Optionally, the first semiconductor material layer comprises at least active layers of the driving transistor and the data write transistor. Optionally, the second semiconductor material layer comprises at least an active layer of the compensating transistor. Optionally, a first capacitance is at least partially formed between the gate connecting pad and at least one of the second semiconductor material layer or the first node connecting line. Optionally, a second capacitance is formed between the first node connecting line and the respective second gate line. Optionally, a ratio of the first capacitance to the second capacitance is greater than 2.3.

Various appropriate pixel driving circuits may be used in the present array substrate. Examples of appropriate driving circuits include 3T1C, 2T1C, 4T1C, 4T2C, 5T2C, 6T1C, 7T1C, 7T2C, 8T1C, and 5T2C. In some embodiments, the respective one of the plurality of pixel driving circuits is an 8T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a respective pixel driving circuit PDC. The array substrate includes a plurality of first gate lines (e.g., a respective first gate line GL1), a plurality of second gate lines (e.g., a respective second gate line GL2), a plurality of data lines (e.g., a respective data line DL), a plurality of high voltage supply lines (e.g., a respective high voltage supply line Vdd), and a plurality of low voltage supply lines (e.g., a respective low voltage supply line Vss). Light emission in a respective subpixel Sp is driven by a respective pixel driving circuit PDC. In one example, a high voltage signal (e.g., a VDD signal) is input, through the respective high voltage supply line Vdd of the plurality of high voltage supply line, to the respective pixel driving circuit PDC connected to an anode of the light emitting element; a low voltage signal (e.g., a VSS signal) is input, through a low voltage supply line, to a cathode of the light emitting element. A voltage difference between the high voltage signal (e.g., the VDD signal) and the low voltage signal (e.g., the VSS signal) is a driving voltage □V that drives light emission in the light emitting element.

Figure 2A:
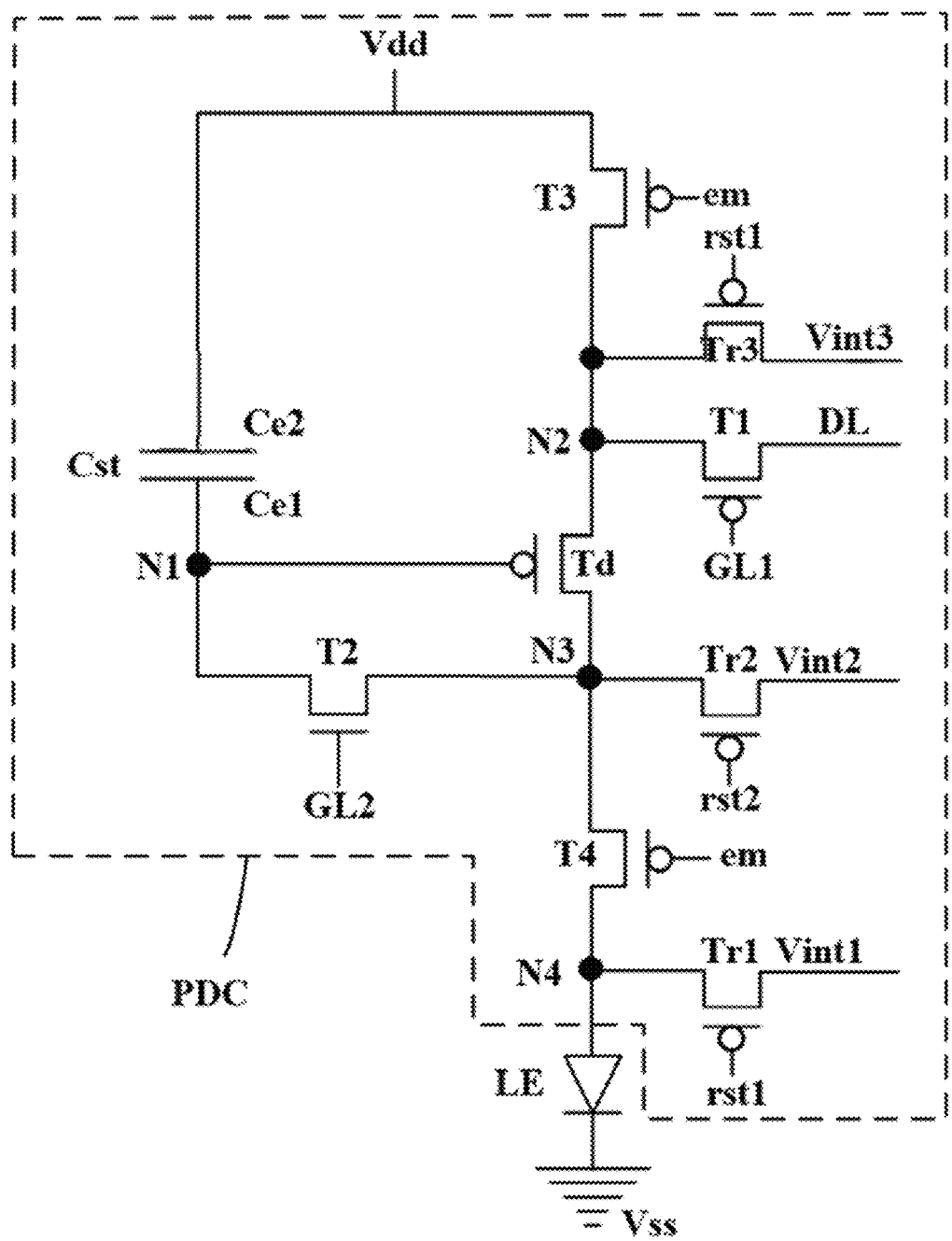
FIG. 2A is a circuit diagram illustrating the structure of a pixel driving circuit in some embodiments according to the present disclosure.

FIG. 2A is a circuit diagram illustrating the structure of a pixel driving circuit in some embodiments according to the present disclosure. Referring to FIG. 2A, in some embodiments, the pixel driving circuit includes a driving transistor Td; a storage capacitor Cst having a first capacitor electrode Ce1 and a second capacitor electrode Ce2; a second reset transistor Tr2 having a gate electrode connected to a respective second reset control signal line rst2 of a plurality of second reset control signal lines, a first electrode connected to a respective second reset signal line Vint2 of a plurality of second reset signal lines, and a second electrode connected to a second electrode of the driving transistor Td; a first transistor T1 having a gate electrode connected to a respective first gate line GL1 of a plurality of first gate lines, a first electrode connected to a respective data line DL of a plurality of data lines, and a second electrode connected to a first electrode of the driving transistor Td; a third reset transistor Tr3 having a gate electrode connected to a respective first reset control signal line rst1 of a plurality of first reset control signal lines, a first electrode connected to a respective third reset signal line Vint3 of a plurality of third reset signal lines, and a second electrode connected to the first electrode of the driving transistor Td; a second transistor T2 having a gate electrode connected to a respective second gate line GL2 of a plurality of second gate lines, a first electrode connected to the first capacitor electrode Ce1 of the storage capacitor Cst and the gate electrode of the driving transistor Td, and a second electrode connected to the second electrode of the driving transistor Td; a third transistor T3 having a gate electrode connected to a respective light emitting control signal line em of a plurality of light emitting control signal lines, a first electrode connected to a respective voltage supply line Vdd of a plurality of voltage supply lines, and a second electrode connected to the first electrode of the driving transistor Td and the second electrode of the first transistor T1; a fourth transistor T4 having a gate electrode connected to the respective light emitting control signal line em of the plurality of light emitting control signal lines, a first electrode connected to second electrodes of the driving transistor Td and the second transistor T2, and a second electrode connected to an anode of a light emitting element LE; and a first reset transistor Tr1 having a gate electrode connected to the respective first reset control signal line rst1 of a plurality of first reset control signal lines, a first electrode connected to a respective first reset signal line Vint1 of a plurality of first reset signal lines, and a second electrode connected to the second electrode of the fourth transistor T4 and the anode of the light emitting element LE. The second capacitor electrode Ce2 is connected to the respective voltage supply line and the first electrode of the third transistor T3.

In some embodiments, the pixel driving circuit includes a driving transistor Td, a data write transistor (e.g., the first transistor T1), a compensating transistor (e.g., the second transistor T2), two light emitting control transistors (e.g., the third transistor T3 and the fourth transistor T4), and three reset transistors (e.g., the first reset transistor Tr1, the second reset transistor Tr2, and the third reset transistor Tr3).

As used herein, a first electrode or a second electrode refers to one of a first terminal and a second terminal of a transistor, the first terminal and the second terminal being connected to an active layer of the transistor. A direction of a current flowing through the transistor may be configured to be from a first electrode to a second electrode, or from a second electrode to a first electrode. Accordingly, depending on the direction of the current flowing through the transistor, in one example, the first electrode is configured to receive an input signal and the second electrode is configured to output an output signal; in another example, the second electrode is configured to receive an input signal and the first electrode is configured to output an output signal.

The pixel driving circuit further include a first node N1, a second node N2, a third node N3, and a fourth node N4.

The first node N1 is connected to the gate electrode of the driving transistor Td, the first capacitor electrode Ce1, and the first electrode of the second transistor T2. The second node N2 is connected to the second electrode of the third transistor T3, the second electrode of the first transistor T1, the second electrode of the third reset transistor Tr3, and the first electrode of the driving transistor Td. The third node N3 is connected to the second electrode of the driving transistor Td, the second electrode of the second transistor T2, the first electrode of the fourth transistor T4, and the second electrode of the second reset transistor Tr2. The fourth node N4 is connected to the second electrode of the fourth transistor T4, the second electrode of the first reset transistor Tr1, and the anode of the light emitting element LB.

The array substrate in some embodiments includes a plurality of subpixels. In some embodiments, the plurality of subpixels includes a respective first subpixel, a respective second subpixel, and a respective third subpixel. Optionally, a respective pixel of the array substrate includes the respective first subpixel, the respective second subpixel, and the respective third subpixel. The plurality of subpixels in the array substrate are arranged in an array. In one example, the array of the plurality of subpixels includes a S1-S2-S3 format repeating array, in which S1 stands for the respective first subpixel, S2 stands for the respective second subpixel, and S3 stands for the respective third subpixel. In another example, the S1-S2-S3 format is a C1-C2-C3 format, in which C1 stands for the respective first subpixel of a first color, C2 stands for the respective second subpixel of a second color, and C3 stands for the respective third subpixel of a third color. In another example, the C1-C2-C3 format is an R-G-B format, in which the respective first subpixel is a red subpixel, the respective second subpixel is a green subpixel, and the respective third subpixel is a blue subpixel.

In another example, the array of the plurality of subpixels includes a S1-S2-S3-S4 format repeating array, in which S1 stands for the respective first subpixel, S2 stands for the respective second subpixel, S3 stands for the respective third subpixel, and S4 stands for the respective fourth subpixel. In another example, the S1-S2-S3-S4 format is a C1-C2-C3-C4 format, in which C1 stands for the respective first subpixel of a first color, C2 stands for the respective second subpixel of a second color, C3 stands for the respective third subpixel of a third color, and C4 stands for the respective fourth subpixel of a fourth color. In another example, the S1-S2-S3-S4 format is a C1-C2-C3-C2' format, in which C1 stands for the respective first subpixel of a first color, C2 stands for the respective second subpixel of a second color, C3 stands for the respective third subpixel of a third color, and C2' stands for the respective fourth subpixel of the second color. In another example, the C1-C2-C3-C2' format is a R-G-B-G format, in which the respective first subpixel is a red subpixel, the respective second subpixel is a green subpixel, the respective third subpixel is a blue subpixel, and the respective fourth subpixel is a green subpixel.

In some embodiments, a minimum repeating unit of the plurality of subpixels of the array substrate includes the respective first subpixel, the respective second subpixel, and the respective third subpixel. Optionally, each of the respective first subpixel, the respective second subpixel, and the respective third subpixel, includes the first transistor T1, the second transistor T2, the third transistor T3, the fourth transistor T4, the first reset transistor Tr1, the second reset transistor Tr2, the third reset transistor Tr3, the driving transistor Td, and the storage capacitor Cst.

In alternative embodiments, a minimum repeating unit of the plurality of subpixels of the array substrate includes a respective first subpixel, a respective second subpixel, a respective third subpixel, and a respective fourth subpixel. Optionally, each of the respective first subpixel, the respective second subpixel, the respective third subpixel, and the respective fourth subpixel, includes the first transistor T1, the second transistor T2, the third transistor T3, the fourth transistor T4, the first reset transistor Tr1, the second reset transistor Tr2, the third reset transistor Tr3, the driving transistor Td, and the storage capacitor Cst.

The present disclosure may be implemented in pixel driving circuit having transistors of various types, including a pixel driving circuit having p-type transistors, a pixel driving circuit having n-type transistors, and a pixel driving circuit having one or more p-type transistors and one or more n-type transistors. Referring to FIG. 2A, the second transistor T2 is an n-type transistor such as a metal oxide transistor, and other transistors are p-type transistors such as polysilicon transistors. For a p-type transistor, an effective control signal (e.g., a turn-on control signal) is a low voltage signal, and an ineffective control signal (e.g., a turn-off control signal) is a high voltage signal. For an n-type transistor, an effective control signal (e.g., a turn-on control signal) is a high voltage signal, and an ineffective control signal (e.g., a turn-off control signal) is a low voltage signal.

Figure 2B:
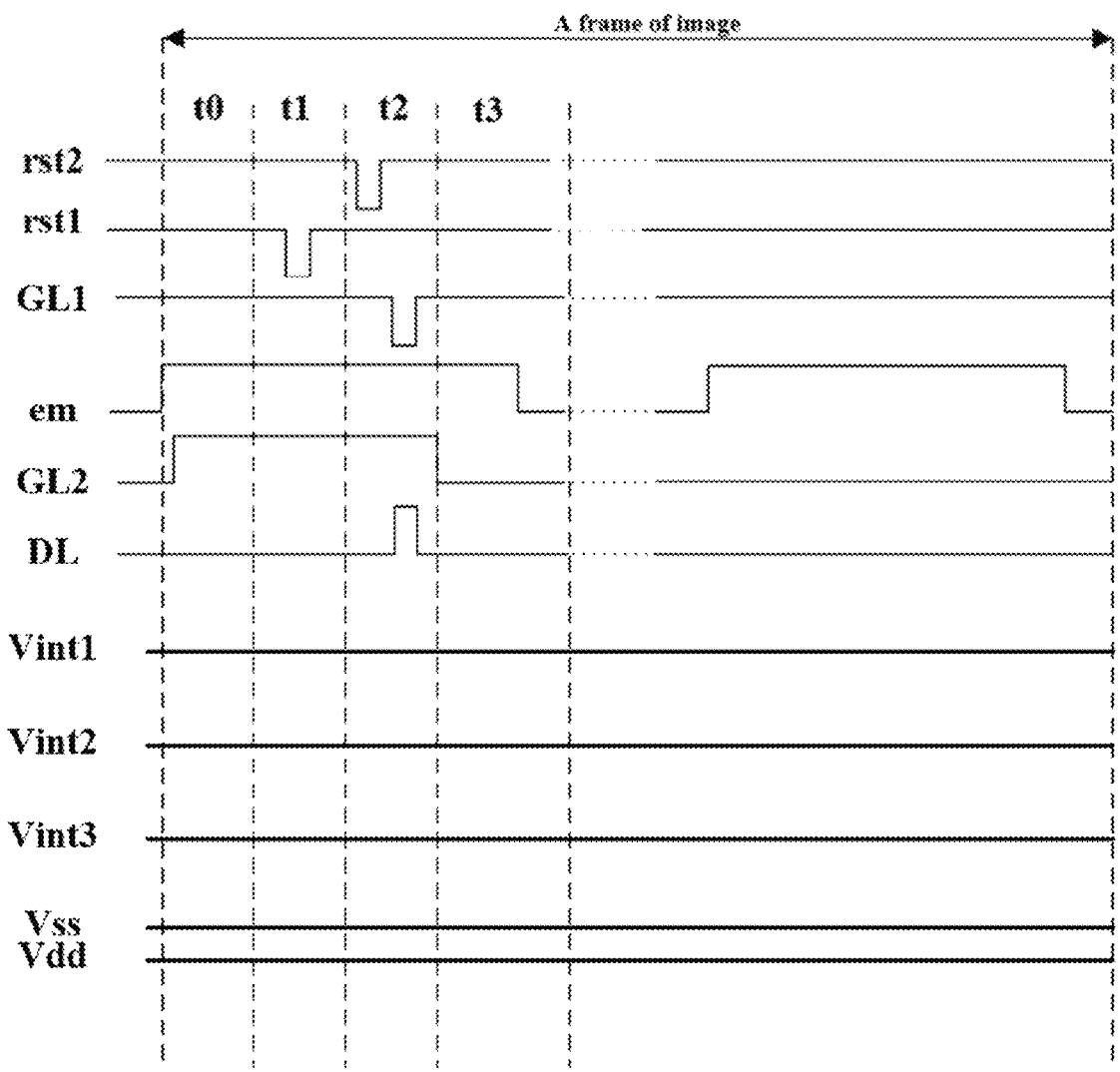
FIG. 2B is a timing diagram illustrating the operation of a pixel driving circuit in some embodiments according to the present disclosure.

FIG. 2B is a timing diagram illustrating the operation of a pixel driving circuit in some embodiments according to the present disclosure. Referring to FIG. 2A and FIG. 2B, during one frame of image, the operation of the pixel driving circuit includes a reset sub-phase t1, a data write sub-phase t2, and a light emitting sub-phase t3. In the initial sub-phase t0, a turning-off reset control signal is provided through the respective second reset control signal line rst2 to the gate electrode of the second reset transistor Tr2 to turn off the second reset transistor Tr2. A turning-off reset control signal is provided through the respective first reset control signal line rst1 to the gate electrode of the first reset transistor Tr1 and the gate electrode of the third reset transistor Tr3 to turn off the first reset transistor Tr1 and the third reset transistor Tr3. In the initial sub-phase t0, the respective first gate line GL1 is provided with a turning-off signal, thus the first transistor T1 is turned off.

In the reset sub-phase t1, a turning-on reset control signal is provided through the respective first reset control signal line rst1 to the gate electrode of the first reset transistor Tr1 to turn on the first reset transistor Tr1; allowing an initialization voltage signal from the respective first reset signal line Vint1 to pass from a first electrode of the first reset transistor Tr1 to a second electrode of the first reset transistor Tr1; and in turn to the node N4. The anode of the light emitting element LE is initialized. A turning-on reset control signal is provided through the respective first reset control signal line rst1 to the gate electrode of the third reset transistor Tr3 to turn on the third reset transistor Tr3; allowing an initialization voltage signal from the respective third reset signal line Vint3 to pass from a first electrode of the third reset transistor Tr3 to a second electrode of the third reset transistor Tr3; and in turn to the node N2. The node N2 is initialized. In the reset sub-phase t1, the respective first gate line GL1 is provided with a turning-off signal, thus the first transistor T1 is turned off. The respective light emitting control signal line em is provided with a high voltage signal to turn off the third transistor T3 and the fourth transistor T4.

In the data write sub-phase t2, a turning-on reset control signal is provided through the second reset control signal line rst2 to the gate electrode of the second reset transistor Tr2 to turn on the second reset transistor Tr2; allowing an initialization voltage signal from the respective second reset signal line Vin t2 to pass from a first electrode of the second reset transistor Tr2 to a second electrode of the second reset transistor Tr2, and in turn to the first capacitor electrode Ce1 and the gate electrode of the driving transistor Td. The second electrode of the driving transistor Td is initialized. The second capacitor electrode Ce2 receives a high voltage signal from the respective voltage supply line Vdd. The first capacitor electrode Ce1 is charged in the data write sub-phase t2 due to an increasing voltage difference between the first capacitor electrode Ce1 and the second capacitor electrode Ce2.

In the data write sub-phase t2, the turning-off reset control signal is again provided through the respective first reset control signal line rst1 to the gate electrode of the first reset transistor Tr1 and the gate electrode of the third reset transistor Tr3 to turn off the first reset transistor Tr1 and the third reset transistor Tr3. The respective first gate line GL1 and the respective second gate line GL2 are provided with a turning-on signal, thus the first transistor T1 and the second transistor T2 are turned on. A second electrode of the driving transistor Td is connected with the second electrode of the second reset transistor Tr2. A gate electrode of the driving transistor Td is electrically connected with the first electrode of the second transistor T2. Because the second transistor T2 is turned on in the data write sub-phase t2, the gate electrode and the second electrode of the driving transistor Td are connected and short circuited, and only the PN junction between the gate electrode and a first electrode of the driving transistor Td is effective, thus rendering the driving transistor Td in a diode connecting mode. The first transistor T1 is turned on in the data write sub-phase t2. The data voltage signal transmitted through the respective data line DL is received by a first electrode of the first transistor T1, and in turn transmitted to the first electrode of the driving transistor Td, which is connected to the second electrode of the first transistor T1. A node N2 connecting to the first electrode of the driving transistor Td has a voltage level of the data voltage signal. Because only the PN junction between the gate electrode and a first electrode of the driving transistor Td is effective, the voltage level at the node N1 in the data write sub-phase t2 increase gradually to (Vdata+Vth), wherein the Vdata is the voltage level of the data voltage signal, and the Vth is the voltage level of the threshold voltage Th of the PN junction. The storage capacitor Cst is discharged because the voltage difference between the first capacitor electrode Ce1 and the second capacitor electrode Ce2 is reduced to a relatively small value. The respective light emitting control signal line em is provided with a high voltage signal to turn off the third transistor T3 and the fourth transistor T4.

In the light emitting sub-phase t3, a turning-off reset control signal is provided through the respective second reset control signal line rst2 to the gate electrode of the second reset transistor Tr2 to turn off the second reset transistor Tr2. A turning-off reset control signal is provided through the respective first reset control signal line rst1 to the gate electrode of the first reset transistor Tr1 and the gate electrode of the third reset transistor Tr3 to turn off the first reset transistor Tr1 and the third reset transistor Tr3. The respective first gate line GL1 and the respective second gate line GL2 are provided with a turning-off signal, the first transistor T1 and the second transistor T2 are turned off. The respective light emitting control signal line em is provided with a low voltage signal to turn on the third transistor T3 and the fourth transistor T4. The voltage level at the node N1 in the light emitting sub-phase t3 is maintained at (Vdata+Vth), the driving transistor Td is turned on by the voltage level, and working in the saturation area. A path is formed through the third transistor T3, the driving transistor Td, the fourth transistor T4, to the light emitting element LE. The driving transistor Td generates a driving current for driving the light emitting element LE to emit light. A voltage level at a node N3 connected to the second electrode of the driving transistor Td equals to a light emitting voltage of the light emitting element LE.

Figure 3A:
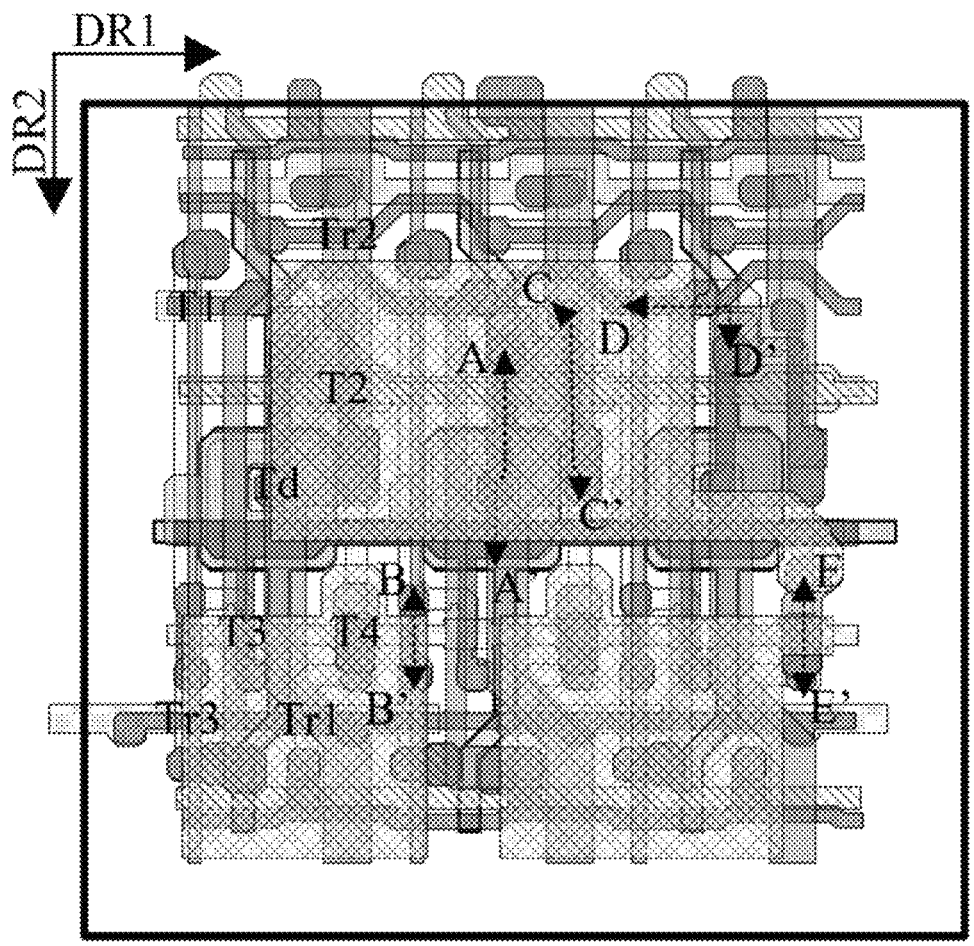
FIG. 3A is a diagram illustrating the structure of pixel driving circuits in an array substrate in some embodiments according to the present disclosure.
Figure 3B:
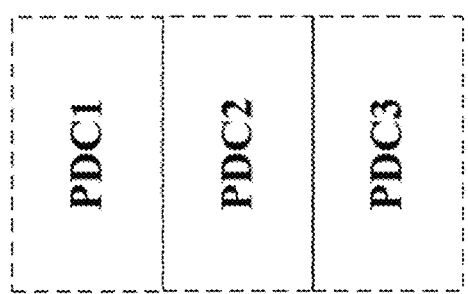
FIG. 3B is a schematic diagram illustrating an arrangement of pixel driving circuits in the array substrate depicted in FIG. 3A.

FIG. 3A is a diagram illustrating the structure of pixel driving circuits in an array substrate in some embodiments according to the present disclosure. FIG. 3B is a schematic diagram illustrating an arrangement of pixel driving circuits in an array substrate depicted in FIG. 3A. FIG. 3A and FIG. 3B depicts a portion of the array substrate having three adjacent pixel driving circuits, including PDC1, PDC2, and PDC3. FIG. 3L is a diagram illustrating the structure of pixel driving circuits in an array substrate depicted in FIG. 3A except for the anode layer.

Figure 3C:
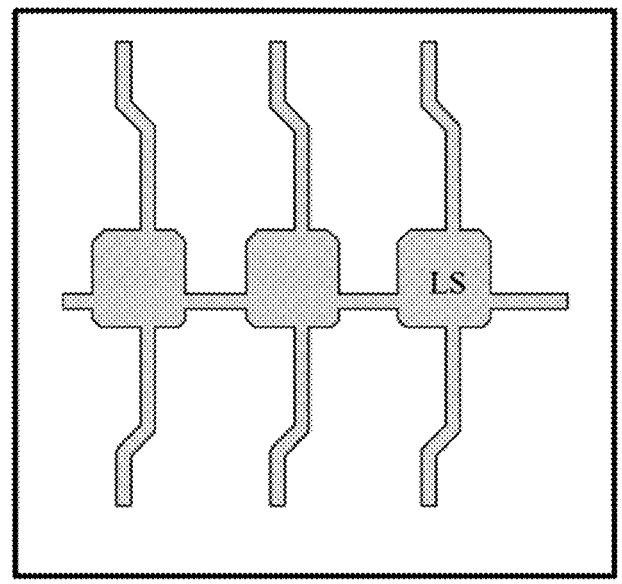
FIG. 3C is a diagram illustrating the structure of a light shielding layer in the array substrate depicted in FIG. 3A.
Figure 3D:
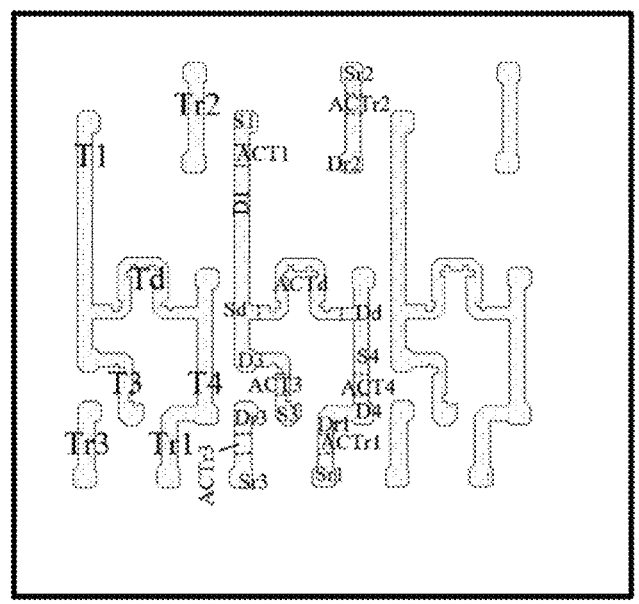
FIG. 3D is a diagram illustrating the structure of a first semiconductor material layer in the array substrate depicted in FIG. 3A.
Figure 3E:
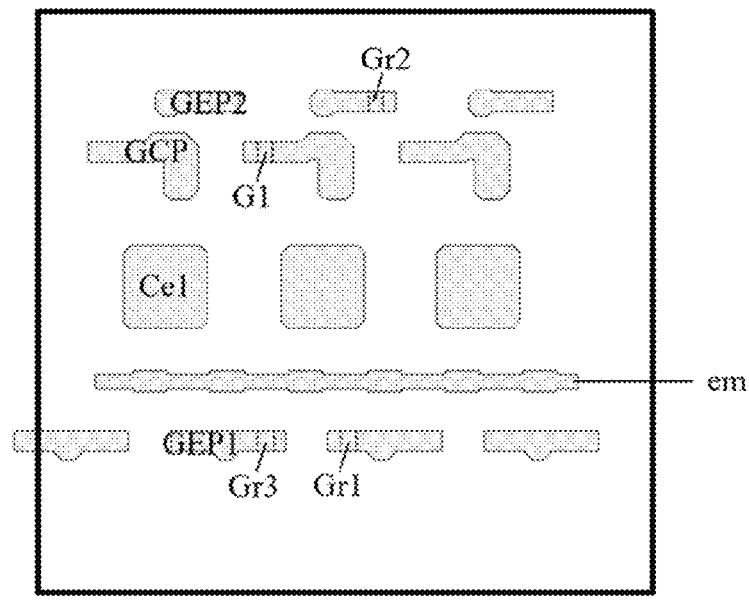
FIG. 3E is a diagram illustrating the structure of a first gate metal layer in the array substrate depicted in FIG. 3A.
Figure 3F:
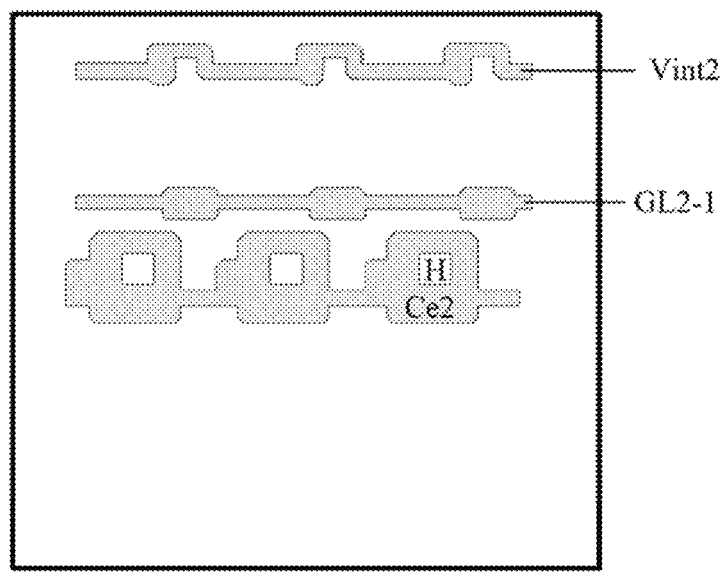
FIG. 3F is a diagram illustrating the structure of a second gate metal layer in the array substrate depicted in FIG. 3A.
Figure 3G:
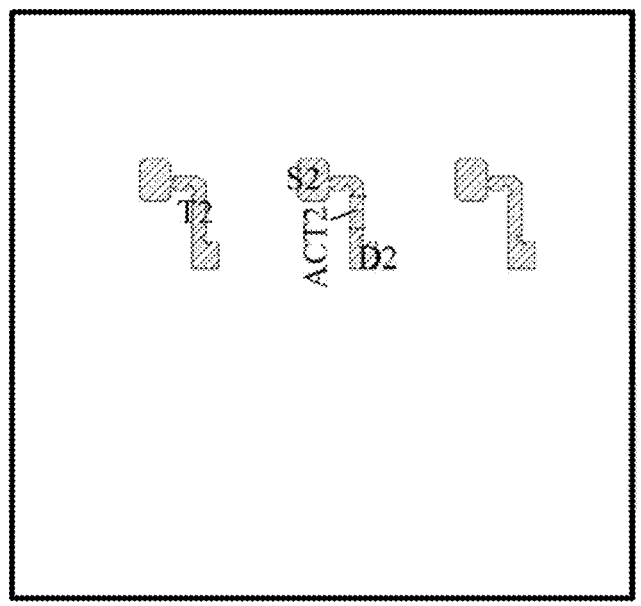
FIG. 3G is a diagram illustrating the structure of a second semiconductor material layer in the array substrate depicted in FIG. 3A.
Figure 3H:
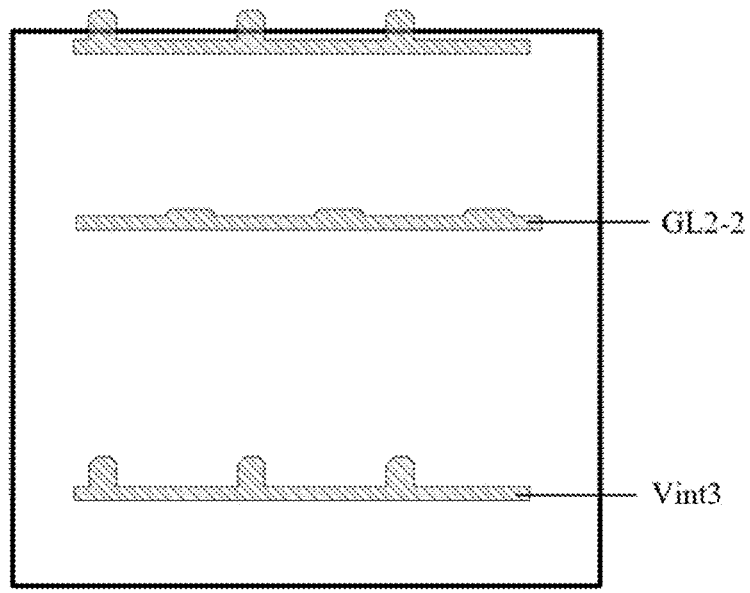
FIG. 3H is a diagram illustrating the structure of a third gate metal layer in the array substrate depicted in FIG. 3A.
Figure 3I:
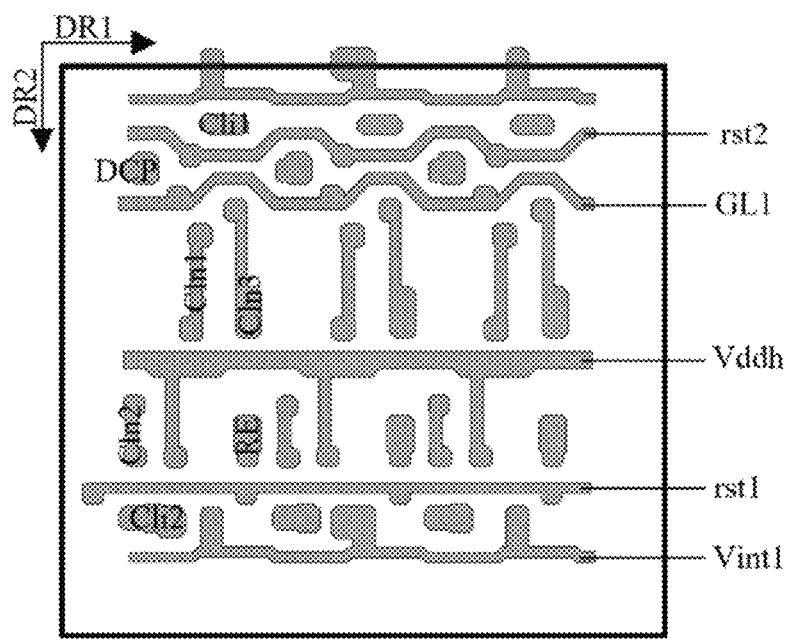
FIG. 3I is a diagram illustrating the structure of a first signal line layer in the array substrate depicted in FIG. 3A.
Figure 3J:
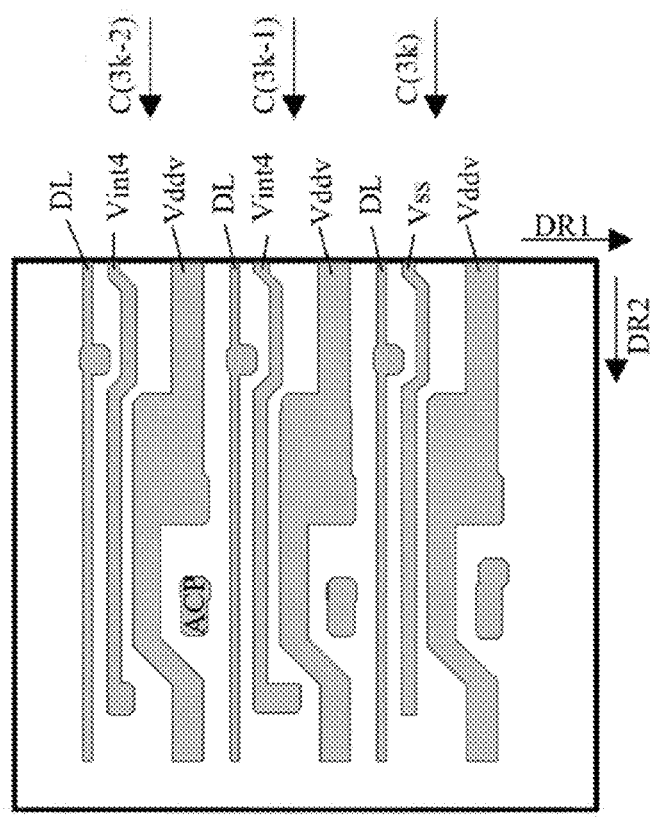
FIG. 3J is a diagram illustrating the structure of a second signal line layer in the array substrate depicted in FIG. 3A.
Figure 3K:
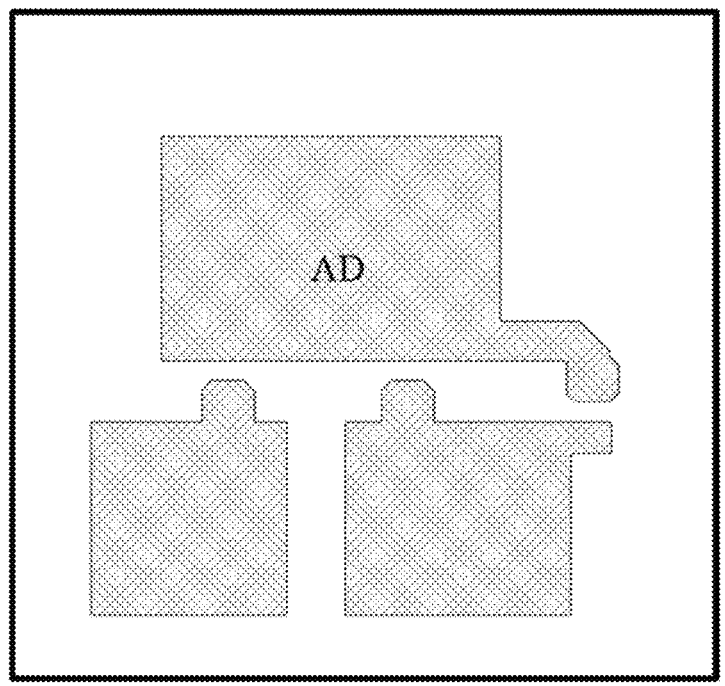
FIG. 3K is a diagram illustrating the structure of an anode layer in the array substrate depicted in FIG. 3A.
Figure 3L:
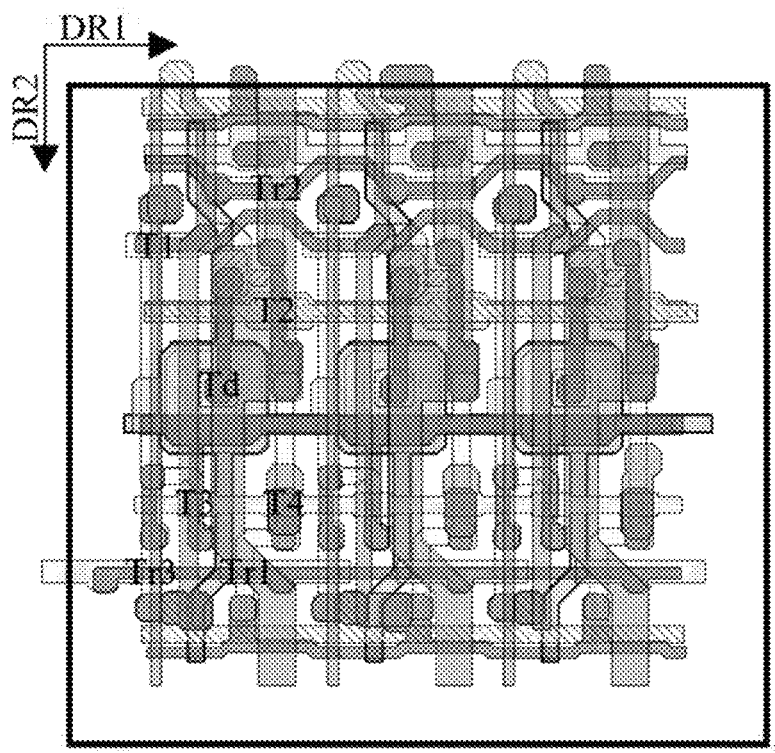
FIG. 3L is a diagram illustrating the structure of pixel driving circuits in an array substrate depicted in FIG. 3A except for the anode layer.
Figure 4A:
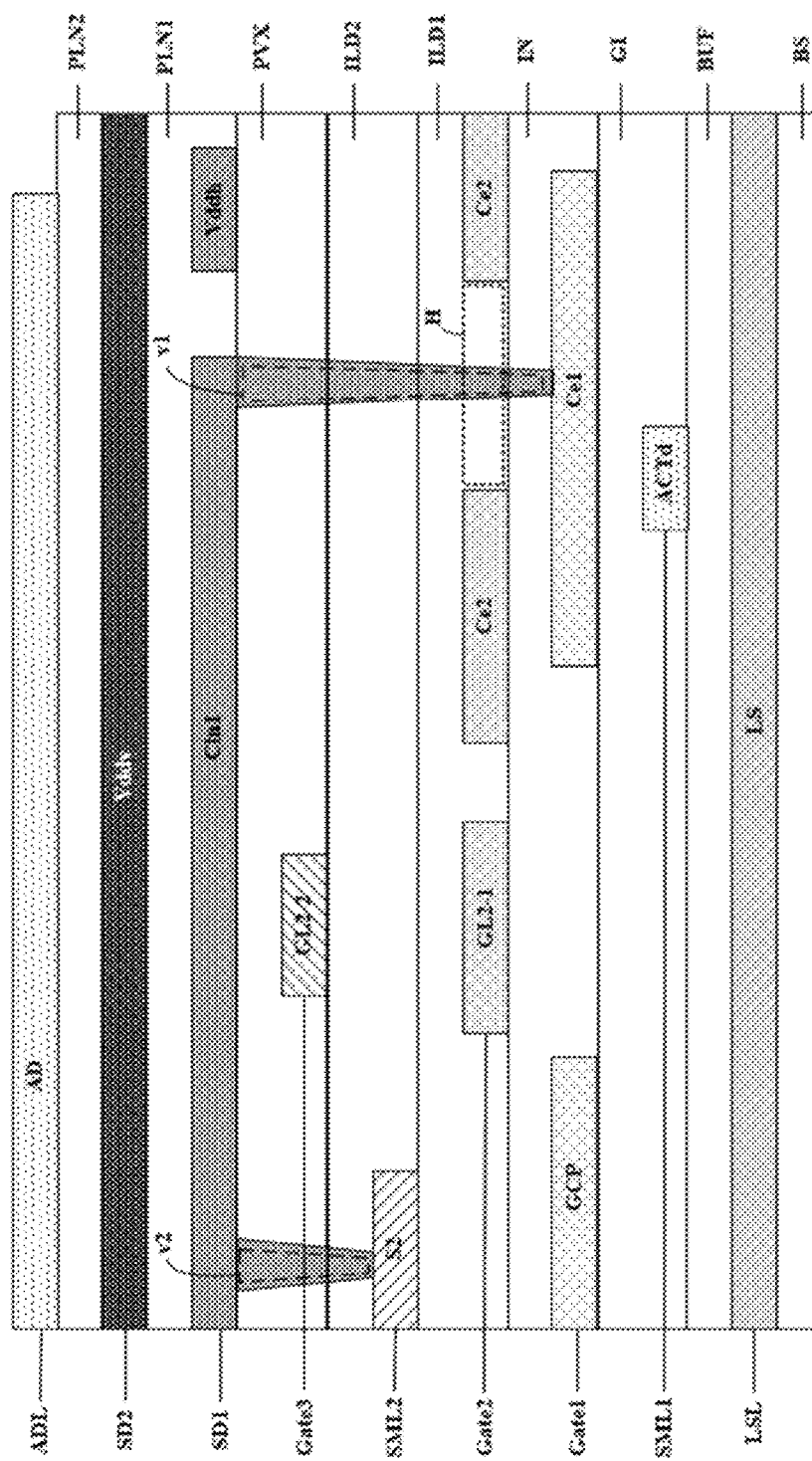
FIG. 4A is a cross-sectional view along an A-A' line in FIG. 3A.
Figure 4B:
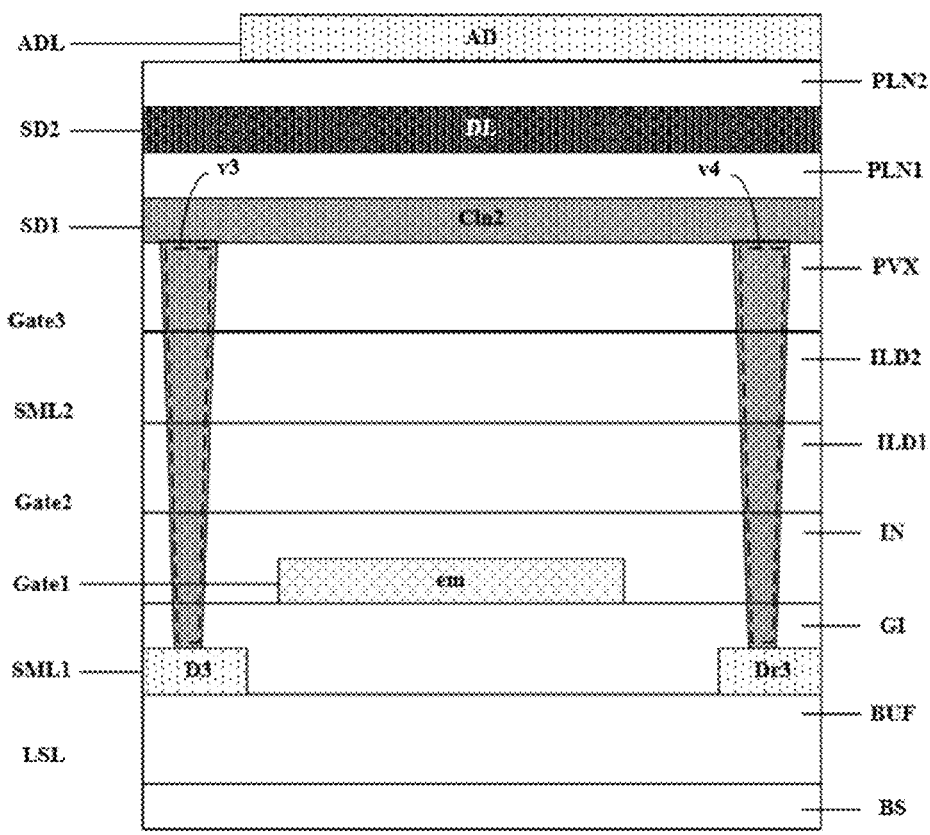
FIG. 4B is a cross-sectional view along a B-B' line in FIG. 3A.
Figure 4C:
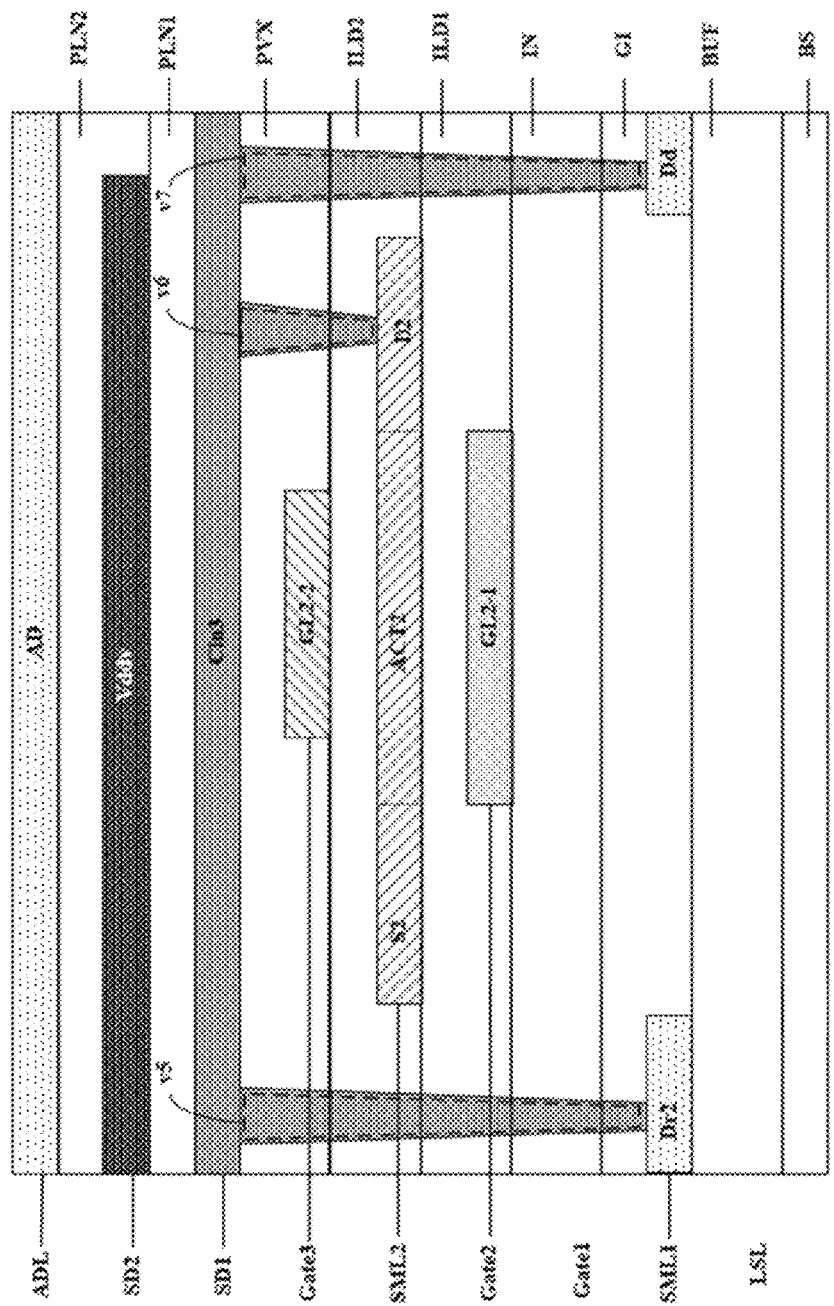
FIG. 4C is a cross-sectional view along a C-C' line in FIG. 3A.
Figure 4D:
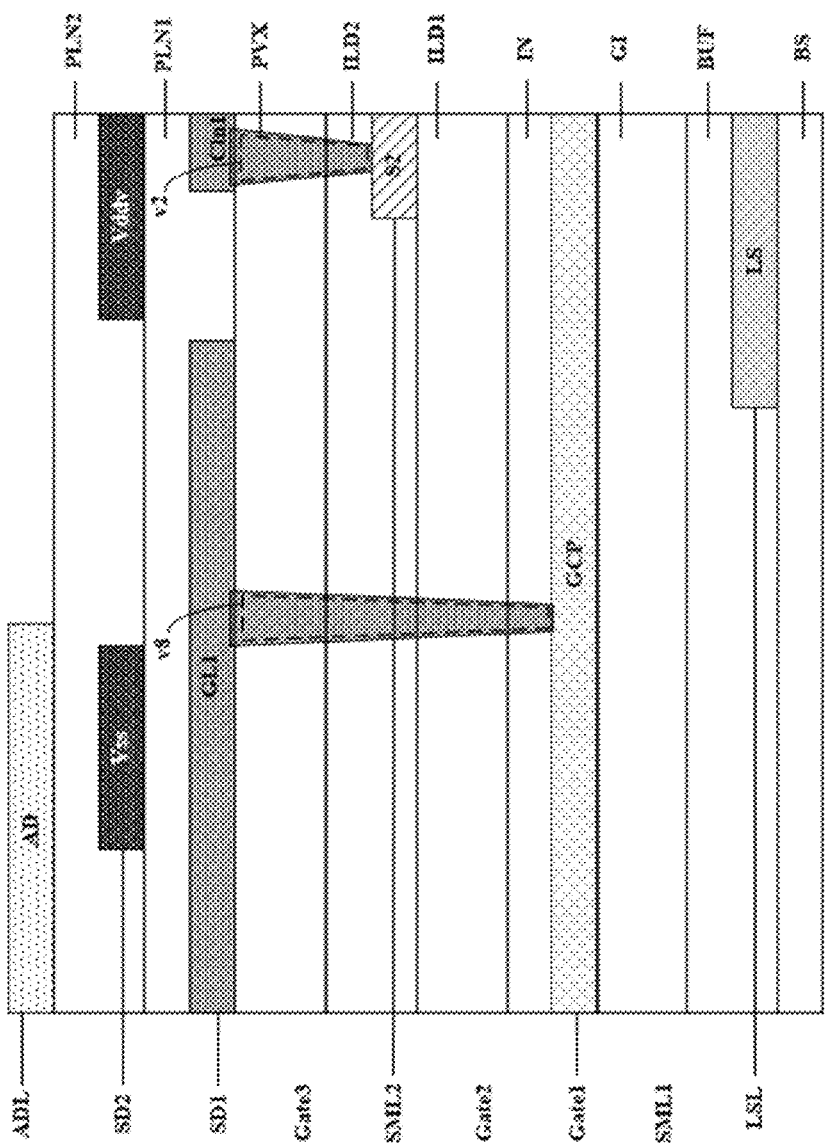
FIG. 4D is a cross-sectional view along a D-D' line in FIG. 3A.
Figure 4E:
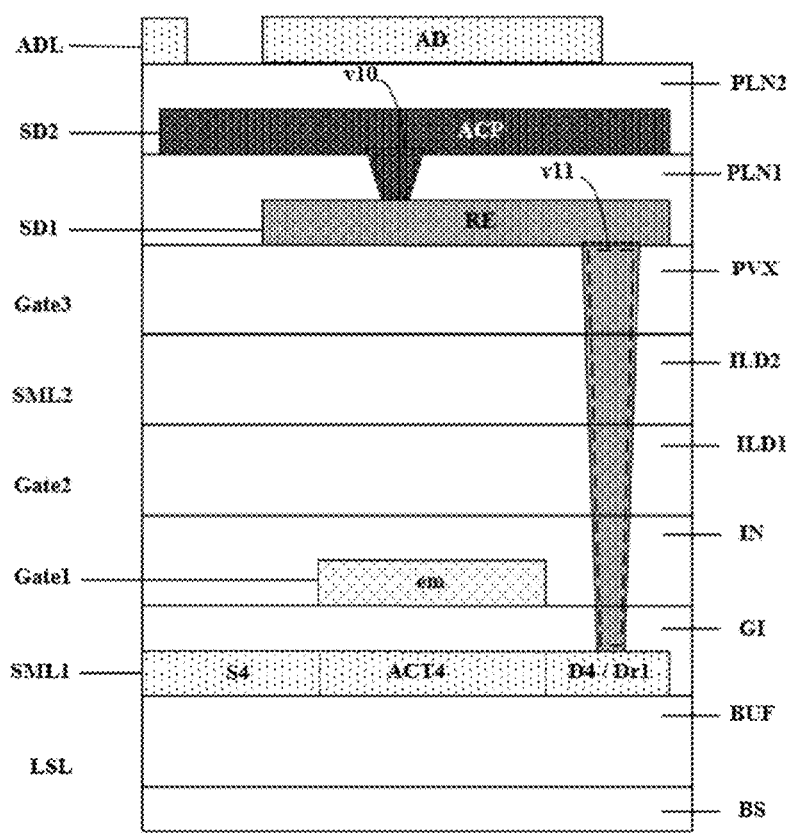
FIG. 4E is a cross-sectional view along a E-E' line in FIG. 3A.

FIG. 3C is a diagram illustrating the structure of a light shielding layer in the array substrate depicted in FIG. 3A. FIG. 3D is a diagram illustrating the structure of a first semiconductor material layer in the array substrate depicted in FIG. 3A. FIG. 3E is a diagram illustrating the structure of a first gate metal layer in the array substrate depicted in FIG. 3A. FIG. 3F is a diagram illustrating the structure of a second gate metal layer in the array substrate depicted in FIG. 3A. FIG. 3G is a diagram illustrating the structure of a second semiconductor material layer in the array substrate depicted in FIG. 3A. FIG. 3H is a diagram illustrating the structure of a third gate metal layer in the array substrate depicted in FIG. 3A. FIG. 3I is a diagram illustrating the structure of a first signal line layer in the array substrate depicted in FIG. 3A. FIG. 3J is a diagram illustrating the structure of a second signal line layer in the array substrate depicted in FIG. 3A. FIG. 3K is a diagram illustrating the structure of an anode layer in the array substrate depicted in FIG. 3A. FIG. 4A is a cross-sectional view along an A-A' line in FIG. 3A. FIG. 4B is a cross-sectional view along a B-B' line in FIG. 3A. FIG. 4C is a cross-sectional view along a C-C' line in FIG. 3A. FIG. 4D is a cross-sectional view along a D-D' line in FIG. 3A. FIG. 4E is a cross-sectional view along a E-E' line in FIG. 3A.

Referring to FIG. 3A to FIG. 3L, and FIG. 4A to FIG. 4E, the array substrate in some embodiments includes a base substrate BS, a light shield layer LSL on the base substrate BS, a buffer layer BUF on a side of the light shield layer LSL away from the base substrate BS, a first semiconductor material layer SML1 on a side of the buffer layer BUF away from the base substrate BS, a gate insulating layer G1 on a side of the first semiconductor material layer SML1 away from the base substrate BS, a first gate metal layer Gate1 on a side of the gate insulating layer G1 away from the first semiconductor material layer SML1, an insulating layer IN on a side of the first gate metal layer Gate1 away from the gate insulating layer G1, a second gate metal layer Gate2 on a side of the insulating layer IN away from the first gate metal layer Gate1, a first inter-layer dielectric layer ILD1 on a side of the second gate metal layer Gate2 away from the insulating layer IN, a second semiconductor material layer SML2 on a side of the first inter-layer dielectric layer ILD1 away from the second gate metal layer Gate2, a second inter-layer dielectric layer ILD2 on a side of the second semiconductor material layer SML2 away from the first inter-layer dielectric layer ILD1, a third gate metal layer Gate3 on a side of the second inter-layer dielectric layer ILD2 away from the second semiconductor material layer SML2, a passivation layer PVX on a side of the third gate metal layer Gate3 away from the second inter-layer dielectric layer ILD2, a first signal line layer SD1 on a side of the passivation layer PVX away from the third gate metal layer Gate3, a first planarization layer PLN1 on a side of the first signal line layer SD1 away from the passivation layer PVX, a second signal line layer SD2 on a side of the first planarization layer PLN1 away from the first signal line layer SD1, a second planarization layer PLN2 on a side of the second signal line layer SD2 away from the first planarization layer PLN1, and an anode layer ADL on a side of the second planarization layer PLN2 away from the second signal line layer SD2.

Referring to FIG. 2A, FIG. 3A, FIG. 3C, FIG. 4A, and FIG. 4D, in some embodiments, the light shield layer LSL includes a light shield LS. Various appropriate materials and various appropriate fabricating methods may be used for making the light shield layer LSL. For example, a metallic material may be deposited on the substrate by a plasma-enhanced chemical vapor deposition (PECVD) process. Examples of appropriate metallic materials for making the light shield layer LSL include, but are not limited to, aluminum, chromium, tungsten, titanium, tantalum, molybdenum, copper, and alloys or laminates containing the same.

In some embodiments, an orthographic projection of the light shield LS on a base substrate BS substantially covers (e.g., covers at least 80%, covers at least 85%, covers at least 90%, covers at least 95%, covers at least 99%, or completely covers) an orthographic projection of an active layer of a driving transistor of the pixel driving circuit on the base substrate BS.

In some embodiments, the light shield LS is configured to be provided with a first reference signal. Optionally, the light shield LS is electrically connected to a voltage supply line. In one example, the light shield LS is electrically connected to a voltage supply line in a peripheral area of the array substrate.

In alternative embodiments, the light shield LS is configured to be provided with a reference signal.

In alternative embodiments, the light shield LS is configured to be provided with a reset signal.

Referring to FIG. 2A, FIG. 3A, FIG. 3D, FIG. 4A to FIG. 4E, the first semiconductor material layer SML1 in some embodiments includes at least active layers of multiple transistors of the pixel driving circuit, including the first transistor T1, the third transistor T3, the fourth transistor T4, the first reset transistor Tr1, the second reset transistor Tr2, the third reset transistor Tr3, and the driving transistor Td. Optionally, the first semiconductor material layer SML1 further includes at least respective portions of first electrodes of multiple transistors of the pixel driving circuit, including the first transistor T1, the third transistor T3, the fourth transistor T4, the first reset transistor Tr1, the second reset transistor Tr2, the third reset transistor Tr3, and the driving transistor Td. Optionally, the first semiconductor material layer SML1 further includes at least respective portions of second electrodes of multiple transistors of the pixel driving circuit, including the first transistor T1, the third transistor T3, the fourth transistor T4, the first reset transistor Tr1, the second reset transistor Tr2, the third reset transistor Tr3, and the driving transistor Td. Optionally, the first semiconductor material layer SML1 includes active layers, first electrodes, and second electrodes of multiple transistors of the pixel driving circuit, including the first transistor T1, the third transistor T3, the fourth transistor T4, the first reset transistor Tr1, the second reset transistor Tr2, the third reset transistor Tr3, and the driving transistor Td. Various appropriate semiconductor materials may be used for making the first semiconductor material layer SML1. Examples of the semiconductor materials for making the first semiconductor material layer SML1 include silicon-based semiconductor materials such as polycrystalline silicon, single-crystal silicon, and amorphous silicon.

In FIG. 3D, a pixel driving circuit corresponding to PDC1 in FIG. 3B is annotated with labels indicating components of each of multiple transistors (T1, T3, T4, Tr1, Tr2, Tr3, and Td) in the pixel driving circuit. For example, the first transistor T1 includes an active layer ACT1, a first electrode S1, and a second electrode D1. The third transistor T3 includes an active layer ACT3, a first electrode S3, and a second electrode D3. The fourth transistor T4 includes an active layer ACT4, a first electrode S4, and a second electrode D4. The first reset transistor Tr1 includes an active layer ACTr1, a first electrode Sr1, and a second electrode Dr1. The second reset transistor Tr2 includes an active layer ACTr2, a first electrode Sr2, and a second electrode Dr2. The third reset transistor Tr3 includes an active layer ACTr3, a first electrode Sr3, and a second electrode Dr3. The driving transistor Td includes an active layer ACTd, a first electrode Sd, and a second electrode Dd.

Optionally, the active layers (ACT1, ACT3, ACT4, ACTr1, ACTr2, ACTr3, and ACTd), the first electrodes (S1, S3, S4, Sr1, Sr2, Sr3, and Sd), and the second electrodes (D1, D3, D4, Dr1, Dr2, Dr3, and Dd) of the respective transistors (T1, T3, T4, Tr1, Tr2, Tr3, and Td) are in a same layer.

In some embodiments, the active layers (ACT1, ACT3, ACT4, ACTr1, and ACTd), at least portions of the first electrodes (S1, S3, S4, Sr1, and Sd), and at least portions of the second electrodes (D1, D3, D4, Dr1, and Dd) of multiple transistors (T1, T3, T4, Tr1, and Td) in the pixel driving circuit are parts of a unitary structure. Optionally, a part of the second reset transistor Tr2 (ACTr2, Sr2, Dr2) in the first semiconductor material layer is spaced apart from the unitary structure (T1, T3, T4, Tr1, and Td) in a same pixel driving circuit. Optionally, a part of the third reset transistor Tr3 (ACTr3, Sr3. Dr3) in the first semiconductor material layer is spaced apart from the unitary structure (T1, T3, 14, Tr1, and Td) in a same pixel driving circuit.

Referring to FIG. 2A, FIG. 3A, FIG. 3E, and FIG. 4A to FIG. 4E, the first gate metal layer Gate1 in some embodiments includes a plurality of light emitting control signal lines (e.g., a respective light emitting control signal line ent), a gate connecting pad GCP, a first gate electrode pad GEP1, a second gate electrode pad GEP2, and a first capacitor electrode Ce1 of the storage capacitor Cst in the pixel driving circuit.

Various appropriate electrode materials and various appropriate fabricating methods may be used to make the first gate metal layer Gate1. For example, a conductive material may be deposited on the substrate by a plasma-enhanced chemical vapor deposition (PECVD) process and patterned. Examples of appropriate conductive materials for making the first gate metal layer Gate1 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of light emitting control signal lines (e.g., the respective light emitting control signal line em), the gate connecting pad GCP, the first gate electrode pad GEP1, the second gate electrode pad GEP2, and the first capacitor electrode Ce1 of the storage capacitor Cst in the pixel driving circuit are in a same layer.

As used herein, the term "same layer" refers to the relationship between the layers simultaneously formed in the same step. In one example, the plurality of light emitting control signal lines and the first capacitor electrode Ce1 are in a same layer when they are formed as a result of one or more steps of a same patterning process performed in a same layer of material. In another example, the plurality of light emitting control signal lines and the first capacitor electrode Ce1 can be formed in a same layer by simultaneously performing the step of forming the plurality of light emitting control signal lines, and the step of forming the first capacitor electrode Ce1. The term "same layer" does not always mean that the thickness of the layer or the height of the layer in a cross-sectional view is the same.

In some embodiments, the gate connecting pad GCP includes a gate electrode G1 of the first transistor T1 in the pixel driving circuit. The gate connecting pad GCP is connected to a respective first gate line GL1 of a plurality of first gate lines. In one example, the respective first gate line GL1 is connected to the gate connecting pad GCP through an eighth via v8. Optionally, the eighth via v8 extends through the passivation layer PVX, the second inter-layer dielectric layer ILD2, the first inter-layer dielectric layer ILD1, and the insulating layer IN.

In some embodiments, the first gate electrode pad GEP1 includes a gate electrode Gr1 of the first reset transistor Tr1 in the pixel driving circuit, and a gate electrode Gr3 of the third reset transistor Tr3 in an adjacent pixel driving circuit in a same row and in a next adjacent column (or a gate electrode Gr3 of the third reset transistor Tr3 in the pixel driving circuit, and a gate electrode Gr1 of the first reset transistor Tr1 in an adjacent pixel driving circuit in a same row and in a previous adjacent column. The first gate electrode pad GEP1 is connected to the respective first reset control signal line rst1 of the plurality of first reset control signal lines. In one example, the respective first reset control signal line rst1 is connected to the first gate electrode pad GEP1 through a via extending through the passivation layer PVX, the second inter-layer dielectric layer ILD2, the first inter-layer dielectric layer ILD1, and the insulating layer IN.

In some embodiments, the second gate electrode pad GEP2 includes a gate electrode Gr2 of the second reset transistor Tr2 in the pixel driving circuit. The second gate electrode pad GEP2 is connected to the respective second reset control signal line rst2 of the plurality of second reset control signal lines. In one example, the respective second reset control signal line rst2 is connected to the second gate electrode pad GEP2 through a via extending through the passivation layer PVX, the second inter-layer dielectric layer ILD2, the first inter-layer dielectric layer ILD1, and the insulating layer IN.

Referring to FIG. 2A, FIG. 3A, FIG. 3F, and FIG. 4A to FIG. 4E, the second gate metal layer Gate2 in some embodiments includes at least portions of a plurality of second gate lines (e.g., a respective second gate line first branch GL2-1), a plurality of second reset signal lines (e.g., a respective second reset signal line Vint2), and a second capacitor electrode Ce2 of the storage capacitor Cst in the pixel driving circuit. Various appropriate electrode materials and various appropriate fabricating methods may be used to make the second gate metal layer Gate2. For example, a conductive material may be deposited on the substrate by a plasma-enhanced chemical vapor deposition (PECVD) process and patterned. Examples of appropriate conductive materials for making the second gate metal layer Gate2 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the at least portions of the plurality of second gate lines (e.g., a respective second gate line first branch GL2-1), the plurality of second reset signal lines (e.g., the respective second reset signal Vint2), and the second capacitor electrode Ce2 of the storage capacitor Cst in the pixel driving circuit are in a same layer.

Referring to FIG. 3F, a plurality of second capacitor electrodes in a plurality of pixel driving circuits are connected to each other, and are parts of a unitary structure. By having second capacitor electrodes connected to each other, a resistance of a respective first voltage supply line Vddh can be reduced because the second capacitor electrodes are electrically connected to the respective first voltage supply line Vddh. The inventors of the present disclosure discover that this structure improves display uniformity in the array substrate.

In alternative embodiments, the plurality of second capacitor electrodes in the plurality of pixel driving circuits are spaced apart from each other. By having second capacitor electrodes spaced apart from each other, parasitic capacitance between the plurality of second capacitor electrodes and the second electrode Dd of the driving transistor Td (e.g., the node N3) can be reduced, preventing occurrence of short-term residual image when the array substrate is in a display mode.

Referring to FIG. 2A, FIG. 3A, FIG. 3G, and FIG. 4A to FIG. 4E, the second semiconductor material layer SML2 in some embodiments includes at least an active layer ACT2 of the second transistor T2 in the pixel driving circuit. Optionally, the second semiconductor material layer SML2 further includes at least a portion of a first electrode S2 of the second transistor T2 in the pixel driving circuit. Optionally, the second semiconductor material layer SML2 further includes at least a portion of a second electrode D2 of the second transistor T2 in the pixel driving circuit. Optionally, the second semiconductor material layer SML2 includes the active layer ACT2, the first electrode S2, and the second electrode D2 of the second transistor T2. In the present array substrate, at least the active layer ACT2 of the second transistor T2 are in a layer different from at least the active layers of other transistors of the pixel driving circuit. Various appropriate semiconductor materials may be used for making the second semiconductor material layer SML2. Examples of the semiconductor materials for making the second semiconductor material layer SML2 include metal oxide-based semiconductor material such as indium gallium zinc oxide and metal oxynitride-based semiconductor materials such as zinc oxynitride.

| In FIG. 3G, a pixel driving circuit corresponding to PDC1 in FIG. 3B is annotated with labels indicating components of the second transistor in the pixel driving circuit. For example, the second transistor T2 includes an active layer ACT2, a first electrode S2, and a second electrode D2. Optionally, the active layer ACT2, the first electrode S2, and the second electrode D2 of the second transistor T2 are in a same layer.

Referring to FIG. 2A, FIG. 3A, FIG. 3H, FIG. 4A to FIG. 4E, the third gate metal layer Gate3 in some embodiments includes at least portions of a plurality of second gate lines (e.g., a respective second gate line second branch GL2-2), and a plurality of third reset signal lines (e.g., a respective third reset signal line Vint3). Various appropriate electrode materials and various appropriate fabricating methods may be used to make the third gate metal layer Gate3. For example, a conductive material may be deposited on the substrate by a plasma-enhanced chemical vapor deposition (PECVD) process and patterned. Examples of appropriate conductive materials for making the third gate metal layer Gate3 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

Referring to FIG. 2A, FIG. 3A, FIG. 3I, FIG. 4A to FIG. 4E, the first signal line layer SD1 in some embodiments includes a plurality of first reset signal lines (e.g., a respective first reset signal line Vint1); a plurality of first voltage supply lines (e.g., a respective first voltage supply line Vddh); a plurality of first gate lines (e.g., a respective first gate line GL1); a plurality of first reset control signal lines (e.g., a respective first reset control signal line rst1); a plurality of second reset control signal lines (e.g., a respective second reset control signal line rst2); a data connecting pad DCP; a first node connecting line Cln1; a second node connecting line Cln2; a third node connecting line Cln3; a relay electrode RE; a first reset signal connecting line Cli1; and a second reset signal connecting line Cli2.

Various appropriate conductive materials and various appropriate fabricating methods may be used to make the first signal line layer SD1. For example, a conductive material may be deposited on the substrate by a plasma-enhanced chemical vapor deposition (PECVD) process and patterned. Examples of appropriate conductive materials for making the first signal line layer include, but are not limited to, titanium, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. In some embodiments, the first signal line layer includes a plurality of sub-layers stacked together. In one example, the first signal line layer includes a stacked titanium/aluminum/titanium multi-layer structure. In another example, the first signal line layer includes a stacked molybdenum/aluminum/molybdenum multi-layer structure. Optionally, the plurality of first reset signal lines (e.g., the respective first reset signal line Vint1); the plurality of first voltage supply lines (e.g., the respective first voltage supply line Vddh); the plurality of first gate lines (e.g., the respective first gate line GL1); the plurality of first reset control signal lines (e.g., the respective first reset control signal line rst1); the plurality of second reset control signal lines (e.g., the respective second reset control signal line rst2); the data connecting pad DCP; the first node connecting line Cln1; the second node connecting line Cln2; the third node connecting line Cln3; the relay electrode RE; the first reset signal connecting line Cli1; and the second reset signal connecting line Cli2 are in a same layer.

In some embodiments, the first node connecting line Cln1 connects multiple components of the pixel driving circuit to the node N1. Referring to FIG. 4A, the first node connecting line Cln1 is connected to the first capacitor electrode Ce1 through a first via v1, and connected to the second transistor T2 (e.g., to the first electrode $2 of the second transistor T2) through a second via v2. Optionally, the first node connecting line Cln1 corresponds to the node N1 depicted in FIG. 2A.

Referring to FIG. 2A, FIG. 3A, FIG. 3E, FIG. 3F, and FIG. 4A, in some embodiments, in a hole region H, a portion of the second capacitor electrode Ce2 is absent. Optionally, an orthographic projection of the second capacitor electrode Ce2 on a base substrate BS substantially (e.g., at least 80%, at least 85%, at least 90%, at least 95%, at least 98%, at least 99%, or 100%) covers, with a margin, an orthographic projection of the first capacitor electrode Ce1 on the base substrate BS except for the hole region H in which a portion of the second capacitor electrode Ce2 is absent. Optionally, the first via v1 extends through the passivation layer PVX, the second inter-layer dielectric layer ILD2, the first inter-layer dielectric layer ILD1, the hole region H, and the insulating layer IN.

In some embodiments, the first node connecting line Cln1 crosses over a respective second gate line of the plurality of second gate lines. As shown in FIG. 3A and FIG. 4A, the first node connecting line Cln1 crosses over the respective second gate line first branch GL2-1 in the second gate metal layer Gate2, and the respective second gate line second branch GL2-2 in the third gate metal layer Gate3.

In some embodiments, referring to FIG. 4B, the second node connecting line Cln2 is connected to a second electrode D3 of the third transistor T3 through a third via v3, and connected to a second electrode Dr3 of the third reset transistor Tr3 through a fourth via v4. Optionally, the second node connecting line Cln2 corresponds to the node N2 depicted in FIG. 2A. Optionally, the second node connecting line Cln2 crosses over the respective light emitting control signal line em of the plurality of light emitting control signal lines.

In some embodiments, referring to FIG. 4C, the third node connecting line Cln3 is connected to a second electrode Dr2 of the second reset transistor Tr2 through a fifth via v5, connected to a second electrode D2 of the second transistor T2 through a sixth via v6, and connected to a second electrode Dd of the driving transistor Td and a first electrode $4 of the fourth transistor T4 through a seventh via v7. Optionally, the third node connecting line Cln3 corresponds to the node N3 depicted in FIG. 2A. Optionally, the third node connecting line Cln3 crosses over a respective second gate line of the plurality of second gate lines. As shown in FIG. 3A and FIG. 4C, the third node connecting line Cln3 crosses over the respective second gate line first branch GL2-1 in the second gate metal layer Gate2, and the respective second gate line second branch GL2-2 in the third gate metal layer Gate3.

In some embodiments, an orthographic projection of the third node connecting line Cln3 on a base substrate BS at least partially (e.g., at least 80%, at least 85%, at least 90%, at least 95%, at least 98%, or at least 99%) overlaps with an orthographic projection of the active layer ACT2 of the second transistor T2 on the base substrate. Optionally, the third node connecting line Cln3 extends along a direction substantially parallel to a direction along which the active layer ACT2 of the second transistor T2 extends. Optionally, the orthographic projection of the third node connecting line Cln3 on a base substrate BS at least partially overlaps with an orthographic projection of the first electrode $2 of the second transistor T2 on the base substrate. Optionally, the orthographic projection of the third node connecting line Cln3 on a base substrate BS at least partially overlaps with an orthographic projection of the second electrode D2 of the second transistor T2 on the base substrate. As used herein, the term "substantially parallel" means that an angle is in the range of 0 degree to approximately 45 degrees, e.g., 0) degree to approximately 5 degrees, 0) degree to approximately 10 degrees, 0) degree to approximately 15 degrees, 0) degree to approximately 20 degrees, 0 degree to approximately 25 degrees, 0 degree to approximately 30 degrees.

In some embodiments, referring to FIG. 3F, FIG. 3I, and FIG. 3J, the respective first voltage supply line Vddh connects a respective second voltage supply line Vddv of a plurality of second voltage supply lines to the second capacitor electrode Ce2, and connects the respective second voltage supply line Vddv of the plurality of second voltage supply lines to the first electrode S3 of the third transistor T3. Optionally, the respective second voltage supply line Vddv of the plurality of second voltage supply lines is connected to the respective first voltage supply line Vddh through a via, the respective first voltage supply line Vddh of the plurality of first voltage supply lines is connected to the second capacitor electrode Ce2 through a via, the respective first voltage supply line Vddh of the plurality of first voltage supply lines is connected to the first electrode S3 of the third transistor T3 through a via, thereby supplying a first reference voltage signal to the respective first voltage supply line Vddh, and in turn to the second capacitor electrode Ce2 and to the first electrode S3 of the third transistor T3.

Referring to FIG. 3A, FIG. 3I, and FIG. 3J, in some embodiments, the respective first voltage supply line Vddh extends along a direction substantially parallel to the first direction DR1, and the respective second voltage supply line Vddv extends along a direction substantially parallel to the second direction DR2. Optionally, the plurality of first voltage supply lines and the plurality of second voltage supply lines form an interconnected voltage supply network. The first direction DR1 and the second direction DR2 are different from each other.

In some embodiments, referring to FIG. 3A to FIG. 3L, the first reset signal connecting line Cli1 connects a respective second reset signal line Vint2 of a plurality of second reset signal lines to the first electrode Sr2 of the second reset transistor Tr2. The first reset signal connecting line Cli1 is configured to transmit a reset signal from the respective second reset signal line Vint2 to the first electrode Sr2 of the second reset transistor Tr2.

In some embodiments, referring to FIG. 3A to FIG. 3L, the second reset signal connecting line Cli2 connects a respective third reset signal line Vint3 of a plurality of third reset signal lines, a first electrode Sr3 of the third reset transistor Tr3, and a respective fourth reset signal line Vint4 of a plurality of fourth reset signal lines together. The second reset signal connecting line Cli2 is connected to the first electrode Sr3 of the third reset transistor through a via, and connected to a respective third reset signal line Vint3 of a plurality of third reset signal lines through a via; the respective fourth reset signal line Vint4 of the plurality of fourth reset signal lines connected to the second reset signal connecting line Cli2 through a via, thereby transmitting a reset signal from the respective third reset signal line Vint3 and the respective fourth reset signal line Vint4 to the first electrode Sr3 of the third reset transistor.

In some embodiments, referring to FIG. 3A to FIG. 3L, the respective first reset signal line Vint1 of the plurality of first reset signal lines is connected to the first electrode Sr1 of the first reset transistor through a via.

In some embodiments, referring to FIG. 3A to FIG. 3L, the data connecting pad DCP connect a respective data line DL of the plurality of data lines to the first electrode S1 of the first transistor T1 through a via. The data connecting pad DCP is configured to transmit a data signal from the respective data line DL to the first electrode S1 of the first transistor.

Referring to FIG. 2A, FIG. 3A, FIG. 3J, and FIG. 4A to FIG. 4E, the second signal line layer SD2 in some embodiments includes a plurality of second voltage supply lines (e.g, a respective second voltage supply line Vddv), an anode contact pad ACP, a plurality of data lines (e.g., a respective data line DL), a plurality of fourth reset signal lines (e.g., a respective fourth reset signal line Vint4), and a plurality of low voltage supply lines (e.g., a respective low voltage supply line Vss). In some embodiments, the respective first voltage supply line Vddh and the respective second voltage supply line Vddv are configured to provide a first reference voltage signal (e.g., a high reference voltage signal). Optionally, the respective low voltage supply line Vss is configured to provide a second reference voltage signal (e.g., a low reference voltage signal). Optionally, the first reference voltage signal is a constant voltage signal, the second reference voltage signal is a constant voltage signal, the first reference voltage signal has a voltage level higher than a voltage level of the second reference voltage signal.

Various appropriate conductive materials and various appropriate fabricating methods may be used to make the second signal line layer SD2. For example, a conductive material may be deposited on the substrate by a plasma-enhanced chemical vapor deposition (PECVD) process and patterned. Examples of appropriate conductive materials for making the second signal line layer SD2 include, but are not limited to, titanium, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. In one example, the second signal line layer includes a stacked titanium/aluminum/titanium multi-layer structure. In another example, the second signal line layer includes a stacked molybdenum/aluminum/molybdenum multi-layer structure. Optionally, the plurality of second voltage supply lines (e.g., the respective second voltage supply line Vddv), the anode contact pad ACP, the plurality of data lines (e.g., the respective data line DL), the plurality of fourth reset signal lines (e.g., the respective fourth reset signal line Vint4), and the plurality of low voltage supply lines (e.g., the respective low voltage supply line Vss) are in a same layer.

Referring to FIG. 2A, FIG. 3A, FIG. 3K, and FIG. 4A to FIG. 4E, the anode layer ADL in some embodiments includes a plurality of anodes (e.g., an anode AD denoted in FIG. 3K).

| Referring to FIG. 2A, FIG. 3A, and FIG. 33, the array substrate in some embodiments includes a plurality of second voltage supply lines (e.g., a respective second voltage supply line Vddv), a plurality of data lines (e.g., a respective data line DL), a plurality of fourth reset signal lines (e.g., a respective fourth reset signal line Vint4), and a plurality of low voltage supply lines (e.g., a respective low voltage supply line Vss). In some embodiments, the plurality of pixel driving circuits are arranged in columns, including a (3k−2)-th column C(3k−2), a (3k−1)-th column C(3k−1), and a (3k)-th column C(3k) of K columns, K and k being positive integers, $1 \leq k \leq (K/3)$.

As used herein, the terms "(3k−2)-th column". "(3k−1)-th column", and "(3k)-th column" are used in the context of the K columns. The array substrate may or may not include additional column(s) before the first column of the K columns and/or additional columns after the last column of the K columns. In the context of the array substrate, the term "(3k−1)-th column" does not necessarily denote an odd-numbered column, and the term "(3k−2)-th column" or "(3k)-th column does not necessarily denote an even-numbered column. In one example, the (3k−2)-th column is an even-numbered column in the context of the K columns, but may be an odd-numbered column in the context of the array substrate. In another example, the (3k−2)-th column is an even-numbered column in the context of the K columns, and also an even-numbered column in the context of the array substrate. In one example, the (3k−1)-th column is an odd-numbered column in the context of the K columns, but may be an even-numbered column in the context of the array substrate. In another example, the (3k−1)-th column is an odd-numbered column in the context of the K columns, and also an odd-numbered column in the context of the array substrate. In one example, the (3k)-th column is an even-numbered column in the context of the K columns, but may be an odd-numbered column in the context of the array substrate. In another example, the (3k)-th column is an even-numbered column in the context of the K columns, and also an even-numbered column in the context of the array substrate.

In some embodiments, the (3k−2)-th column C(3k−1) includes a (3k−2)-th pixel driving circuit, the (3k−1)-th column C(3k−1) includes a (3k−1)-th pixel driving circuit, and the (3k)-th column C(3k) includes a (3k)-th pixel driving circuit. The (3k−2)-th pixel driving circuit, the (3k−1)-th pixel driving circuit, and the (3k)-th pixel driving circuit are in a same row.

In some embodiments, the (3k−2)-th column C(3k−2) includes a fourth reset signal line of the plurality of fourth reset signal lines; the (3k−1)-th column C(3k−1) includes a fourth reset signal line of the plurality of fourth reset signal lines; and the (3k)-th column C(3k) includes a low voltage supply line of the plurality of low voltage supply lines.

Optionally, the plurality of fourth reset signal lines are absent in the (3k)-th column C(3k).

Optionally, the plurality of low voltage supply lines are absent in the (3k−2)-th column C(3k−2) and are absent in the (3k−1)-th column C(3k−1).

Optionally, the plurality of second voltage supply lines are present in the (3k−2)-th column C(3k−2), the (3k−1)-th column C(3k−1), and the (3k)-th column C(3k).

Figure 5:
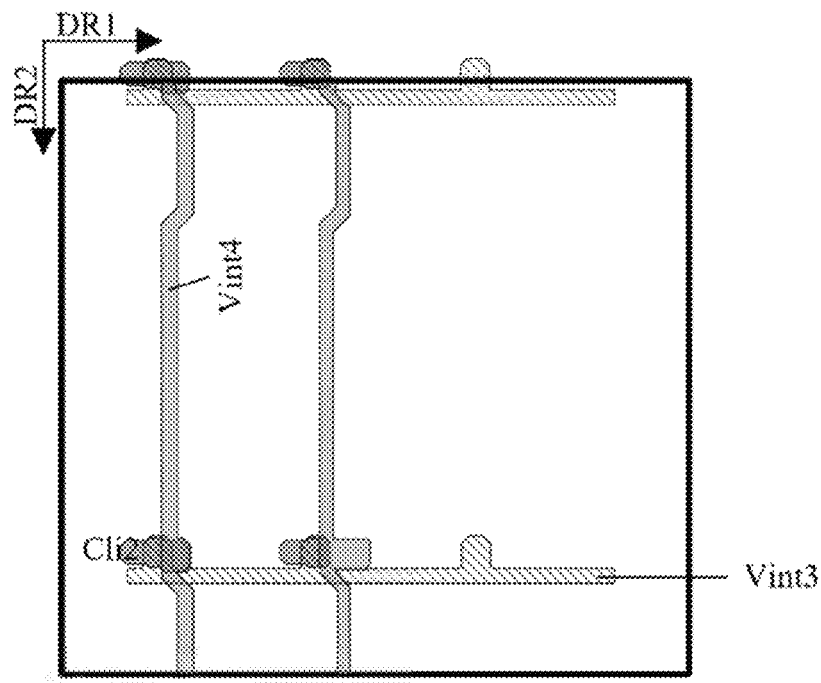
FIG. 5 illustrates an interconnected reset signal network in some embodiments according to the present disclosure.

In some embodiments, the plurality of third reset signal lines and the plurality of fourth reset signal lines form an interconnected reset signal network. FIG. 5 illustrates an interconnected reset signal network in some embodiments according to the present disclosure. Referring to FIG. 5, the interconnected reset signal network, in some embodiments includes a plurality of third reset signal lines and a plurality of fourth reset signal lines interconnected together. The plurality of third reset signal lines extend along a direction substantially parallel to a first direction DR1; the plurality of fourth reset signal lines extend along a direction substantially parallel to a second direction DR2. Optionally, a respective third reset signal line Vint3 of the plurality of third reset signal lines and a respective fourth reset signal line Vint4 of the plurality of fourth reset signal lines are interconnected to each other through a second reset signal connecting line Cli2. In one example, the plurality of third reset signal lines are in the third gate metal layer Gate3, and the plurality of fourth reset signal lines are in the second signal line layer SD2. Optionally, a respective third reset signal line Vint3 is connected to one or more fourth reset signal line of the plurality of fourth reset signal line. Optionally, a respective fourth reset signal line Vint4 is connected to one or more third reset signal line of the plurality of third reset signal line.

Figure 6:
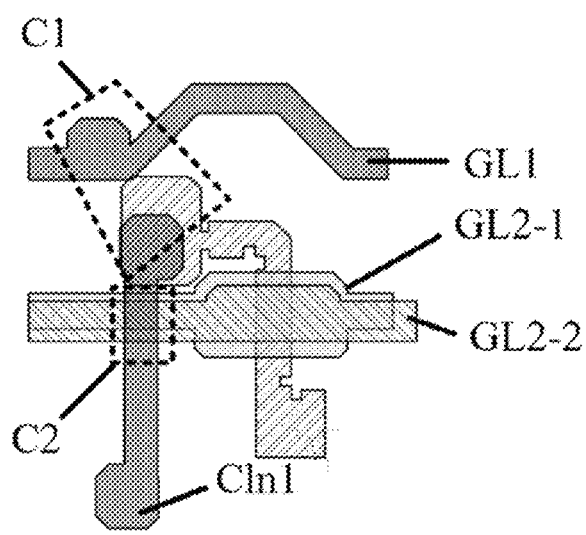
FIG. 6 illustrates a first capacitance and a second capacitance in a pixel driving circuit in an array substrate in some embodiments according to the present disclosure.

In some embodiments, there are two capacitances. C1 and C2, in a pixel driving circuit in an array substrate in some embodiments according to the present disclosure. FIG. 6 illustrates a first capacitance and a second capacitance in a pixel driving circuit in an array substrate in some embodiments according to the present disclosure. Referring to FIG. 6, FIG. 3A, FIG. 3F to FIG. 3I, in some embodiments, the first capacitance C1 is formed between the second semiconductor material layer (e.g., a structure comprising the first electrode S2 of the second transistor T2) and the respective first gate line GL1, and/or between the first node connecting line Cln1 and the respective first gate line GL1. The second capacitance C2 is formed between the first node connecting line Cln1 and the respective second gate line (e.g., including the respective second gate line first branch GL2-1 in the second gate metal layer and the respective second gate line second branch GL2-2 in the third gate metal layer).

The inventors of the present disclosure discover that a higher ratio of C1 to C2 is conducive to achieving an increased dark state margin. The dark state margin refers to the difference in voltage between the voltage required to turn off a subpixel completely and the voltage required to produce a small amount of light emission in the subpixel. When the dark state margin is too small, it can result in "false contouring" or "image retention". An increased dark state margin avoids the "false contouring" or "image retention".

As shown in FIG. 6, FIG. 3A, FIG. 3F to FIG. 3I, in some embodiments, an orthographic projection of the second semiconductor material layer on a base substrate is substantially non-overlapping (e.g., at least 80% non-overlapping, at least 90% non-overlapping, at least 95% non-overlapping, at least 99% non-overlapping, or completely non-overlapping) with an orthographic projection of the respective first gate line GL1 on the base substrate; and an orthographic projection of the first node connecting line Cln1 on the base substrate is substantially non-overlapping (e.g., at least 80% non-overlapping, at least 90% non-overlapping, at least 95% non-overlapping, at least 99% non-overlapping, or completely non-overlapping) with the orthographic projection of the respective first gate line GL1 on the base substrate. The first capacitance C1 is formed between lateral sides of the second semiconductor material layer and the respective first gate line GL1, and/or between lateral sides of the first node connecting line Cln1 and the respective first gate line GL1. The inventors of the present disclosure discover that this leads to a relatively smaller ratio of C1 to C2.

The inventors of the present disclosure discover that, by having the gate connecting pad GCP, the first capacitance C1 can be effectively increased, achieving a higher ratio of C1 to C2 and an increased dark state margin.

Figure 7:
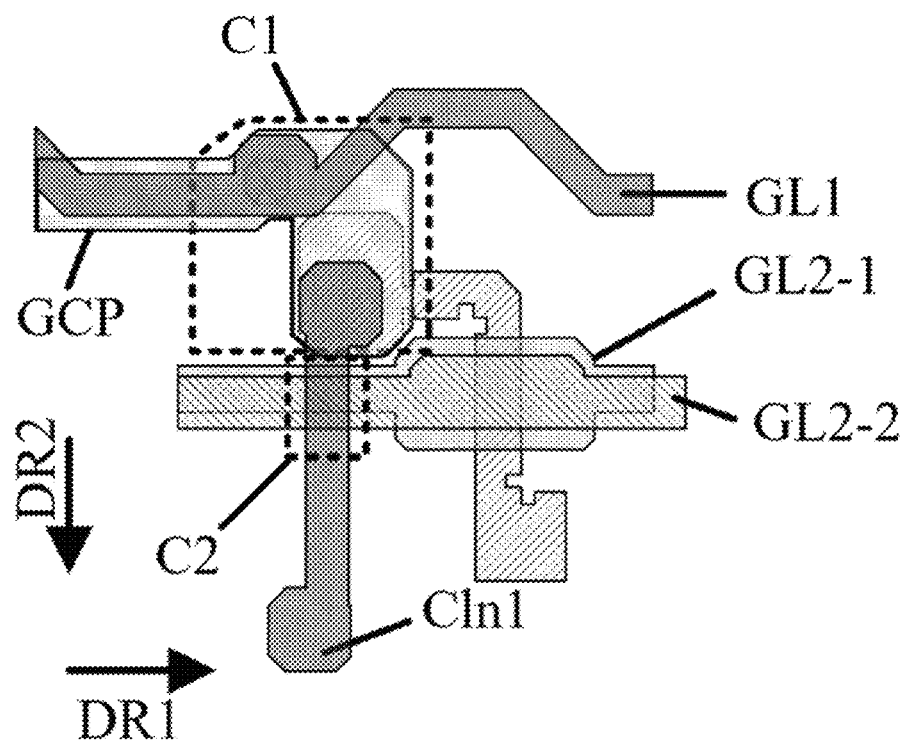
FIG. 7 illustrates a first capacitance and a second capacitance in a pixel driving circuit in an array substrate in some embodiments according to the present disclosure.

FIG. 7 illustrates a first capacitance and a second capacitance in a pixel driving circuit in an array substrate in some embodiments according to the present disclosure. Referring to FIG. 7, FIG. 3A, FIG. 3E to FIG. 3I, in some embodiments, an orthographic projection of the gate connecting pad GCP on a base substrate at least partially overlaps with an orthographic projection of the second semiconductor material layer (e.g., a first electrode $2 of the second transistor T2) on the base substrate, and at least partially overlaps with an orthographic projection of the first node connecting line Cln1 on the base substrate. In some embodiments, the first capacitance C1 is at least partially formed between the gate connecting pad GCP and the second semiconductor material layer (e.g., a structure comprising the first electrode S2 of the second transistor T2), and/or between the gate connecting pad GCP and the first node connecting line Cln1.

Figure 8:
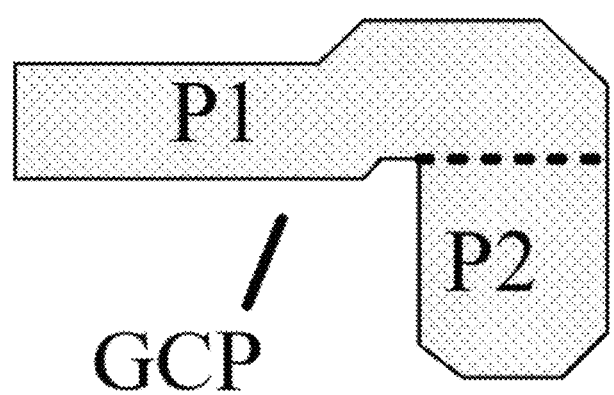
FIG. 8 illustrates the structure of a gate connecting pad in some embodiments according to the present disclosure.

FIG. 8 illustrates the structure of a gate connecting pad in some embodiments according to the present disclosure. Referring to FIG. 7 and FIG. 8, the gate connecting pad GCP in some embodiments includes a first portion P1 and a second portion P2 connected to each other. Optionally, the first portion P1 and the respective first gate line GL1 extend along a direction substantially parallel to a first direction DR1. Optionally, the second portion P2 and the first node connecting line Cln1 extend along a direction substantially parallel to a second direction DR2.

Optionally, an orthographic projection of the first portion P1 on a base substrate at least partially overlaps with an orthographic projection of the respective first gate line GL1 on the base substrate; is substantially non-overlapping (e.g., at least 80% non-overlapping, at least 90% non-overlapping, at least 95% non-overlapping, at least 99% non-overlapping, or completely non-overlapping) with an orthographic projection of the second semiconductor material layer (e.g., a first electrode S2 of the second transistor T2) on the base substrate; and is substantially non-overlapping (e.g., at least 80% non-overlapping, at least 90% non-overlapping, at least 95% non-overlapping, at least 99% non-overlapping, or completely non-overlapping) with an orthographic projection of the first node connecting line Cln1 on the base substrate.

Optionally, an orthographic projection of the second portion P2 on a base substrate at least partially overlaps with an orthographic projection of the second semiconductor material layer (e.g., a first electrode $2 of the second transistor T2) on the base substrate; at least partially overlaps with an orthographic projection of the first node connecting line Cln1 on the base substrate; and is substantially non-overlapping (e.g., at least 80% non-overlapping, at least 90% non-overlapping, at least 95% non-overlapping, at least 99% non-overlapping, or completely non-overlapping) with an orthographic projection of the respective first gate line GL1 on the base substrate. Optionally, the first capacitance C1 is at least partially formed between the second portion P2 and the second semiconductor material layer (e.g., a structure comprising the first electrode S2 of the second transistor T2), and/or between the second portion P2 and the first node connecting line Cln1.

In some embodiments, a ratio of the first capacitance to the second capacitance is greater than 1.5, e.g., greater than 1.6, greater than 1.7, greater than 1.8, greater than 1.9, greater than 2.0, greater than 2.1, greater than 2.2, greater than 2.3, greater than 2.4, greater than 2.5, greater than 2.6, greater than 2.7, greater than 2.8, greater than 2.9, greater than 3.0, greater than 3.1, greater than 3.2, greater than 3.3, greater than 3.4, greater than 3.5, greater than 3.6, greater than 3.7, greater than 3.8, greater than 3.9, or greater than 4.0. In one example, the ratio of the first capacitance to the second capacitance is greater than 2.3. In another example, the ratio of the first capacitance to the second capacitance is between 2.3 to 3.5. The inventors of the present disclosure discover that a higher ratio of C1 to C2 is conducive to achieving an increased dark state margin.

In the array substrate depicted in FIG. 3A to FIG. 3L, the plurality of first gate lines (configured to provide gate scanning signals to the data write transistors), the plurality of first reset control signal lines, and the plurality of second reset control signal lines are in the first signal line layer. In one example, first signal line layer includes a stacked titanium/aluminum/titanium multi-layer structure that has a lower resistance. By having the plurality of first gate lines, the plurality of first reset control signal lines, and the plurality of second reset control signal lines in the first signal line layer, loading in these signal lines can be effectively reduced. In the array substrate depicted in FIG. 3A to FIG. 3L, the plurality of light emitting control signal lines are in the first gate metal layer. In the array substrate depicted in FIG. 3A to FIG. 3L, the respective second gate line includes a respective second gate line first branch GL2-1 in the second gate metal layer and a respective second gate line second branch GL2-2 in the third gate metal layer. By having a double branch second gate line, the resistance of the respective second gate line can be reduced.

Figure 9A:
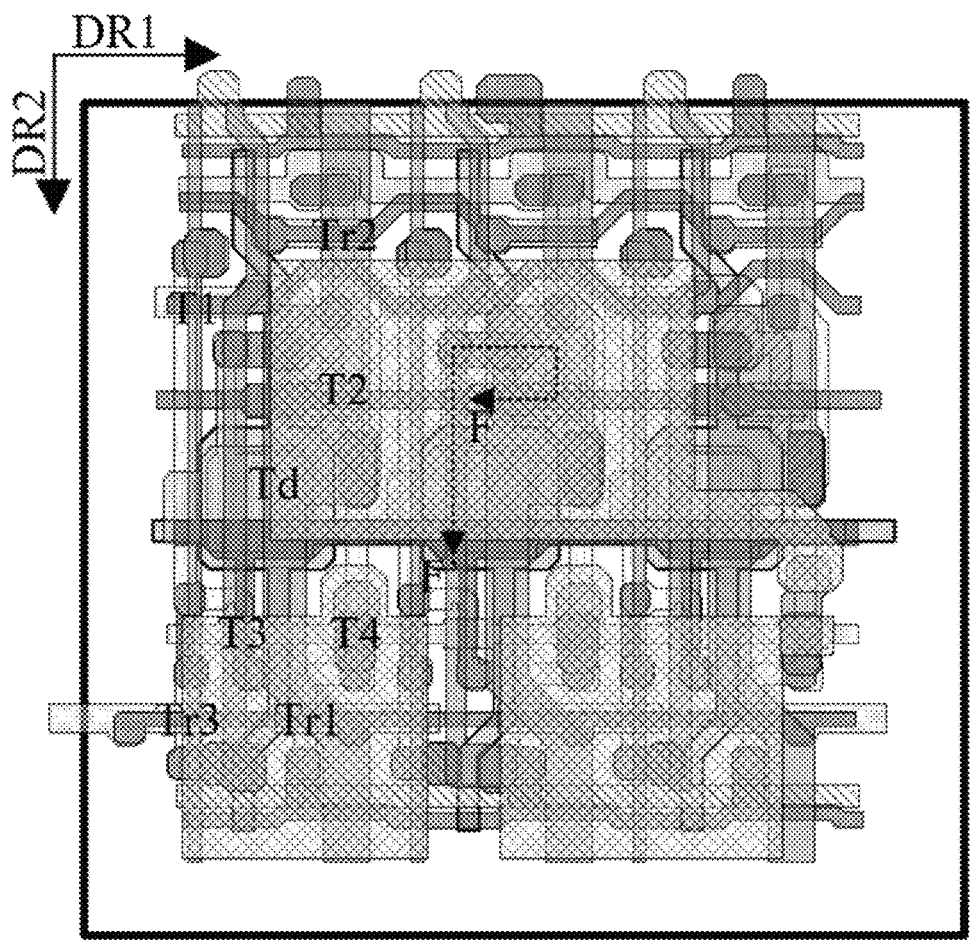
FIG. 9A is a diagram illustrating the structure of pixel driving circuits in an array substrate in some embodiments according to the present disclosure.
Figure 9B:
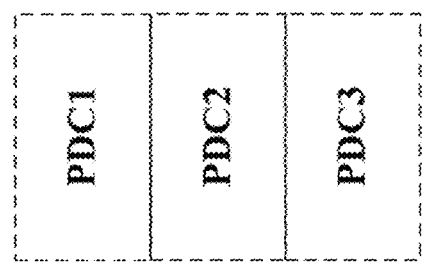
FIG. 9B is a schematic diagram illustrating an arrangement of pixel driving circuits in the array substrate depicted in FIG. 9A.

FIG. 9A is a diagram illustrating the structure of pixel driving circuits in an array substrate in some embodiments according to the present disclosure. FIG. 9B is a schematic diagram illustrating an arrangement of pixel driving circuits in the array substrate depicted in FIG. 9A. FIG. 9A and FIG. 9B depicts a portion of the array substrate having three adjacent pixel driving circuits, including PDC1, PDC2, and PDC3. FIG. 9L is a diagram illustrating the structure of pixel driving circuits in an array substrate depicted in FIG. 9A except for the anode layer.

Figure 9C:
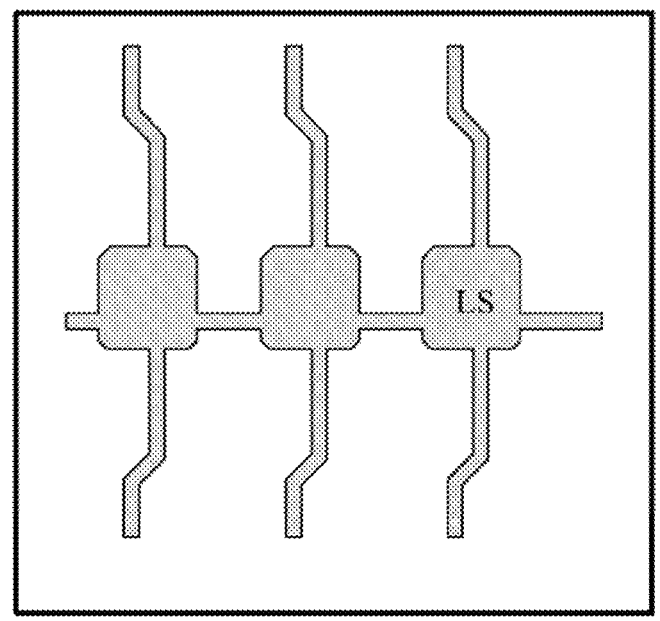
FIG. 9C is a diagram illustrating the structure of a light shielding layer in the array substrate depicted in FIG. 9A.
Figure 9D:
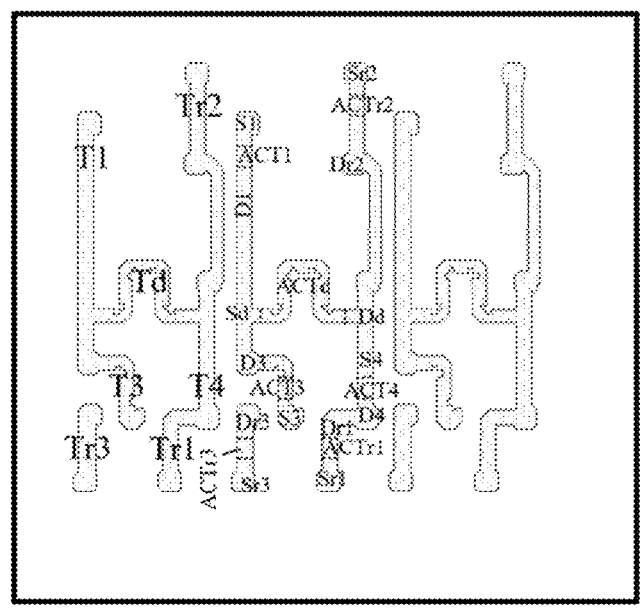
FIG. 9D is a diagram illustrating the structure of a first semiconductor material layer in the array substrate depicted in FIG. 9A.
Figure 9E:
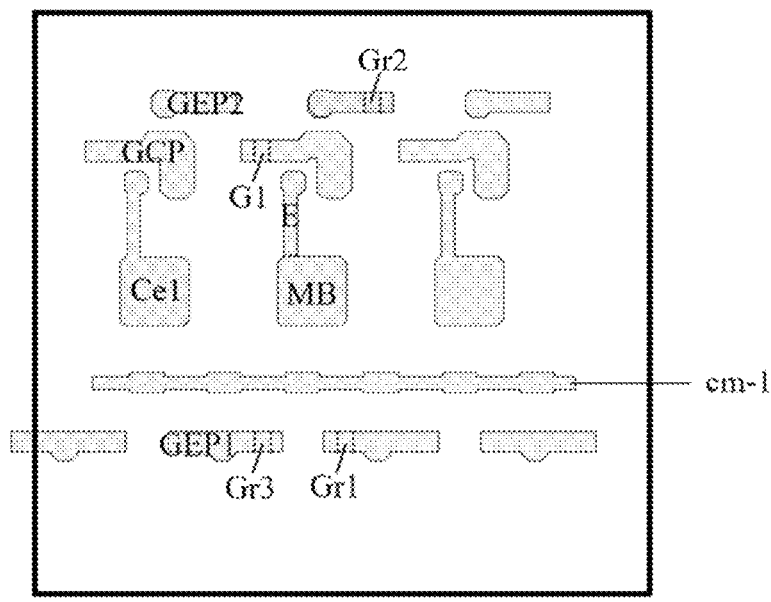
FIG. 9E is a diagram illustrating the structure of a first gate metal layer in the array substrate depicted in FIG. 9A.
Figure 9F:
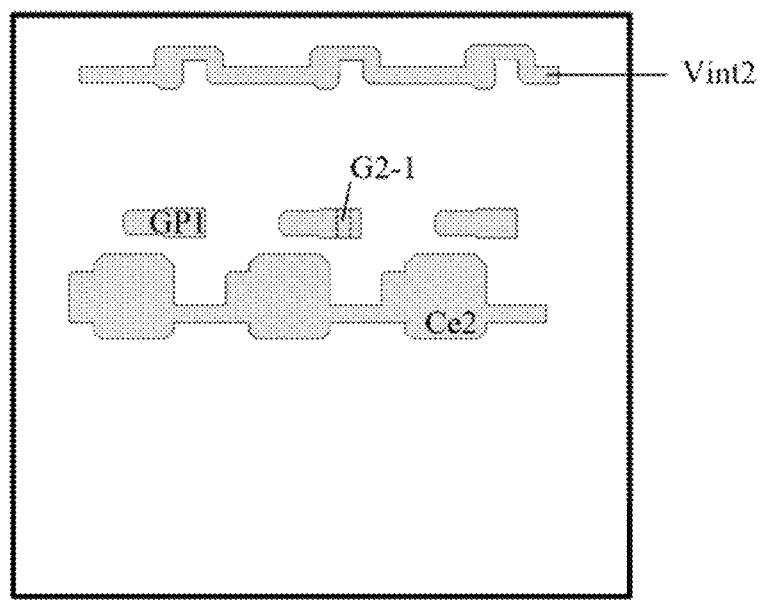
FIG. 9F is a diagram illustrating the structure of a second gate metal layer in the array substrate depicted in FIG. 9A.
Figure 9H:
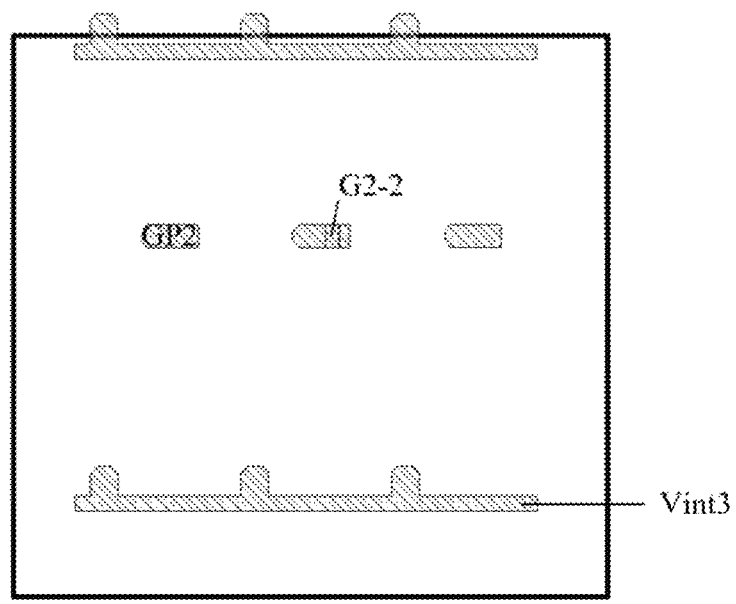
FIG. 9H is a diagram illustrating the structure of a third gate metal layer in the array substrate depicted in FIG. 9A.
Figure 9I:
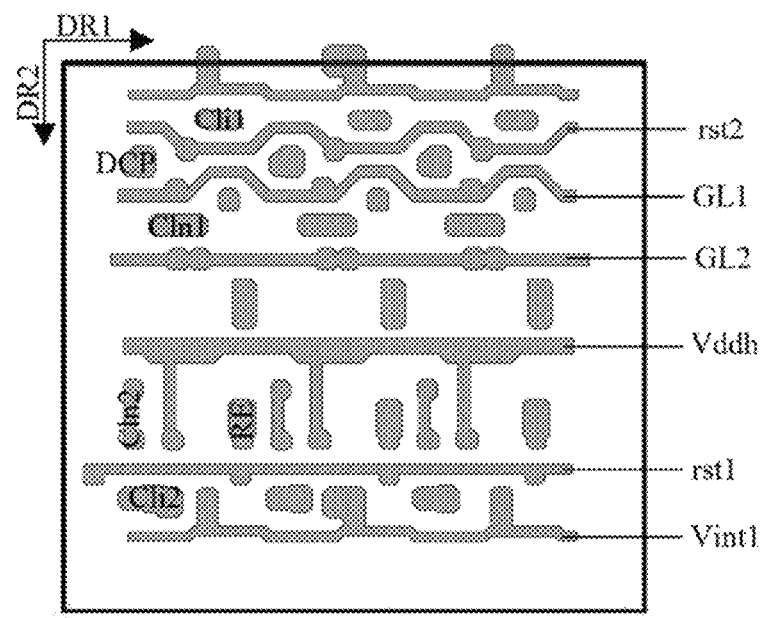
FIG. 9I is a diagram illustrating the structure of a first signal line layer in the array substrate depicted in FIG. 9A.
Figure 9J:
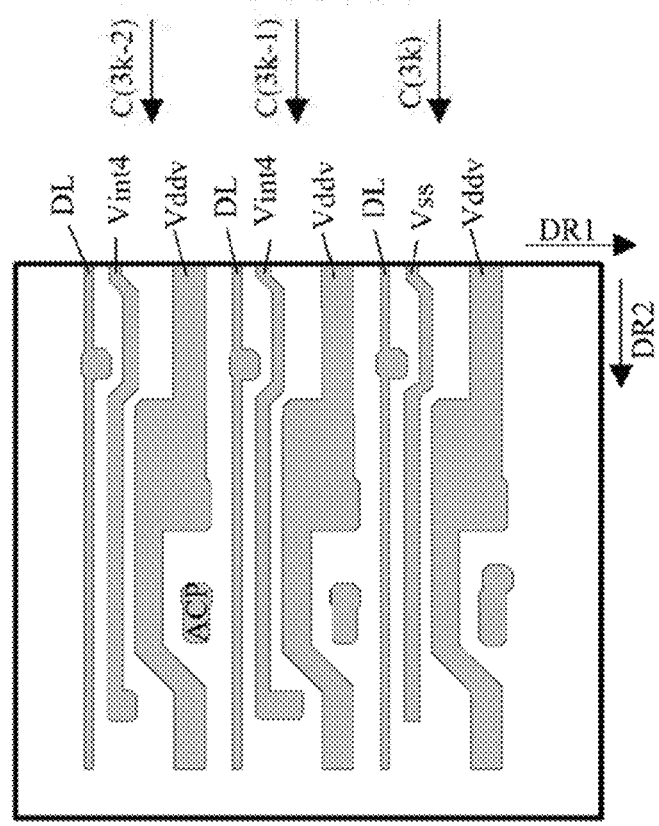
FIG. 9J is a diagram illustrating the structure of a second signal line layer in the array substrate depicted in FIG. 9A.
Figure 9K:
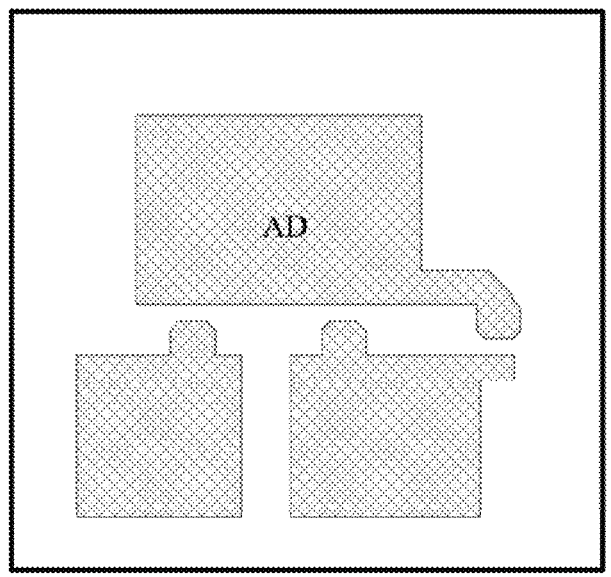
FIG. 9K is a diagram illustrating the structure of an anode layer in the array substrate depicted in FIG. 9A.
Figure 10:
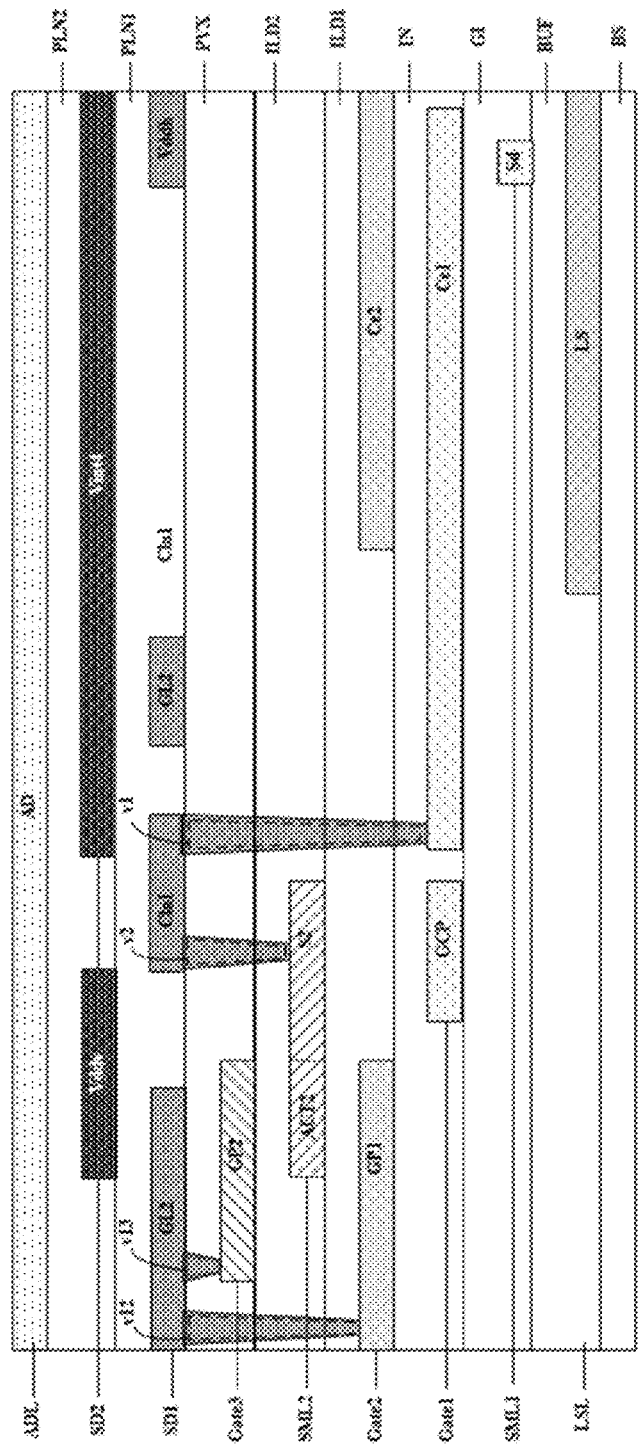
FIG. 10 is a cross-sectional view along an F-F' line in FIG. 9A.

FIG. 9C is a diagram illustrating the structure of a light shielding layer in the array substrate depicted in FIG. 9A. FIG. 9D is a diagram illustrating the structure of a first semiconductor material layer in the array substrate depicted in FIG. 9A. FIG. 9E is a diagram illustrating the structure of a first gate metal layer in the array substrate depicted in FIG. 9A. FIG. 9F is a diagram illustrating the structure of a second gate metal layer in the array substrate depicted in FIG. 9A. FIG. 9O is a diagram illustrating the structure of a second semiconductor material layer in the array substrate depicted in FIG. 9A. FIG. 9H is a diagram illustrating the structure of a third gate metal layer in the array substrate depicted in FIG. 9A. FIG. 9I is a diagram illustrating the structure of a first signal line layer in the array substrate depicted in FIG. 9A. FIG. 9J is a diagram illustrating the structure of a second signal line layer in the array substrate depicted in FIG. 9A. FIG. 9K is a diagram illustrating the structure of an anode layer in the array substrate depicted in FIG. 9A. FIG. 10 is a cross-sectional view along an F-F' line in FIG. 9A.

Referring to FIG. 9A to FIG. 9L, and FIG. 10, the array substrate in some embodiments includes a base substrate BS, a light shield layer LSL on the base substrate BS, a buffer layer BUF on a side of the light shield layer LSL away from the base substrate BS, a first semiconductor material layer SML1 on a side of the buffer layer BUF away from the base substrate BS, a gate insulating layer G1 on a side of the first semiconductor material layer SML1 away from the base substrate BS, a first gate metal layer Gate1 on a side of the gate insulating layer G1 away from the first semiconductor material layer SML1, an insulating layer IN on a side of the first gate metal layer Gate1 away from the gate insulating layer G1, a second gate metal layer Gate2 on a side of the insulating layer IN away from the first gate metal layer Gate1, a first inter-layer dielectric layer ILD1 on a side of the second gate metal layer Gate2 away from the insulating layer IN, a second semiconductor material layer SML2 on a side of the first inter-layer dielectric layer ILD1 away from the second gate metal layer Gate2, a second inter-layer dielectric layer ILD2 on a side of the second semiconductor material layer SML2 away from the first inter-layer dielectric layer ILD1, a third gate metal layer Gate3 on a side of the second inter-layer dielectric layer ILD2 away from the second semiconductor material layer SML2, a passivation layer PVX on a side of the third gate metal layer Gate3 away from the second inter-layer dielectric layer ILD2, a first signal line layer SD1 on a side of the passivation layer PVX away from the third gate metal layer Gate3, a first planarization layer PLN1 on a side of the first signal line layer SD1 away from the passivation layer PVX, a second signal line layer SD2 on a side of the first planarization layer PLN1 away from the first signal line layer SD1, a second planarization layer PLN2 on a side of the second signal line layer SD2 away from the first planarization layer PLN1, and an anode layer ADL on a side of the second planarization layer PLN2 away from the second signal line layer SD2.

Referring to FIG. 2A, FIG. 9A to FIG. 9L, and FIG. 10, in some embodiments, the light shield layer LSL includes a light shield LS. Various appropriate materials and various appropriate fabricating methods may be used for making the light shield layer LSL. For example, a metallic material may be deposited on the substrate by a plasma-enhanced chemical vapor deposition (PECVD) process. Examples of appropriate metallic materials for making the light shield layer LSL include, but are not limited to, aluminum, chromium, tungsten, titanium, tantalum, molybdenum, copper, and alloys or laminates containing the same.

In some embodiments, an orthographic projection of the light shield LS on a base substrate BS substantially covers (e.g., covers at least 80%, covers at least 85%, covers at least 90%, covers at least 95%, covers at least 99%, or completely covers) an orthographic projection of an active layer of a driving transistor of the pixel driving circuit on the base substrate BS.

In some embodiments, the light shield LS is configured to be provided with a first reference signal. Optionally, the light shield LS is electrically connected to a voltage supply line. In one example, the light shield LS is electrically connected to a voltage supply line in a peripheral area of the array substrate.

Referring to FIG. 2A, FIG. 9A, FIG. 9D, FIG. 10, the first semiconductor material layer SML1 in some embodiments includes at least active layers of multiple transistors of the pixel driving circuit, including the first transistor T1, the third transistor T3, the fourth transistor T4, the first reset transistor Tr1, the second reset transistor Tr2, the third reset transistor Tr3, and the driving transistor Td. Optionally, the first semiconductor material layer SML1 further includes at least respective portions of first electrodes of multiple transistors of the pixel driving circuit, including the first transistor T1, the third transistor T3, the fourth transistor T4, the first reset transistor Tr1, the second reset transistor Tr2, the third reset transistor Tr3, and the driving transistor Td. Optionally, the first semiconductor material layer SML1 further includes at least respective portions of second electrodes of multiple transistors of the pixel driving circuit, including the first transistor T1, the third transistor T3, the fourth transistor T4, the first reset transistor Tr1, the second reset transistor Tr2, the third reset transistor Tr3, and the driving transistor Td. Optionally, the first semiconductor material layer SML1 includes active layers, first electrodes, and second electrodes of multiple transistors of the pixel driving circuit, including the first transistor T1, the third transistor T3, the fourth transistor T4, the first reset transistor Tr1, the second reset transistor Tr2, the third reset transistor Tr3, and the driving transistor Td. Various appropriate semiconductor materials may be used for making the first semiconductor material layer SML1. Examples of the semiconductor materials for making the first semiconductor material layer SML1 include silicon-based semiconductor materials such as polycrystalline silicon, single-crystal silicon, and amorphous silicon.

In FIG. 9D, a pixel driving circuit corresponding to PDC1 in FIG. 3B is annotated with labels indicating components of each of multiple transistors (T1, T3, T4, Tr1. Tr2, Tr3, and Td) in the pixel driving circuit. For example, the first transistor T1 includes an active layer ACT1, a first electrode S1, and a second electrode D1. The third transistor T3 includes an active layer ACT3, a first electrode S3, and a second electrode D3. The fourth transistor T4 includes an active layer ACT4, a first electrode S4, and a second electrode D4. The first reset transistor Tr1 includes an active layer ACTr1, a first electrode Sr1, and a second electrode Dr1. The second reset transistor Tr2 includes an active layer ACTr2, a first electrode Sr2, and a second electrode Dr2. The third reset transistor Tr3 includes an active layer ACTr3, a first electrode Sr3, and a second electrode Dr3. The driving transistor Td includes an active layer ACTd, a first electrode Sd, and a second electrode Dd.

Optionally, the active layers (ACT1, ACT3, ACT4, ACTr1, ACTr2, ACTr3, and ACTd), the first electrodes (S1, S3, S4, Sr1, Sr2, Sr3, and Sd), and the second electrodes (D1, D3, D4, Dr1, Dr2, Dr3, and Dd) of the respective transistors (T1, T3, T4, Tr1, Tr2, Tr3, and Td) are in a same layer.

In some embodiments, the active layers (ACT1, ACT3, ACT4, ACTr1, ACTr2, and ACTd), at least portions of the first electrodes (S1, S3, S4, Sr1, Sr2, and Sd), and at least portions of the second electrodes (D1, D3, D4, Dr1, Dr2, and Dd) of multiple transistors (T1, T3, T4, Tr1, Tr2, and Td) in the pixel driving circuit are parts of a unitary structure. Optionally, a part of the third reset transistor Tr3 (ACTr3, Sr3, Dr3) in the first semiconductor material layer is spaced apart from the unitary structure (T1, T3, T4, Tr1, Tr2, and Td) in a same pixel driving circuit.

Referring to FIG. 2A, FIG. 9A, FIG. 9E, and FIG. 10, the first gate metal layer Gate1 in some embodiments includes a plurality of light emitting control signal lines (e.g., a respective light emitting control signal line em), a gate connecting pad GCP, a first gate electrode pad GEP1, a second gate electrode pad GEP2, and a first capacitor electrode Ce1 of the storage capacitor Cst in the pixel driving circuit.

In some embodiments, the gate connecting pad GCP includes a gate electrode G1 of the first transistor T1 in the pixel driving circuit. The gate connecting pad GCP is connected to a respective first gate line GL1 of a plurality of first gate lines. In one example, the respective first gate line OLI is connected to the gate connecting pad GCP through an eighth via v8. Optionally, the eighth via v8 extends through the passivation layer PVX, the second inter-layer dielectric layer ILD2, the first inter-layer dielectric layer ILD1, and the insulating layer IN.

In some embodiments, the first gate electrode pad GEP1 includes a gate electrode Gr1 of the first reset transistor Tr1 in the pixel driving circuit, and a gate electrode Gr3 of the third reset transistor Tr3 in an adjacent pixel driving circuit in a same row and in a next adjacent column (or a gate electrode Gr3 of the third reset transistor Tr3 in the pixel driving circuit, and a gate electrode Gr1 of the first reset transistor Tr1 in an adjacent pixel driving circuit in a same row and in a previous adjacent column. The first gate electrode pad GEP1 is connected to the respective first reset control signal line rst1 of the plurality of first reset control signal lines. In one example, the respective first reset control signal line rst1 is connected to the first gate electrode pad GEP1 through a via extending through the passivation layer PVX, the second inter-layer dielectric layer ILD2, the first inter-layer dielectric layer ILD1, and the insulating layer IN.

In some embodiments, the second gate electrode pad GEP2 includes a gate electrode Gr2 of the second reset transistor Tr2 in the pixel driving circuit. The second gate electrode pad GEP2 is connected to the respective second reset control signal line rst2 of the plurality of second reset control signal lines. In one example, the respective second reset control signal line rst2 is connected to the second gate electrode pad GEP2 through a via extending through the passivation layer PVX, the second inter-layer dielectric layer ILD2, the first inter-layer dielectric layer ILD1, and the insulating layer IN.

In some embodiments, the first capacitor electrode Ce1 includes a main body MB and an extension E extending away from the main body MB, e.g., along a direction substantially parallel to the second direction DR2. Optionally, an orthographic projection of the second capacitor electrode on a base substrate BS substantially (e.g., at least 80%, at least 85%, at least 90%, at least 95%, at least 98%, at least 99%, or 100%) covers, with a margin, an orthographic projection of the first capacitor electrode Ce1 on the base substrate. In one example, the orthographic projection of the second capacitor electrode on a base substrate BS completely covers the orthographic projection of the first capacitor electrode Ce1 on the base substrate. Optionally, an orthographic projection of the extension E on a base substrate is at least partially non-overlapping with the orthographic projection of the second capacitor electrode on the base substrate BS. Optionally, the extension E crosses over a respective second gate line GL2 of the plurality of second gate lines. Optionally, the orthographic projection of the extension E on the base substrate at least partially overlaps with an orthographic projection of the respective second gate line GL2 on the base substrate BS.

In the array substrate depicted in FIG. 9A to FIG. 9L, the plurality of second gate lines are disposed in the first signal line layer SD1. To make space for the respective second gate line, the first node connecting line Cln1 is shortened, and the first capacitor electrode Ce1 includes the extension E crossing over the respective second gate line GL2 to connect with the first node connecting line Cln1.

Referring to FIG. 2A, FIG. 9A, FIG. 9F, and FIG. 10, the second gate metal layer Gate2 in some embodiments includes a plurality of second reset signal lines (e.g., a respective second reset signal Vint2), a first gate pad GP1, and a second capacitor electrode Ce2 of the storage capacitor Cst in the pixel driving circuit. As compared to the array substrate depicted in FIG. 3A to FIG. 3L, the second gate metal layer in the array substrate depicted in FIG. 9A to FIG. 9L does not include the plurality of second gate lines or branches thereof. Instead, the second gate metal layer in the array substrate depicted in FIG. 9A to FIG. 9L includes a first gate pad GP1. In some embodiments, the first gate pad GP1 includes at least a portion of a gate electrode of the second transistor T2, for example, a first gate electrode portion G2-1 of the gate electrode of the second transistor T2. In one example, the second transistor T2 is a double-gate transistor.

Referring to FIG. 9F, a plurality of second capacitor electrodes in a plurality of pixel driving circuits are connected to each other, and are parts of a unitary structure. By having second capacitor electrodes connected to each other, a resistance of a respective first voltage supply line Vddh can be reduced because the second capacitor electrodes are electrically connected to the respective first voltage supply line Vddh. The inventors of the present disclosure discover that this structure improves display uniformity in the array substrate.

In alternative embodiments, the plurality of second capacitor electrodes in the plurality of pixel driving circuits are spaced apart from each other. By having second capacitor electrodes spaced apart from each other, parasitic capacitance between the plurality of second capacitor electrodes and the second electrode Dd of the driving transistor Td (e.g., the node N3) can be reduced, preventing occurrence of short-term residual image when the array substrate is in a display mode.

Referring to FIG. 2A, FIG. 9A, FIG. 9G, and FIG. 10, the second semiconductor material layer SML2 in some embodiments includes at least an active layer ACT2 of the second transistor T2 in the pixel driving circuit. Optionally, the second semiconductor material layer SML2 further includes at least a portion of a first electrode S2 of the second transistor T2 in the pixel driving circuit. Optionally, the second semiconductor material layer SML2 further includes at least a portion of a second electrode D2 of the second transistor T2 in the pixel driving circuit. Optionally, the second semiconductor material layer SML2 includes the active layer ACT2, the first electrode S2, and the second electrode D2 of the second transistor T2. In the present array substrate, at least the active layer ACT2 of the second transistor T2 are in a layer different from at least the active layers of other transistors of the pixel driving circuit. Various appropriate semiconductor materials may be used for making the second semiconductor material layer SML2. Examples of the semiconductor materials for making the second semiconductor material layer SML2 include metal oxide-based semiconductor material such as indium gallium zinc oxide and metal oxynitride-based semiconductor materials such as zinc oxynitride.

Figure 9G:
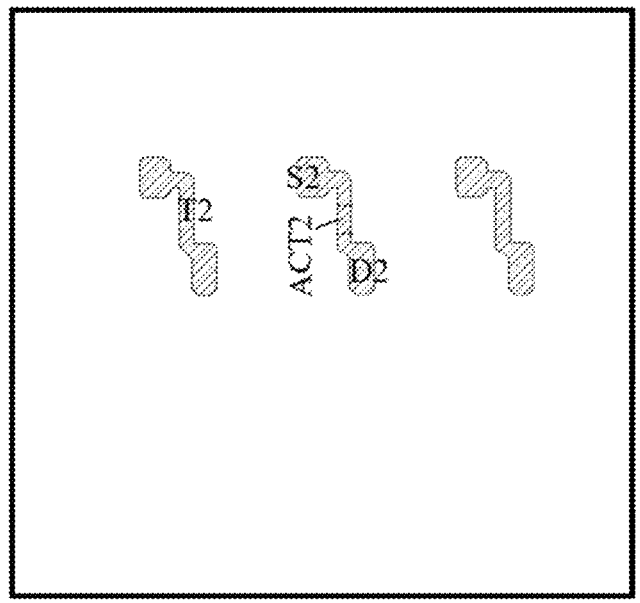
FIG. 9G is a diagram illustrating the structure of a second semiconductor material layer in the array substrate depicted in FIG. 9A.
Figure 9L:
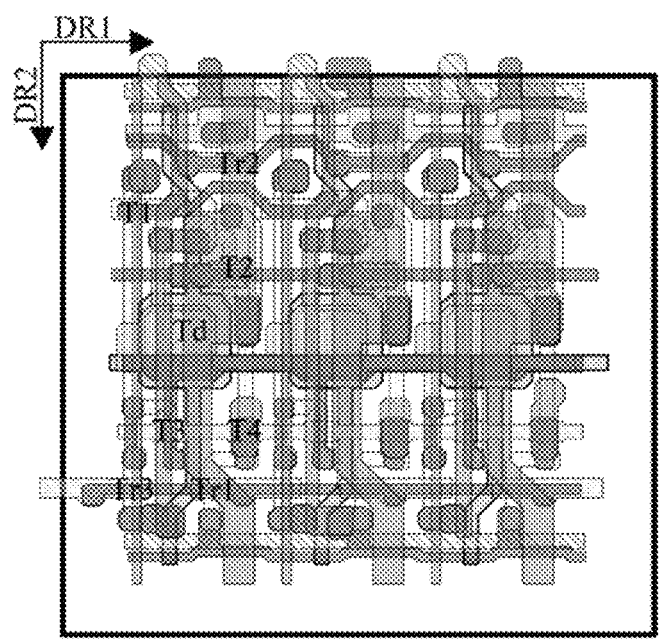
FIG. 9L is a diagram illustrating the structure of pixel driving circuits in an array substrate depicted in FIG. 9A except for the anode layer.

In FIG. 9G, a pixel driving circuit corresponding to PDC1 in FIG. 9B is annotated with labels indicating components of the second transistor in the pixel driving circuit. For example, the second transistor T2 includes an active layer ACT2, a first electrode S2, and a second electrode D2. Optionally, the active layer ACT2, the first electrode S2, and the second electrode D2 of the second transistor T2 are in a same layer.

Referring to FIG. 2A, FIG. 9A, FIG. 9H, and FIG. 10, the third gate metal layer Gate3 in some embodiments includes a second gate pad GP2 and a plurality of third reset signal lines (e.g., a respective third reset signal line Vint3). As compared to the array substrate depicted in FIG. 3A to FIG. 3L, the third gate metal layer in the array substrate depicted in FIG. 9A to FIG. 9L does not include the plurality of second gate lines or branches thereof. Instead, the third gate metal layer in the array substrate depicted in FIG. 9A to FIG. 9L includes a second gate pad GP2. In some embodiments, the second gate pad GP2 includes at least a portion of a gate electrode of the second transistor T2, for example, a second gate electrode portion G2-2 of the gate electrode of the second transistor T2. In one example, the second transistor T2 is a double-gate transistor.

Referring to FIG. 2A, FIG. 9A, FIG. 9I, and FIG. 10, the first signal line layer SD1 in some embodiments includes a plurality of first reset signal lines (e.g., a respective first reset signal line Vint1); a plurality of first voltage supply lines (e.g., a respective first voltage supply line Vddh); a plurality of first gate lines (e.g., a respective first gate line GL1); a plurality of first reset control signal lines (e.g., a respective first reset control signal line rst1); a plurality of second reset control signal lines (e.g., a respective second reset control signal line rst2); a plurality of second gate lines (e.g., a respective second gate line GL2); a data connecting pad DCP; a first node connecting line Cln1; a second node connecting line Cln2; a relay electrode RE; a first reset signal connecting line Cli1; and a second reset signal connecting line Cli2.

The array substrate depicted in FIG. 9A to FIG. 9L differs from the array substrate depicted in FIG. 3A to FIG. 3L, at least in that the first signal line layer in the array substrate depicted in FIG. 9A to FIG. 9L includes the plurality of second gate lines. Referring to FIG. 9A to FIG. 9L, and FIG. 10, in some embodiments, the respective second gate line GL2 is connected to the first gate pad GP1 through a twelfth via v12, and is connected to the second gate pad GP2 through a thirteenth via v13. In one example, the respective second gate line GL2 is in the first signal line layer SD1, the first gate pad GP1 is in the second gate metal layer Gate2, and the second gate pad GP2 is in the third gate metal layer Gate3. In one example, the twelfth via v11 extends through the passivation layer PVX, the second inter-layer dielectric layer ILD2, and the first inter-layer dielectric layer ILD1. In another example, the thirteenth via v12 extends through the passivation layer PVX.

In some embodiments, the first node connecting line Cln1 connects multiple components of the pixel driving circuit to the node N1. Referring to FIG. 10, the first node connecting line Cln1 is connected to the first capacitor electrode Ce1 through a first via v1, and connected to the second transistor T2 (e.g., to the first electrode S2 of the second transistor T2) through a second via v2. Optionally, the first node connecting line Cln1 corresponds to the node N1 depicted in FIG. 2A. In one example, the first node connecting line Cln1 is connected to the extension E of the first capacitor electrode Ce1 through a first via v1. In one example, the first via v1 extends through the passivation layer PVX, the second inter-layer dielectric layer ILD2, the first inter-layer dielectric layer ILD1, and the insulating layer IN. In another example, the second via v2 extends through the passivation layer PVX and the second inter-layer dielectric layer ILD2.

In some embodiments, the second node connecting line Cln2 is connected to a second electrode D3 of the third transistor T3 through a via, and connected to a second electrode Dr3 of the third reset transistor Tr3 through a via. Optionally, the second node connecting line Cln2 corresponds to the node N2 depicted in FIG. 2A. Optionally, the second node connecting line Cln2 crosses over the respective light emitting control signal line em of the plurality of light emitting control signal lines.

The array substrate depicted in FIG. 9A to FIG. 9L differs from the array substrate depicted in FIG. 3A to FIG. 3L at least in that the first signal line layer in the array substrate depicted in FIG. 9A to FIG. 9L does not include a third node connecting line. Instead, the second electrode Dr2 of the second reset transistor Tr2 and the second electrode Dd of the driving transistor Td are parts of a unitary structure in the first semiconductor material layer. The second electrode Dr2 of the second reset transistor Tr2 and the second electrode Dd of the driving transistor Td are directly connected. The portion of the first semiconductor material layer connecting the second electrode Dr2 of the second reset transistor Tr2 and the second electrode Dd of the driving transistor Td crosses over a respective second gate line GL of the plurality of second gate lines.

In some embodiments, referring to FIG. 9F, FIG. 9I, and FIG. 9J, the respective first voltage supply line Vddh connects a respective second voltage supply line Vddv of a plurality of second voltage supply lines to the second capacitor electrode Ce2, and connects the respective second voltage supply line Vddv of the plurality of second voltage supply lines to the first electrode S3 of the third transistor T3. Optionally, the respective second voltage supply line Vddv of the plurality of second voltage supply lines is connected to the respective first voltage supply line Vddh through a via, the respective first voltage supply line Vddh of the plurality of first voltage supply lines is connected to the second capacitor electrode Ce2 through a via, the respective first voltage supply line Vddh of the plurality of first voltage supply lines is connected to the first electrode S3 of the third transistor T3 through a via, thereby supplying a first reference voltage signal to the respective first voltage supply line Vddh, and in turn to the second capacitor electrode Ce2 and to the first electrode S3 of the third transistor T3.

Referring to FIG. 9A, FIG. 9I, and FIG. 9J, in some embodiments, the respective first voltage supply line Vddh extends along a direction substantially parallel to the first direction DR1, and the respective second voltage supply line Vddv extends along a direction substantially parallel to the second direction DR2. Optionally, the plurality of first voltage supply lines and the plurality of second voltage supply lines form an interconnected voltage supply network. The first direction DR1 and the second direction DR2 are different from each other.

In some embodiments, referring to FIG. 9A to FIG. 9L, the first reset signal connecting line Cli1 connects a respective second reset signal line Vint2 of a plurality of second reset signal lines to the first electrode Sr2 of the second reset transistor Tr2. The first reset signal connecting line Cli1 is configured to transmit a reset signal from the respective second reset signal line Vint2 to the first electrode Sr2 of the second reset transistor Tr2.

In some embodiments, referring to FIG. 9A to FIG. 9L, the second reset signal connecting line Cli2 connects a respective third reset signal line Vint3 of a plurality of third reset signal lines, a first electrode Sr3 of the third reset transistor Tr3, and a respective fourth reset signal line Vint4 of a plurality of fourth reset signal lines together. The second reset signal connecting line Cli2 is connected to the first electrode Sr3 of the third reset transistor through a via, and connected to a respective third reset signal line Vint3 of a plurality of third reset signal lines through a via; the respective fourth reset signal line Vint4 of the plurality of fourth reset signal lines connected to the second reset signal connecting line Cli2 through a via, thereby transmitting a reset signal from the respective third reset signal line Vint3 and the respective fourth reset signal line Vint4 to the first electrode Sr3 of the third reset transistor.

In some embodiments, referring to FIG. 9A to FIG. 9L, the respective first reset signal line Vint1 of the plurality of first reset signal lines is connected to the first electrode Sr1 of the first reset transistor through a via.

In some embodiments, referring to FIG. 9A to FIG. 9L, the data connecting pad DCP connect a respective data line DL of the plurality of data lines to the first electrode S1 of the first transistor T1 through a via. The data connecting pad DCP is configured to transmit a data signal from the respective data line DL to the first electrode S1 of the first transistor.

Referring to FIG. 2A, FIG. 9A, FIG. 9J, and FIG. 10, the second signal line layer SD2 in some embodiments includes a plurality of second voltage supply lines (e.g., a respective second voltage supply line Vddv), an anode contact pad ACP, a plurality of data lines (e.g., a respective data line DL), a plurality of fourth reset signal lines (e.g., a respective fourth reset signal line Vint4), and a plurality of low voltage supply lines (e.g., a respective low voltage supply line Vss). In some embodiments, the respective first voltage supply line Vddh and the respective second voltage supply line Vddv are configured to provide a first reference voltage signal (e.g., a high reference voltage signal). Optionally, the respective low voltage supply line Vss is configured to provide a second reference voltage signal (e.g., a low reference voltage signal). Optionally, the first reference voltage signal is a constant voltage signal, the second reference voltage signal is a constant voltage signal, the first reference voltage signal has a voltage level higher than a voltage level of the second reference voltage signal.

Referring to FIG. 2A, FIG. 9A, FIG. 9K, and FIG. 10, the anode layer ADL in some embodiments includes a plurality of anodes (e.g., an anode AD denoted in FIG. 9K).

Figure 11:
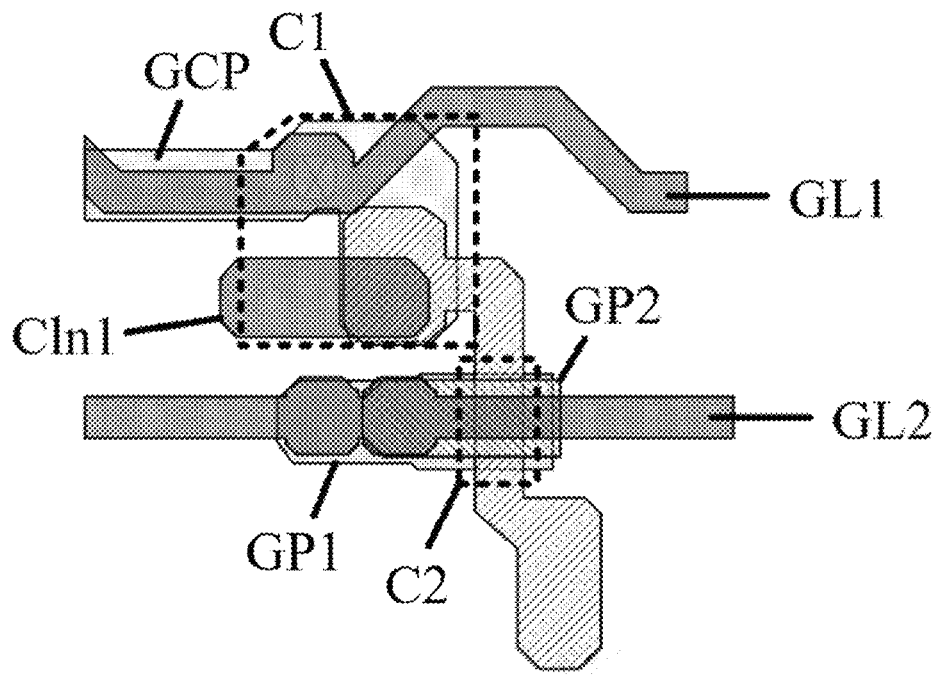
FIG. 11 illustrates a first capacitance and a second capacitance in a pixel driving circuit in an array substrate in some embodiments according to the present disclosure.

In some embodiments, there are two capacitances, C1 and C2, in a pixel driving circuit in an array substrate in some embodiments according to the present disclosure. FIG. 11 illustrates a first capacitance and a second capacitance in a pixel driving circuit in an array substrate in some embodiments according to the present disclosure. Referring to FIG. 11. FIG. 9A, FIG. 9E to FIG. 9I, in some embodiments, an orthographic projection of the gate connecting pad GCP on a base substrate at least partially overlaps with an orthographic projection of the second semiconductor material layer (e.g., a first electrode S2 of the second transistor T2) on the base substrate; and at least partially overlaps with an orthographic projection of the first node connecting line Cln1 on the base substrate. In some embodiments, the first capacitance C1 is at least partially formed between the gate connecting pad GCP and the second semiconductor material layer (e.g., a structure comprising the first electrode S2 of the second transistor T2), and/or between the gate connecting pad GCP and the first node connecting line Cln1. The second capacitance C2 is formed between the second semiconductor material layer (e.g., a structure comprising the first electrode S2 of the second transistor T2) and the respective second gate line GL2 in the first signal line layer, and/or between the second semiconductor material layer (e.g., a structure comprising the first electrode S2 of the second transistor T2) and the first gate pad GP1, and/or between the second semiconductor material layer (e.g., a structure comprising the first electrode S2 of the second transistor T2) and the second gate pad GP2.

As shown in FIG. 11, FIG. 9A, FIG. 9F to FIG. 9I, in some embodiments, an orthographic projection of the second semiconductor material layer on a base substrate is substantially non-overlapping (e.g., at least 80% non-overlapping, at least 90% non-overlapping, at least 95% non-overlapping, at least 99% non-overlapping, or completely non-overlapping) with an orthographic projection of the respective first gate line GL1 on the base substrate; and an orthographic projection of the first node connecting line Cln1 on the base substrate is substantially non-overlapping (e.g., at least 80% non-overlapping, at least 90% non-overlapping, at least 95% non-overlapping, at least 99% non-overlapping, or completely non-overlapping) with the orthographic projection of the respective first gate line GL1 on the base substrate. The inventors of the present disclosure discover that, by having the gate connecting pad GCP, the first capacitance C1 can be effectively increased, achieving a higher ratio of C1 to C2 and an increased dark state margin.

Figure 12:
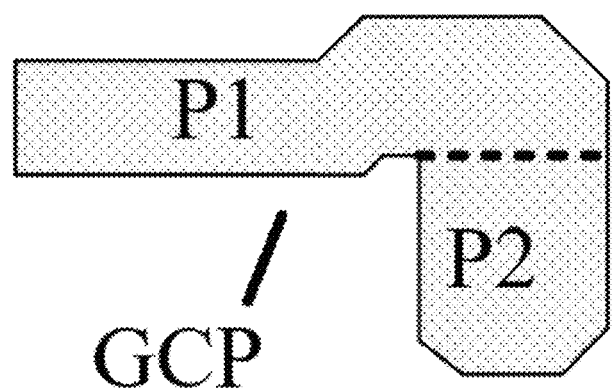
FIG. 12 illustrates the structure of a gate connecting pad in some embodiments according to the present disclosure.

FIG. 12 illustrates the structure of a gate connecting pad in some embodiments according to the present disclosure. Referring to FIG. 11 and FIG. 12, the gate connecting pad GCP in some embodiments includes a first portion P1 and a second portion P2 connected to each other. Optionally, the first portion P1 and the respective first gate line GL1 extend along a direction substantially parallel to a first direction DR1. Optionally, the second portion P2 and the first node connecting line Cln1 extend along a direction substantially parallel to a second direction DR2.

Optionally, an orthographic projection of the first portion P1 on a base substrate at least partially overlaps with an orthographic projection of the respective first gate line GL1 on the base substrate; is substantially non-overlapping (e.g., at least 80% non-overlapping, at least 90% non-overlapping, at least 95% non-overlapping, at least 99% non-overlapping, or completely non-overlapping) with an orthographic projection of the second semiconductor material layer (e.g., a first electrode S2 of the second transistor T2) on the base substrate; and is substantially non-overlapping (e.g., at least 80% non-overlapping, at least 90% non-overlapping, at least 95% non-overlapping, at least 99% non-overlapping, or completely non-overlapping) with an orthographic projection of the first node connecting line Cln1 on the base substrate.

Optionally, an orthographic projection of the second portion P2 on a base substrate at least partially overlaps with an orthographic projection of the second semiconductor material layer (e.g., a first electrode S2 of the second transistor T2) on the base substrate; at least partially overlaps with an orthographic projection of the first node connecting line Cln1 on the base substrate; and is substantially non-overlapping (e.g., at least 80% non-overlapping, at least 90% non-overlapping, at least 95% non-overlapping, at least 99% non-overlapping, or completely non-overlapping) with an orthographic projection of the respective first gate line GL1 on the base substrate. Optionally, the first capacitance C1 is at least partially formed between the second portion P2 and the second semiconductor material layer (e.g., a structure comprising the first electrode S2 of the second transistor T2), and/or between the second portion P2 and the first node connecting line Cln1.

In some embodiments, a ratio of the first capacitance to the second capacitance is greater than 2.0, e.g., greater than 2.1, greater than 2.2, greater than 2.3, greater than 2.4, greater than 2.5, greater than 2.6, greater than 2.7, greater than 2.8, greater than 2.9, greater than 3.0, greater than 3.1, greater than 3.2, greater than 3.3, greater than 3.4, greater than 3.5, greater than 3.6, greater than 3.7, greater than 3.8, greater than 3.9, or greater than 4.0. In one example, the ratio of the first capacitance to the second capacitance is greater than 2.3. In another example, the ratio of the first capacitance to the second capacitance is between 2.3 to 3.5. The inventors of the present disclosure discover that a higher ratio of C1 to C2 is conducive to achieving an increased dark state margin.

In the array substrate depicted in FIG. 9A to FIG. 9L, the plurality of first gate lines (configured to provide gate scanning signals to the data write transistors), the plurality of second gate lines (configured to provide gate scanning signals to the compensating transistor), the plurality of first reset control signal lines, and the plurality of second reset control signal lines are in the first signal line layer. In one example, first signal line layer includes a stacked titanium/aluminum/titanium multi-layer structure that has a lower resistance. By having the plurality of first gate lines, the plurality of second gate lines, the plurality of first reset control signal lines, and the plurality of second reset control signal lines in the first signal line layer, loading in these signal lines can be effectively reduced. In the array substrate depicted in FIG. 9A to FIG. 9L, the plurality of light emitting control signal lines are in the first gate metal layer.

Figure 13A:
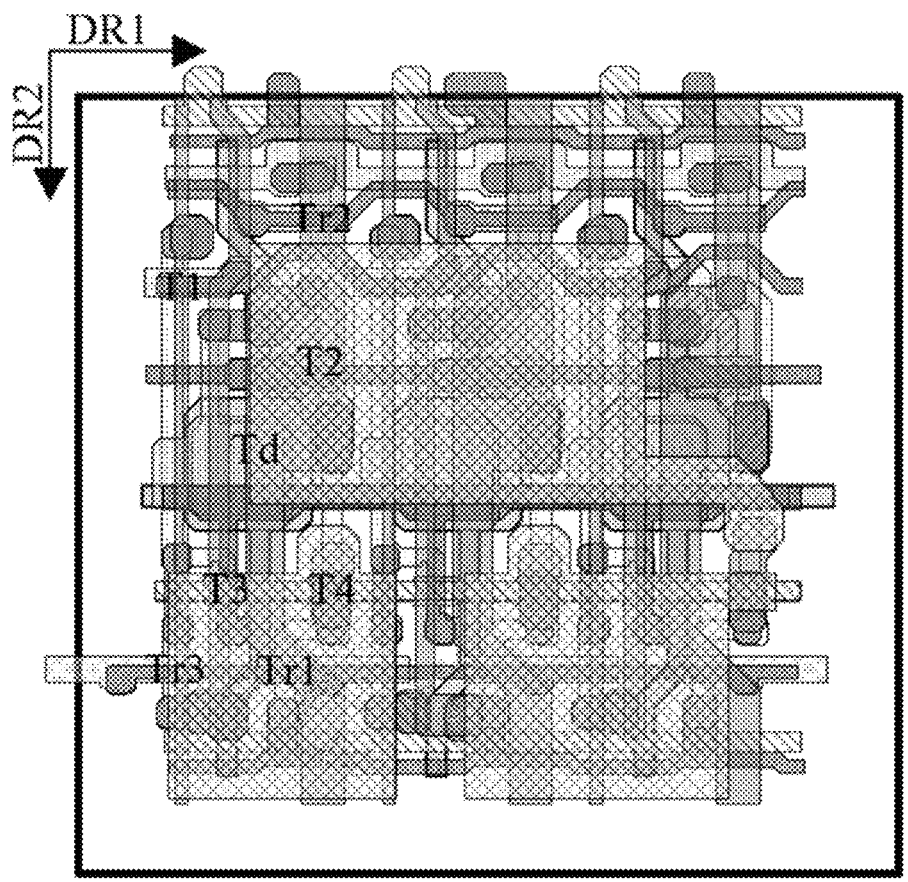
FIG. 13A is a diagram illustrating the structure of pixel driving circuits in an array substrate in some embodiments according to the present disclosure.
Figure 13B:
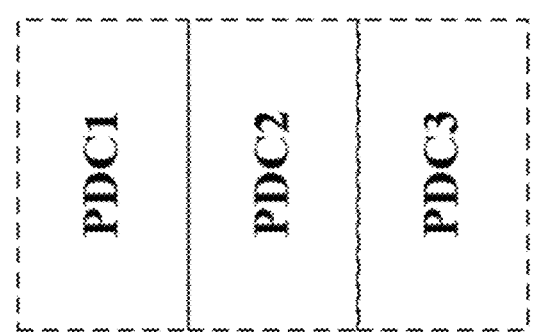
FIG. 13B is a schematic diagram illustrating an arrangement of pixel driving circuits in the array substrate depicted in FIG. 13A.
Figure 13C:
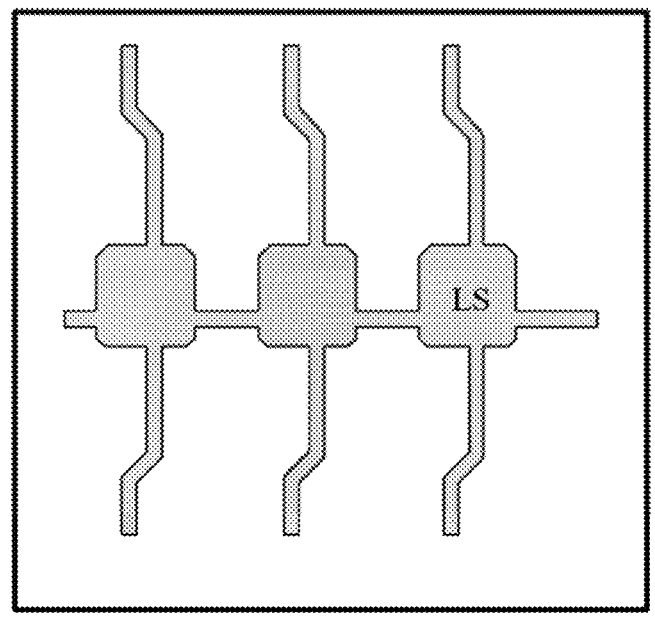
FIG. 13C is a diagram illustrating the structure of a light shielding layer in the array substrate depicted in FIG. 13A.
Figure 13D:
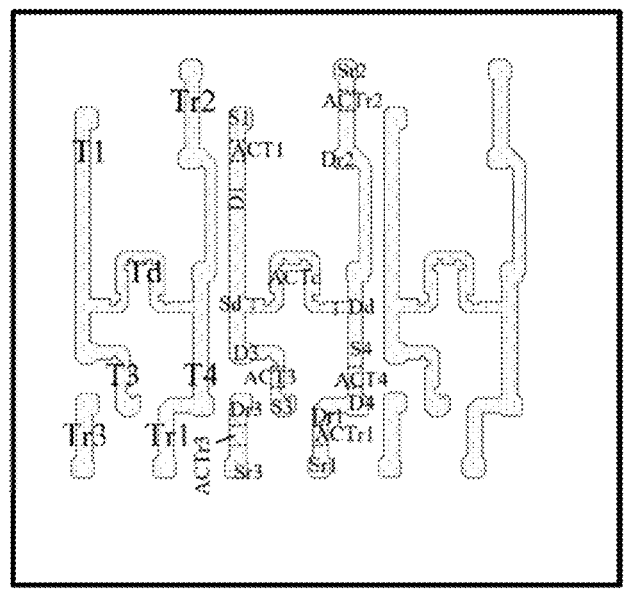
FIG. 13D is a diagram illustrating the structure of a first semiconductor material layer in the array substrate depicted in FIG. 13A.
Figure 13E:
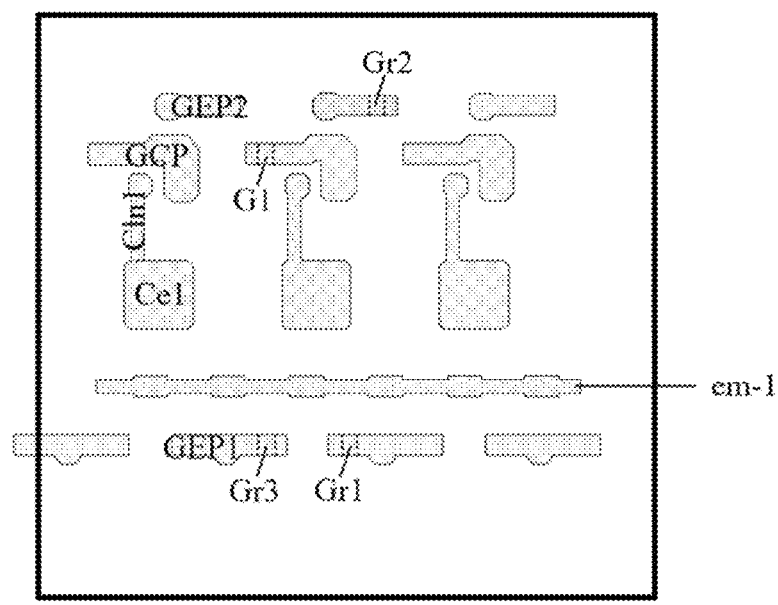
FIG. 13E is a diagram illustrating the structure of a first gate metal layer in the array substrate depicted in FIG. 13A.
Figure 13F:
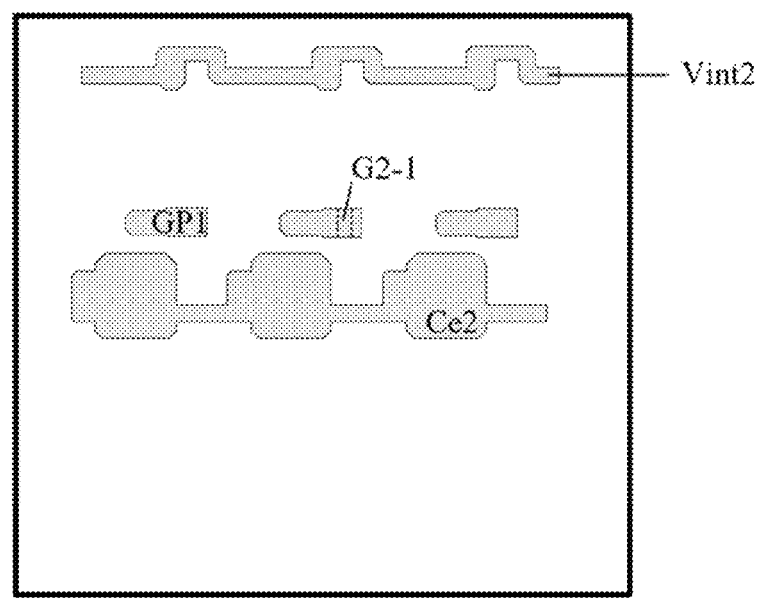
FIG. 13F is a diagram illustrating the structure of a second gate metal layer in the array substrate depicted in FIG. 13A.
Figure 13G:
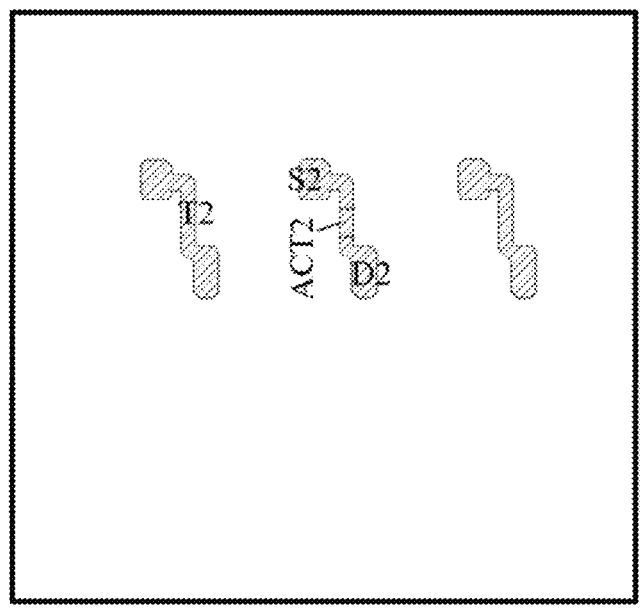
FIG. 13G is a diagram illustrating the structure of a second semiconductor material layer in the array substrate depicted in FIG. 13A.
Figure 13H:
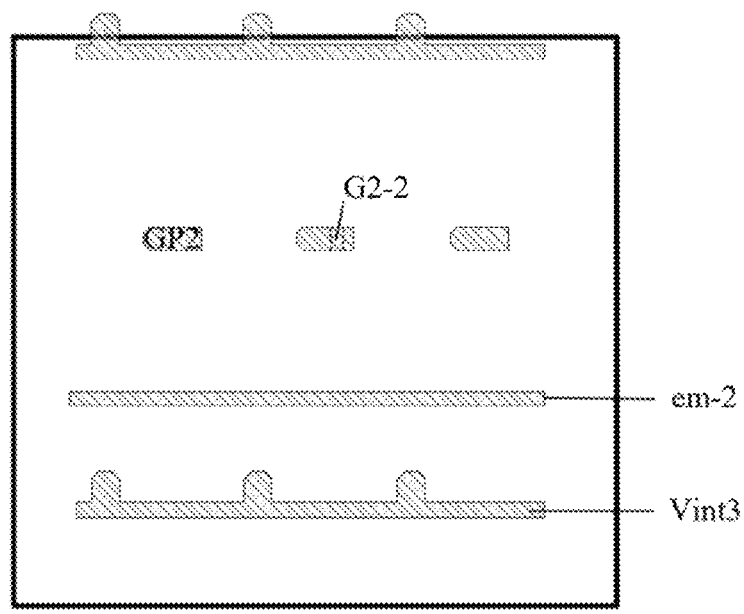
FIG. 13H is a diagram illustrating the structure of a third gate metal layer in the array substrate depicted in FIG. 13A.
Figure 13I:
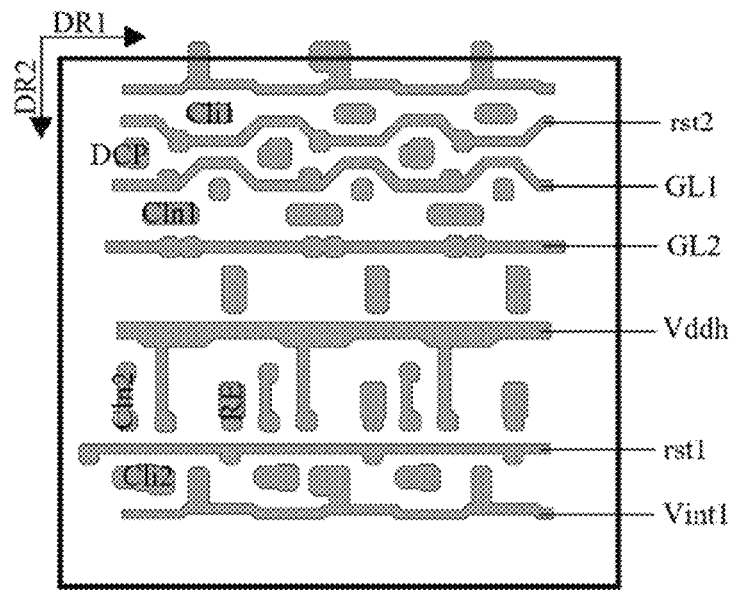
FIG. 13I is a diagram illustrating the structure of a first signal line layer in the array substrate depicted in FIG. 13A.
Figure 13J:
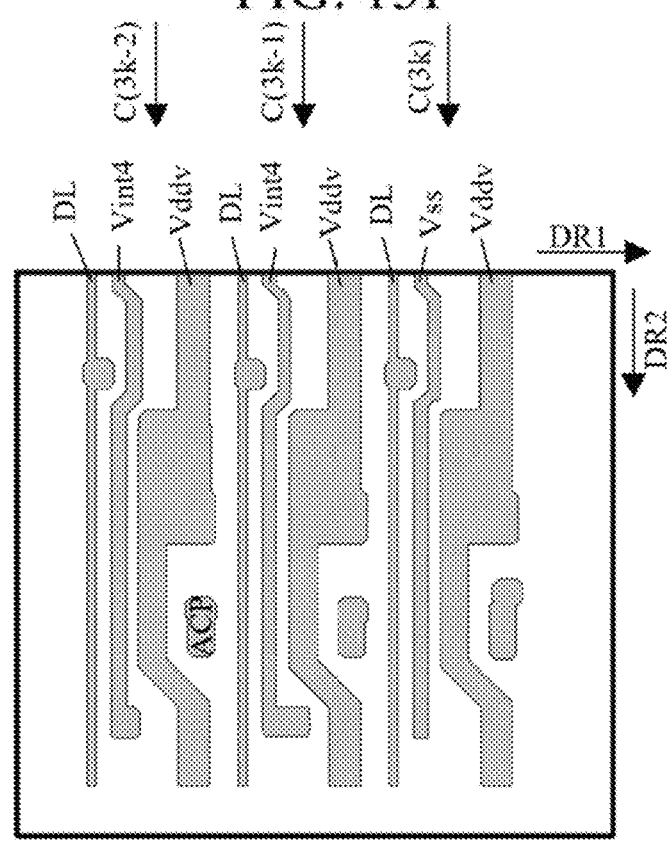
FIG. 13J is a diagram illustrating the structure of a second signal line layer in the array substrate depicted in FIG. 13A.
Figure 13K:
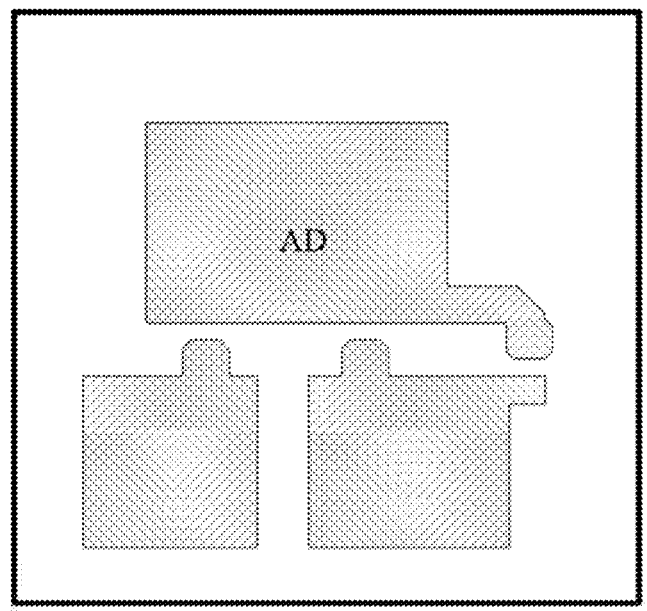
FIG. 13K is a diagram illustrating the structure of an anode layer in the array substrate depicted in FIG. 13A.
Figure 13L:
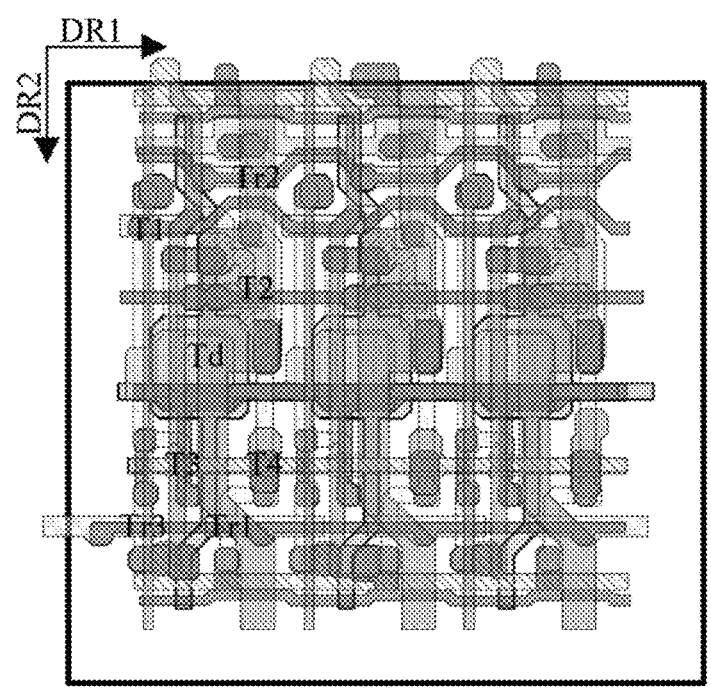
FIG. 13L is a diagram illustrating the structure of pixel driving circuits in an array substrate depicted in FIG. 13A except for the anode layer.

FIG. 13A is a diagram illustrating the structure of pixel driving circuits in an array substrate in some embodiments according to the present disclosure. FIG. 13B is a schematic diagram illustrating an arrangement of pixel driving circuits in the array substrate depicted in FIG. 13A. FIG. 13C is a diagram illustrating the structure of a light shielding layer in the array substrate depicted in FIG. 13A. FIG. 13D is a diagram illustrating the structure of a first semiconductor material layer in the array substrate depicted in FIG. 13A. FIG. 13E is a diagram illustrating the structure of a first gate metal layer in the array substrate depicted in FIG. 13A. FIG. 13F is a diagram illustrating the structure of a second gate metal layer in the array substrate depicted in FIG. 13A. FIG. 13G is a diagram illustrating the structure of a second semiconductor material layer in the array substrate depicted in FIG. 13A. FIG. 13H is a diagram illustrating the structure of a third gate metal layer in the array substrate depicted in FIG. 13A. FIG. 13I is a diagram illustrating the structure of a first signal line layer in the array substrate depicted in FIG. 13A. FIG. 13J is a diagram illustrating the structure of a second signal line layer in the array substrate depicted in FIG. 13A. FIG. 13K is a diagram illustrating the structure of an anode layer in the array substrate depicted in FIG. 13A. FIG. 13L is a diagram illustrating the structure of pixel driving circuits in an array substrate depicted in FIG. 13A except for the anode layer.

The array substrate depicted in FIG. 13A to FIG. 13L differs from the array substrates depicted in FIG. 3A to FIG. 3L, and FIG. 9A to FIG. 9L in that the respective light emitting control signal line in the array substrate depicted in FIG. 13A to FIG. 13L includes a respective light emitting control signal line first branch em–1 and a respective light emitting control signal line second branch em–2. In one example, the respective light emitting control signal line first branch em–1 is in the first gate metal layer Gate1. In another example, the respective light emitting control signal line second branch em–2 is in the third gate metal layer Gate3. By having a double branch light emitting control signal line, the resistance of the respective light emitting control signal line can be reduced.

In alternative embodiments, the plurality of light emitting control signal lines may be disposed in the first signal line layer.

The inventors of the present disclosure discover that, brightness differences occur when a related display apparatus is switching between different frequencies, particularly in a display apparatus. This results in brightness flickering, adversely affecting display quality. The inventors of the present disclosure discover that this is at least in part due to the difference between reset voltages for the second node N2 and the third node N3 in the refreshing frame and the maintaining frame, respectively. The inventors of the present disclosure discover that the pixel driving circuit according to the present disclosure, by having the third reset transistor Tr3 coupled to the second node, can maintain the reset voltages for the second node N2 and the third node N3 in the refreshing frame and the maintaining frame substantially the same, and can improve hysteresis.

The inventors of the present disclosure further discover that, in the related display apparatus, the driving current is relatively small in a low grayscale display frame, and the light emitting element is charged slowly, adversely affecting display quality. The inventors of the present disclosure discover that, surprisingly and unexpectedly, the intricate structure of the array substrate according to the present disclosure can effectively improve the display quality in the low grayscale display frame.

Referring to FIG. 3A to FIG. 3L, and FIG. 4E, in some embodiments, the relay electrode RE connects the anode contact pad ACP with a second electrode D4 of the fourth transistor T4 (and/or a second electrode Dr1 of the first reset transistor Tr1) together. Optionally, the anode contact pad ACP is connected to the relay electrode RE through a tenth via v10. Optionally, the relay electrode RE is connected to the second electrode D4 of the fourth transistor T4 (and/or the second electrode Dr1 of the first reset transistor Tr1) through an eleventh via v11. In one example, the tenth via v10 extends through the first planarization layer PLN1. In another example, the eleventh via v11 extends through the passivation layer PVX, the second inter-layer dielectric layer ILD2, the first inter-layer dielectric layer ILD1, the insulating layer IN, and the gate insulating layer G1.

Figure 14A:
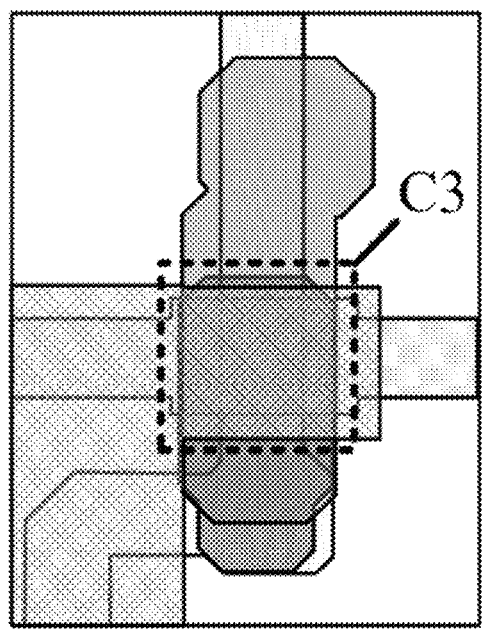
FIG. 14A is a zoom-in view of a region having an active layer of a fourth transistor in the array substrate depicted in FIG. 3A.
Figure 14B:
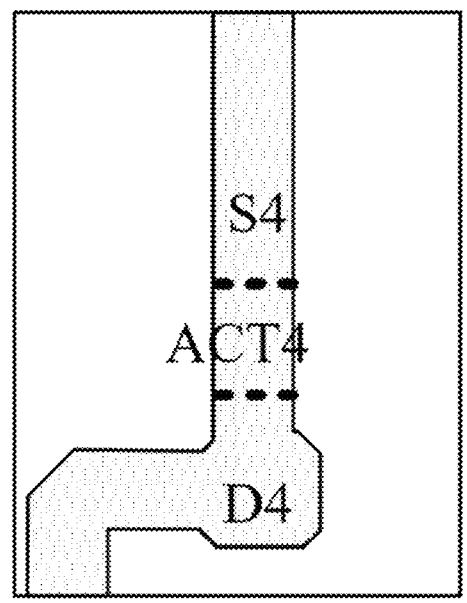
FIG. 14B illustrate the structure of a first semiconductor material layer in the region depicted in FIG. 14A.
Figure 14C:
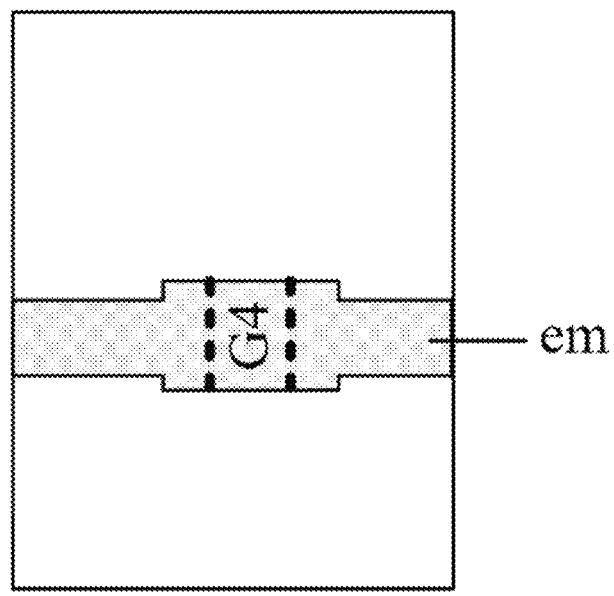
FIG. 14C illustrate the structure of a first gate metal layer in the region depicted in FIG. 14A.
Figure 14D:
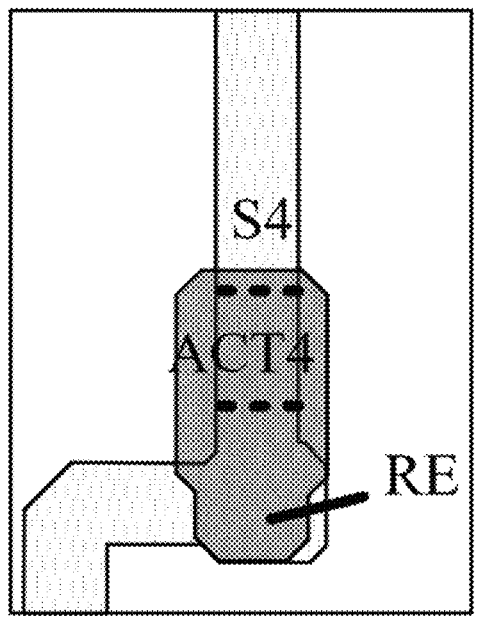
FIG. 14D illustrate the structure of a first semiconductor material layer and a first signal line layer in the region depicted in FIG. 14A.

FIG. 14A is a zoom-in view of a region having an active layer of a fourth transistor in the array substrate depicted in FIG. 3A. FIG. 14B illustrate the structure of a first semiconductor material layer in the region depicted in FIG. 14A. FIG. 14C illustrate the structure of a first gate metal layer in the region depicted in FIG. 14A. FIG. 14D illustrate the structure of a first semiconductor material layer and a first signal line layer in the region depicted in FIG. 14A. Referring to FIG. 14A to FIG. 14D, FIG. 3A to FIG. 3L, and FIG. 4E, in some embodiments, an orthographic projection of the relay electrode RE on a base substrate substantially covers (e.g., covers at least 80%, covers at least 85%, covers at least 90%, covers at least 95%, covers at least 99%, or completely covers) an orthographic projection of the active layer ACT4 of the fourth transistor on the base substrate. In one example, the orthographic projection of the relay electrode RE on the base substrate completely covers the orthographic projection of the active layer ACT4 of the fourth transistor on the base substrate.

In some embodiments, the orthographic projection of the relay electrode RE on the base substrate at least partially overlaps with an orthographic projection of the first electrode S4 of the fourth transistor on the base substrate.

In some embodiments, the orthographic projection of the relay electrode RE on the base substrate at least partially overlaps with an orthographic projection of the second electrode D4 of the fourth transistor on the base substrate.

Figure 14E:
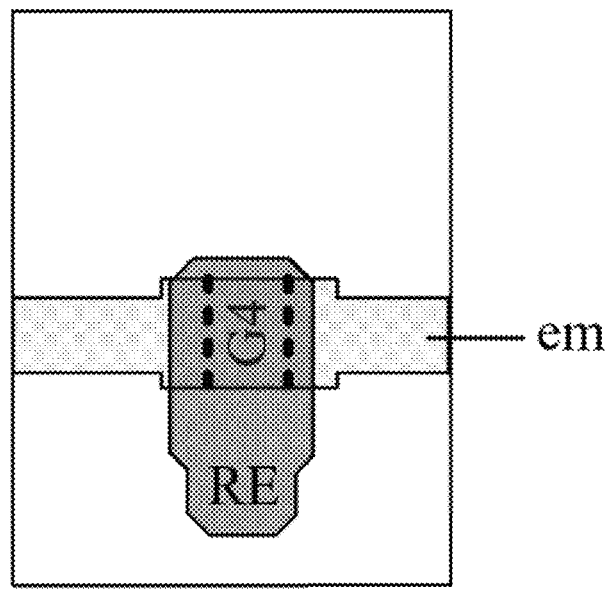
FIG. 14E illustrate the structure of a first gate metal layer and a first signal line layer in the region depicted in FIG. 14A.

FIG. 14E illustrate the structure of a first gate metal layer and a first signal line layer in the region depicted in FIG. 14A. Referring to FIG. 14A to FIG. 14E, FIG. 3A to FIG. 3L, and FIG. 4E, in some embodiments, the relay electrode RE crosses over the respective light emitting control signal line em. In some embodiments, an orthographic projection of the relay electrode RE on a base substrate substantially covers (e.g., covers at least 80%, covers at least 85%, covers at least 90%, covers at least 95%, covers at least 99%, or completely covers) an orthographic projection of the gate electrode G4 of the fourth transistor on the base substrate. In one example, the orthographic projection of the relay electrode RE on the base substrate completely covers the orthographic projection of the gate electrode G4 of the fourth transistor on the base substrate.

The inventors of the present disclosure discover that, by having the relay electrode RE crossing over the respective light emitting control signal line em and the orthographic projection of the relay electrode RE on the base substrate covers the orthographic projection of the gate electrode G4 of the fourth transistor on the base substrate, a third capacitance C3 (denoted in FIG. 14A) can be increased. The third capacitance C3 is at least partially formed by the relay electrode RE and the respective light emitting control signal line em. By having an increase third capacitance C3, a voltage level at the fourth node N4 (comprising the relay electrode RE and the second electrode D4 of the fourth transistor) can be effectively boosted by kickback effect due to the increased third capacitance, when the respective light emitting control signal line em is transmitting an ineffective voltage signal. The driving current through the fourth node N4 can be increased when the kickback effect is occurring.

The display quality of the display apparatus in the low grayscale display frame can be surprisingly and unexpectedly improved.

Figure 14F:
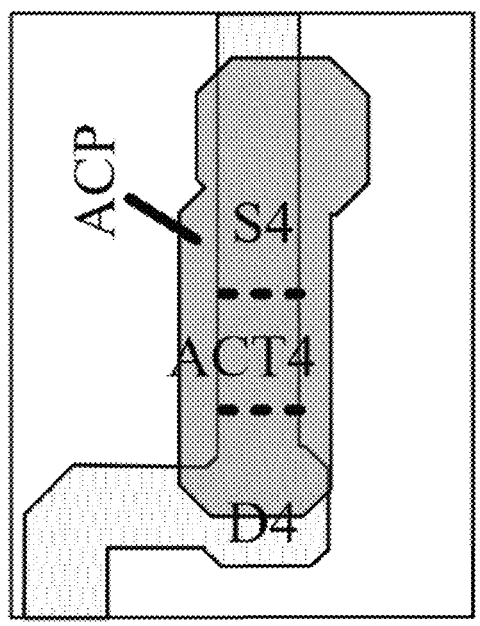
FIG. 14F illustrate the structure of a first semiconductor material layer and a second signal line layer in the region depicted in FIG. 14A.

FIG. 14F illustrate the structure of a first semiconductor material layer and a second signal line layer in the region depicted in FIG. 14A. Referring to FIG. 14A to FIG. 14F, FIG. 3A to FIG. 3L, and FIG. 4E, in some embodiments, an orthographic projection of the anode contact pad ACP on a base substrate substantially covers (e.g., covers at least 80%, covers at least 85%, covers at least 90%, covers at least 95%, covers at least 99%, or completely covers) an orthographic projection of the active layer ACT4 of the fourth transistor on the base substrate. In one example, the orthographic projection of the anode contact pad ACP on the base substrate completely covers the orthographic projection of the active layer ACT4 of the fourth transistor on the base substrate.

In some embodiments, the orthographic projection of the anode contact pad ACP on the base substrate at least partially overlaps with an orthographic projection of the first electrode S4 of the fourth transistor on the base substrate.

In some embodiments, the orthographic projection of the anode contact pad ACP on the base substrate at least partially overlaps with an orthographic projection of the second electrode D4 of the fourth transistor on the base substrate.

Figure 14G:
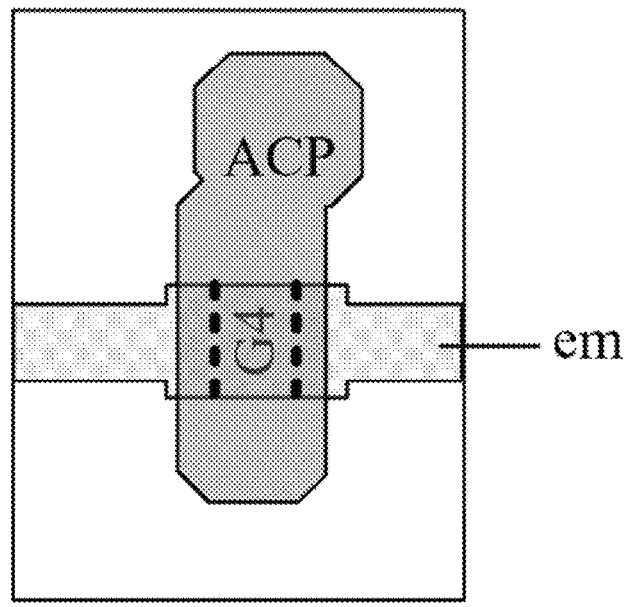
FIG. 14G illustrate the structure of a first gate metal layer and a second signal line layer in the region depicted in FIG. 14A.

FIG. 14G illustrate the structure of a first gate metal layer and a second signal line layer in the region depicted in FIG. 14A. Referring to FIG. 14A to FIG. 14G, FIG. 3A to FIG. 3L, and FIG. 4E, in some embodiments, the anode contact pad ACP crosses over the respective light emitting control signal line em. In some embodiments, an orthographic projection of the anode contact pad ACP on a base substrate substantially covers (e.g., covers at least 80%, covers at least 85%, covers at least 90%, covers at least 95%, covers at least 99%, or completely covers) an orthographic projection of the gate electrode G4 of the fourth transistor on the base substrate. In one example, the orthographic projection of the anode contact pad ACP on the base substrate completely covers the orthographic projection of the gate electrode G4 of the fourth transistor on the base substrate.

The inventors of the present disclosure discover that, by having the anode contact pad ACP crossing over the respective light emitting control signal line em and the orthographic projection of the anode contact pad ACP on the base substrate covers the orthographic projection of the gate electrode G4 of the fourth transistor on the base substrate, a third capacitance C3 (denoted in FIG. 14A) can be increased. The third capacitance C3 is at least partially formed by the anode contact pad ACP and the respective light emitting control signal line em. By having an increase third capacitance C3, a voltage level at the fourth node N4 (comprising the anode contact pad ACP, the relay electrode RE and the second electrode D4 of the fourth transistor) can be effectively boosted by kickback effect due to the increased third capacitance, when the respective light emitting control signal line em is transmitting an ineffective voltage signal. The driving current through the fourth node N4 can be increased when the kickback effect is occurring. The display quality of the display apparatus in the low grayscale display frame can be surprisingly and unexpectedly improved.

Figure 14H:
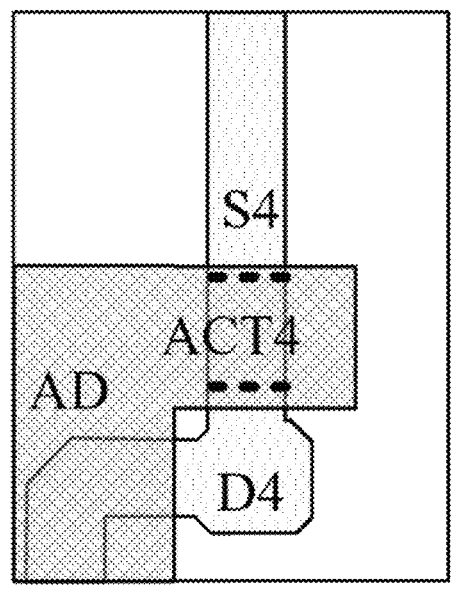
FIG. 14H illustrate the structure of a first semiconductor material layer and an anode layer in the region depicted in FIG. 14A.

FIG. 14H illustrate the structure of a first semiconductor material layer and an anode layer in the region depicted in FIG. 14A. Referring to FIG. 14A to FIG. 14H, FIG. 3A to FIG. 3L, and FIG. 4E, in some embodiments, an orthographic projection of an anode AD on a base substrate substantially covers (e.g., covers at least 80%, covers at least 85%, covers at least 90%, covers at least 95%, covers at least 99%, or completely covers) an orthographic projection of the active layer ACT4 of the fourth transistor on the base substrate. In one example, the orthographic projection of the anode AD on the base substrate completely covers the orthographic projection of the active layer ACT4 of the fourth transistor on the base substrate.

In some embodiments, the orthographic projection of the anode AD on the base substrate at least partially overlaps with an orthographic projection of the first electrode $4 of the fourth transistor on the base substrate.

In some embodiments, the orthographic projection of the anode AD on the base substrate at least partially overlaps with an orthographic projection of the second electrode D4 of the fourth transistor on the base substrate.

In some embodiments, an orthographic projection of the active layer ACT4 of the fourth transistor in each pixel driving circuit on the base substrate is substantially covered by an orthographic projection of an individual anode of the plurality of anodes on the base substrate.

Figure 14I:
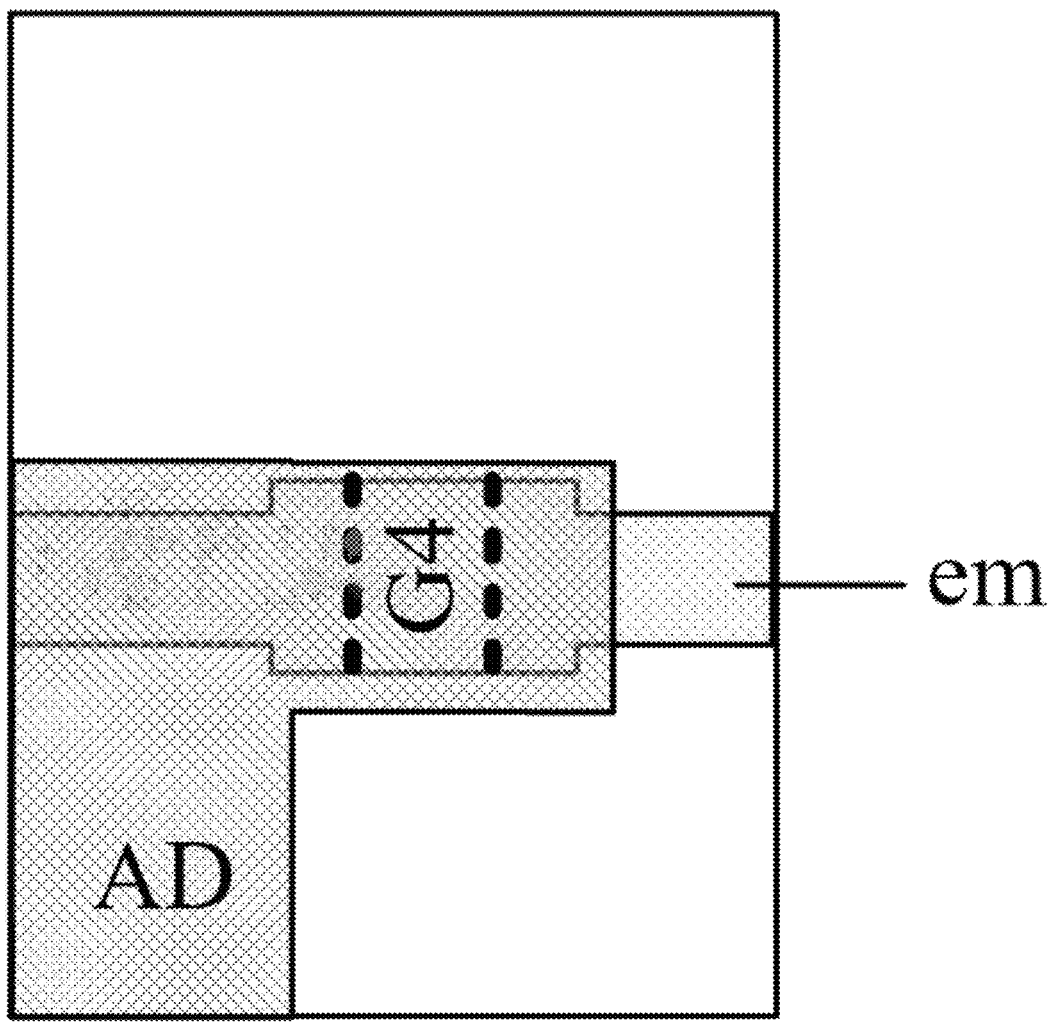
FIG. 14I illustrate the structure of a first gate metal layer and an anode layer in the region depicted in FIG. 14A.

FIG. 14I illustrate the structure of a first gate metal layer and an anode layer in the region depicted in FIG. 14A. Referring to FIG. 14A to FIG. 14I, FIG. 3A to FIG. 3L, and FIG. 4E, in some embodiments, the anode contact pad ACP crosses over the respective light emitting control signal line em. In some embodiments, an orthographic projection of the anode contact pad ACP on a base substrate substantially covers (e.g., covers at least 80%, covers at least 85%, covers at least 90%, covers at least 95%, covers at least 99%, or completely covers) an orthographic projection of the gate electrode G4 of the fourth transistor on the base substrate. In one example, the orthographic projection of the anode contact pad ACP on the base substrate completely covers the orthographic projection of the gate electrode G4 of the fourth transistor on the base substrate.

In some embodiments, an orthographic projection of the gate electrode G4 of the fourth transistor in each pixel driving circuit on the base substrate is substantially covered by an orthographic projection of an individual anode of the plurality of anodes.

The inventors of the present disclosure discover that, by having the anode contact pad ACP crossing over the respective light emitting control signal line em and the orthographic projection of the anode AD on the base substrate covers the orthographic projection of the gate electrode G4 of the fourth transistor on the base substrate, a third capacitance C3 (denoted in FIG. 14A) can be increased. The third capacitance C3 is at least partially formed by the anode AD and the respective light emitting control signal line em. By having an increase third capacitance C3, a voltage level at the fourth node N4 (comprising the anode contact pad ACP, the relay electrode RE and the second electrode D4 of the fourth transistor) can be effectively boosted by kickback effect due to the increased third capacitance, when the respective light emitting control signal line em is transmitting an ineffective voltage signal. The driving current through the fourth node N4 can be increased when the kickback effect is occurring. The display quality of the display apparatus in the low grayscale display frame can be surprisingly and unexpectedly improved.

In another aspect, the present invention provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a micro light emitting diode display apparatus Optionally, the display apparatus is a mini light emitting diode display apparatus.

In another aspect, the present disclosure provides a method of fabricating an array substrate. In some embodiments, the method includes forming a plurality of first gate lines, forming a plurality of second gate lines, and forming a plurality of pixel driving circuits. Optionally, forming a respective pixel driving circuit of the plurality of pixel driving circuits includes forming a driving transistor, forming a data write transistor, forming a compensating transistor, forming a storage capacitor, forming a first node connecting line connecting a gate electrode of the driving transistor with a first electrode of the compensating transistor, and forming a gate connecting pad. Optionally, a respective first gate line of the plurality of first gate lines configured to provide a gate scanning signal to the data write transistor. Optionally, the gate connecting pad includes at least a portion of a gate electrode of the data write transistor, is connected to the respective first gate line, and is in a layer different from the respective first gate line. Optionally, a respective second gate line of the plurality of second gate lines configured to provide a gate scanning signal to the compensating transistor. Optionally, the method includes forming a first semiconductor material layer and forming a second semiconductor material layer on a side of the first semiconductor material layer away from a base substrate. Optionally, forming the first semiconductor material layer includes forming at least active layers of the driving transistor and the data write transistor. Optionally, forming the second semiconductor material layer includes forming at least an active layer of the compensating transistor. Optionally, a first capacitance is at least partially formed between the gate connecting pad and at least one of the second semiconductor material layer or the first node connecting line. Optionally, a second capacitance is formed between the first node connecting line and the respective second gate line. Optionally, a ratio of the first capacitance to the second capacitance is greater than 2.3.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a plurality of first gate lines, a plurality of second gate lines, and a plurality of pixel driving circuits;

wherein a respective pixel driving circuit of the plurality of pixel driving circuits comprises a driving transistor, a data write transistor, a compensating transistor, a storage capacitor, a first node connecting line connecting a gate electrode of the driving transistor with a first electrode of the compensating transistor, and a gate connecting pad;

a respective first gate line of the plurality of first gate lines is configured to provide a gate scanning signal to the data write transistor;

the gate connecting pad comprises at least a portion of a gate electrode of the data write transistor, is connected to the respective first gate line, and is in a layer different from the respective first gate line;

a respective second gate line of the plurality of second gate lines is configured to provide a gate scanning signal to the compensating transistor;

wherein the array substrate comprises a first semiconductor material layer and a second semiconductor material layer on a side of the first semiconductor material layer away from a base substrate;

the first semiconductor material layer comprises at least active layers of the driving transistor and the data write transistor;

the second semiconductor material layer comprises at least an active layer of the compensating transistor;

a first capacitance is at least partially formed between the gate connecting pad and at least one of the second semiconductor material layer or the first node connecting line; and a second capacitance is formed between the first node connecting line and the respective second gate line;

wherein the first capacitance is greater than the second capacitance;

wherein the respective pixel driving circuit further comprises a light emitting control transistor and a relay electrode;

an orthographic projection of the relay electrode on the base substrate at least partially overlaps with an orthographic projection of a first electrode of the light emitting control transistor on the base substrate; and/or the orthographic projection of the relay electrode on the base substrate at least partially overlaps with an orthographic projection of a second electrode of the light emitting control transistor on the base substrate.

2. The array substrate of claim 1, wherein the ratio of the first capacitance to the second capacitance is between 1.5 to 4.0.

3. The array substrate of claim 1, wherein an orthographic projection of the gate connecting pad on the base substrate at least partially overlaps with an orthographic projection of at least one of the second semiconductor material layer or the first node connecting line on the base substrate.

4. The array substrate of claim 1, wherein an orthographic projection of the second semiconductor material layer on the base substrate is substantially non-overlapping with an orthographic projection of the respective first gate line on the base substrate; and
  an orthographic projection of the first node connecting line on the base substrate is substantially non-overlapping with the orthographic projection of the respective first gate line on the base substrate.

5. The array substrate of claim 1,
  wherein a third capacitance is at least partially formed between the relay electrode and a respective light emitting control signal line of the plurality of light emitting control signal lines;
  the orthographic projection of the relay electrode on the base substrate substantially covers an orthographic projection of an active layer of the light emitting control transistor on the base substrate.

6. The array substrate of claim 1, wherein the relay electrode crosses over a respective light emitting control signal line of the plurality of light emitting control signal lines; and
  the orthographic projection of the relay electrode on the base substrate substantially covers an orthographic projection of a gate electrode of the light emitting control transistor on the base substrate.

7. The array substrate of claim 1, wherein the respective pixel driving circuit further comprises an anode contact pad;
  the relay electrode connects the anode contact pad with a second electrode of the light emitting control transistor;
  the anode contact pad is connected to an anode of a light emitting element;
  an orthographic projection of the anode contact pad on the base substrate substantially covers an orthographic projection of an active layer of the light emitting control transistor on the base substrate;
  the orthographic projection of the anode contact pad on the base substrate at least partially overlaps with the orthographic projection of the first electrode of the light emitting control transistor on the base substrate; and
  the orthographic projection of the anode contact pad on the base substrate at least partially overlaps with an orthographic projection of the second electrode of the light emitting control transistor on the base substrate.

8. The array substrate of claim 1, wherein the anode contact pad crosses over a respective light emitting control signal line of the plurality of light emitting control signal lines; and
  the orthographic projection of the anode contact pad on the base substrate substantially covers an orthographic projection of a gate electrode of the light emitting control transistor on the base substrate.

9. The array substrate of claim 1, wherein an orthographic projection of an anode on the base substrate substantially covers an orthographic projection of an active layer of the light emitting control transistor on the base substrate;
  the orthographic projection of the anode on the base substrate at least partially overlaps with the orthographic projection of the first electrode of the light emitting control transistor on the base substrate; and
  the orthographic projection of the anode on the base substrate at least partially overlaps with an orthographic projection of the second electrode of the light emitting control transistor on the base substrate.

10. The array substrate of claim 1, wherein an orthographic projection of an active layer of a light emitting control transistor in each pixel driving circuit on the base substrate is substantially covered by an orthographic projection of an individual anode of a plurality of anodes on the base substrate.

11. The array substrate of claim 1, wherein the anode crosses over a respective light emitting control signal line of the plurality of light emitting control signal lines; and
  the orthographic projection of the anode on the base substrate substantially covers an orthographic projection of a gate electrode of the light emitting control transistor on the base substrate.

12. The array substrate of claim 1, wherein an orthographic projection of a gate electrode of a light emitting control transistor in each pixel driving circuit on the base substrate is substantially covered by an orthographic projection of an individual anode of a plurality of anodes on the base substrate.

13. The array substrate of claim 1, further comprising a plurality of light emitting control signal lines;
  wherein a respective light emitting control signal line of the plurality of light emitting control signal lines comprises a respective light emitting control signal line first branch and a respective light emitting control signal line second branch in different layers.

14. A display apparatus, comprising the array substrate of claim 1, and one or more integrated circuits connected to the array substrate.

15. An array substrate, comprising a plurality of first gate lines, a plurality of second gate lines, and a plurality of pixel driving circuits;
  wherein a respective pixel driving circuit of the plurality of pixel driving circuits comprises a driving transistor, a data write transistor, a compensating transistor, a storage capacitor, a first node connecting line connecting a gate electrode of the driving transistor with a first electrode of the compensating transistor, and a gate connecting pad;
  a respective first gate line of the plurality of first gate lines is configured to provide a gate scanning signal to the data write transistor;
  the gate connecting pad comprises at least a portion of a gate electrode of the data write transistor, is connected to the respective first gate line, and is in a layer different from the respective first gate line;
  a respective second gate line of the plurality of second gate lines is configured to provide a gate scanning signal to the compensating transistor;
  wherein the array substrate comprises a first semiconductor material layer and a second semiconductor material layer on a side of the first semiconductor material layer away from a base substrate;
  the first semiconductor material layer comprises at least active layers of the driving transistor and the data write transistor;
  the second semiconductor material layer comprises at least an active layer of the compensating transistor;
  a first capacitance is at least partially formed between the gate connecting pad and at least one of the second semiconductor material layer or the first node connecting line; and
  a second capacitance is formed between the first node connecting line and the respective second gate line;
  wherein the first capacitance is greater than the second capacitance;

wherein the gate connecting pad comprises a first portion and a second portion connected to each other;

an orthographic projection of the first portion on the base substrate at least partially overlaps with an orthographic projection of the respective first gate line on the base substrate, is substantially non-overlapping with an orthographic projection of the second semiconductor material layer on the base substrate, and is substantially non-overlapping with an orthographic projection of the first node connecting line on the base substrate;

an orthographic projection of the second portion on the base substrate at least partially overlaps with the orthographic projection of the second semiconductor material layer on the base substrate, at least partially overlaps with the orthographic projection of the first node connecting line on the base substrate, and is substantially non-overlapping with the orthographic projection of the respective first gate line on the base substrate; and the first capacitance is at least partially formed between the second portion and at least one of the second semiconductor material layer or the first node connecting line.

16. The array substrate of claim 1, wherein the first node connecting line and the respective first gate line are in a first signal line layer on a side of the second semiconductor material layer away from the base substrate.

17. The array substrate of claim 16, wherein the respective second gate line comprises a respective second gate line first branch in a second gate metal layer and a respective second gate line second branch in a third gate metal layer;

wherein the second semiconductor material layer is on a side of the second gate metal layer away from the base substrate;

the third gate metal layer is on a side of the second semiconductor material layer away from the base substrate; and the first signal line layer is on a side of the third gate metal layer away from the base substrate.

18. The array substrate of claim 16, wherein the respective second gate line is in a same layer as the first node connecting line and the respective first gate line;

wherein the respective pixel driving circuit further comprises at least one of a first gate pad comprising at least a portion of a gate electrode of the compensating transistor or a second gate pad comprising at least a portion of the gate electrode of the compensating transistor; and the respective second gate line is connected to the first gate pad through a via, and is connected to the second gate pad through a via.

19. The array substrate of claim 18, wherein the first gate pad is in a second gate metal layer;

the second gate pad is in a third gate metal layer;

the second semiconductor material layer is on a side of the second gate metal layer away from the base substrate;

the third gate metal layer is on a side of the second semiconductor material layer away from the base substrate; and the first signal line layer is on a side of the third gate metal layer away from the base substrate.

20. An array substrate, comprising a plurality of first gate lines, a plurality of second gate lines, a plurality of pixel driving circuits, a plurality of second voltage supply lines, a plurality of data lines, a plurality of fourth reset signal lines, and a plurality of low voltage supply lines;

wherein a respective pixel driving circuit of the plurality of pixel driving circuits comprises a driving transistor, a data write transistor, a compensating transistor, a storage capacitor, a first node connecting line connecting a gate electrode of the driving transistor with a first electrode of the compensating transistor, and a gate connecting pad;

a respective first gate line of the plurality of first gate lines is configured to provide a gate scanning signal to the data write transistor;

the gate connecting pad comprises at least a portion of a gate electrode of the data write transistor, is connected to the respective first gate line, and is in a layer different from the respective first gate line;

a respective second gate line of the plurality of second gate lines is configured to provide a gate scanning signal to the compensating transistor;

wherein the array substrate comprises a first semiconductor material layer and a second semiconductor material layer on a side of the first semiconductor material layer away from a base substrate;

the first semiconductor material layer comprises at least active layers of the driving transistor and the data write transistor;

the second semiconductor material layer comprises at least an active layer of the compensating transistor;

a first capacitance is at least partially formed between the gate connecting pad and at least one of the second semiconductor material layer or the first node connecting line; and a second capacitance is formed between the first node connecting line and the respective second gate line;

wherein the first capacitance is greater than the second capacitance;

wherein the plurality of pixel driving circuits are arranged in columns, including a (3k−2)-th column, a (3k−1)-th column, and a (3k)-th column of K columns, K and k being positive integers, 1≤k≤(K/3);

the (3k−2)-th column includes a (3k−2)-th pixel driving circuit, the (3k−1)-th column includes a (3k−1)-th pixel driving circuit, and the (3k)-th column includes a (3k)-th pixel driving circuit;

the (3k−2)-th pixel driving circuit, the (3k−1)-th pixel driving circuit, and the (3k)-th pixel driving circuit are in a same row;

the (3k−2)-th column includes a fourth reset signal line of the plurality of fourth reset signal lines; the (3k−1)-th column includes a fourth reset signal line of the plurality of fourth reset signal lines; and the (3k)-th column includes a low voltage supply line of the plurality of low voltage supply lines;

the plurality of fourth reset signal lines are absent in the (3k)-th column;

the plurality of low voltage supply lines are absent in the (3k−2)-th column and are absent in the (3k−1)-th column; and the plurality of second voltage supply lines are present in the (3k−2)-th column, the (3k−1)-th column, and the (3k)-th column.

* * * * *